United States Patent
Prager et al.

(10) Patent No.: US 8,532,796 B2
(45) Date of Patent: Sep. 10, 2013

(54) CONTACT PROCESSING USING MULTI-INPUT/MULTI-OUTPUT (MIMO) MODELS

(75) Inventors: Daniel J Prager, Hopewell Junction, NY (US); Merritt Funk, Austin, TX (US); Peter Biolsi, New Windsor, NY (US); Ryukichi Shimizu, Tokyo (JP)

(73) Assignee: Tokyo Electron Limited (JP)

( * ) Notice: Subject to any disclaimer, the term of this patent is extended or adjusted under 35 U.S.C. 154(b) by 133 days.

(21) Appl. No.: 13/077,705

(22) Filed: Mar. 31, 2011

(65) Prior Publication Data

US 2012/0253497 A1    Oct. 4, 2012

(51) Int. Cl.
  *H01L 21/66*  (2006.01)
  *G06F 19/00*  (2011.01)

(52) U.S. Cl.
  USPC ........... 700/53; 700/104; 257/E21.528; 438/5

(58) Field of Classification Search
  None
  See application file for complete search history.

(56) References Cited

U.S. PATENT DOCUMENTS

| | | | |
|---|---|---|---|
| 5,595,602 A | 1/1997 | Harlan | |
| 6,698,009 B1 | 2/2004 | Pasadyn et al. | |
| 6,953,732 B2 | 10/2005 | Yoshida et al. | |
| 6,972,524 B1 | 12/2005 | Marakhtanov et al. | |
| 7,155,301 B2 | 12/2006 | Li et al. | |
| 7,521,358 B2 | 4/2009 | Bright et al. | |
| 7,575,990 B2 | 8/2009 | Wei | |
| 7,682,891 B2 | 3/2010 | Lavoie et al. | |
| 7,736,956 B2 | 6/2010 | Datta et al. | |
| 7,777,179 B2 | 8/2010 | Chen et al. | |
| 7,875,859 B2 | 1/2011 | Chen et al. | |
| 7,894,927 B2 | 2/2011 | Funk et al. | |
| 2005/0289487 A1 | 12/2005 | Li et al. | |
| 2007/0004187 A1 | 1/2007 | Wei | |
| 2007/0218204 A1 | 9/2007 | Garg et al. | |
| 2008/0295059 A1 | 11/2008 | Choi | |
| 2008/0299494 A1 | 12/2008 | Bencher | |
| 2009/0144691 A1 | 6/2009 | Rathsack | |
| 2009/0155995 A1 | 6/2009 | Wei et al. | |
| 2009/0174067 A1 | 7/2009 | Lin | |
| 2009/0242513 A1 | 10/2009 | Funk et al. | |
| 2010/0036514 A1 | 2/2010 | Funk et al. | |
| 2010/0036518 A1 | 2/2010 | Funk | |
| 2010/0041223 A1 | 2/2010 | Chen et al. | |
| 2010/0048010 A1 | 2/2010 | Chen et al. | |
| 2010/0052075 A1 | 3/2010 | Yeh et al. | |
| 2010/0059764 A1 | 3/2010 | Luo et al. | |
| 2010/0065915 A1 | 3/2010 | Chuang et al. | |
| 2010/0155743 A1 | 6/2010 | Treu et al. | |

(Continued)

OTHER PUBLICATIONS

PCT International Search Report and Written Opinion issued in counterpart PCT application PCT/US12/31271, on Jul. 16, 2012.

(Continued)

*Primary Examiner* — Allan Olsen

(57) ABSTRACT

The invention provides a systems and methods for creating Double Pattern (DP) structures on a patterned wafer in real-time using Dual Pattern Contact-Etch (DPCE) processing sequences and associated Contact-Etch-Multi-Input/Multi-Output (CE-MIMO) models. The DPCE processing sequences can include one or more contact-etch procedures, one or more measurement procedures, one or more contact-etch modeling procedures, and one or more contact-etch verification procedures. The CE-MIMO model uses dynamically interacting behavioral modeling between multiple layers and/or multiple contact-etch procedures. The multiple layers and/or the multiple contact-etch procedures can be associated with the creation of lines, trenches, vias, spacers, contacts, and gate structures that can be created during Double Patterning (DP) procedures.

19 Claims, 26 Drawing Sheets

(56) References Cited

U.S. PATENT DOCUMENTS

| | | |
|---|---|---|
| 2010/0155849 A1 | 6/2010 | Liu et al. |
| 2010/0155860 A1 | 6/2010 | Colombo et al. |
| 2010/0159684 A1 | 6/2010 | Chang et al. |
| 2010/0237467 A1 | 9/2010 | Dalton et al. |
| 2010/0283157 A1 | 11/2010 | Lin et al. |
| 2010/0289064 A1 | 11/2010 | Or-Bach et al. |
| 2010/0304564 A1 | 12/2010 | Schultz |
| 2010/0320510 A1 | 12/2010 | Loh et al. |
| 2011/0014791 A1 | 1/2011 | Johnson et al. |

OTHER PUBLICATIONS

Skogestad, S. & Postlethwaite I., "Multivariable Feedback Control: Analysis and Design"; (2nd edition), (2005) Wiley, Chichester, UK. (ISBN 0-470-01168-8); {pp. 75-86 and 431-450}.

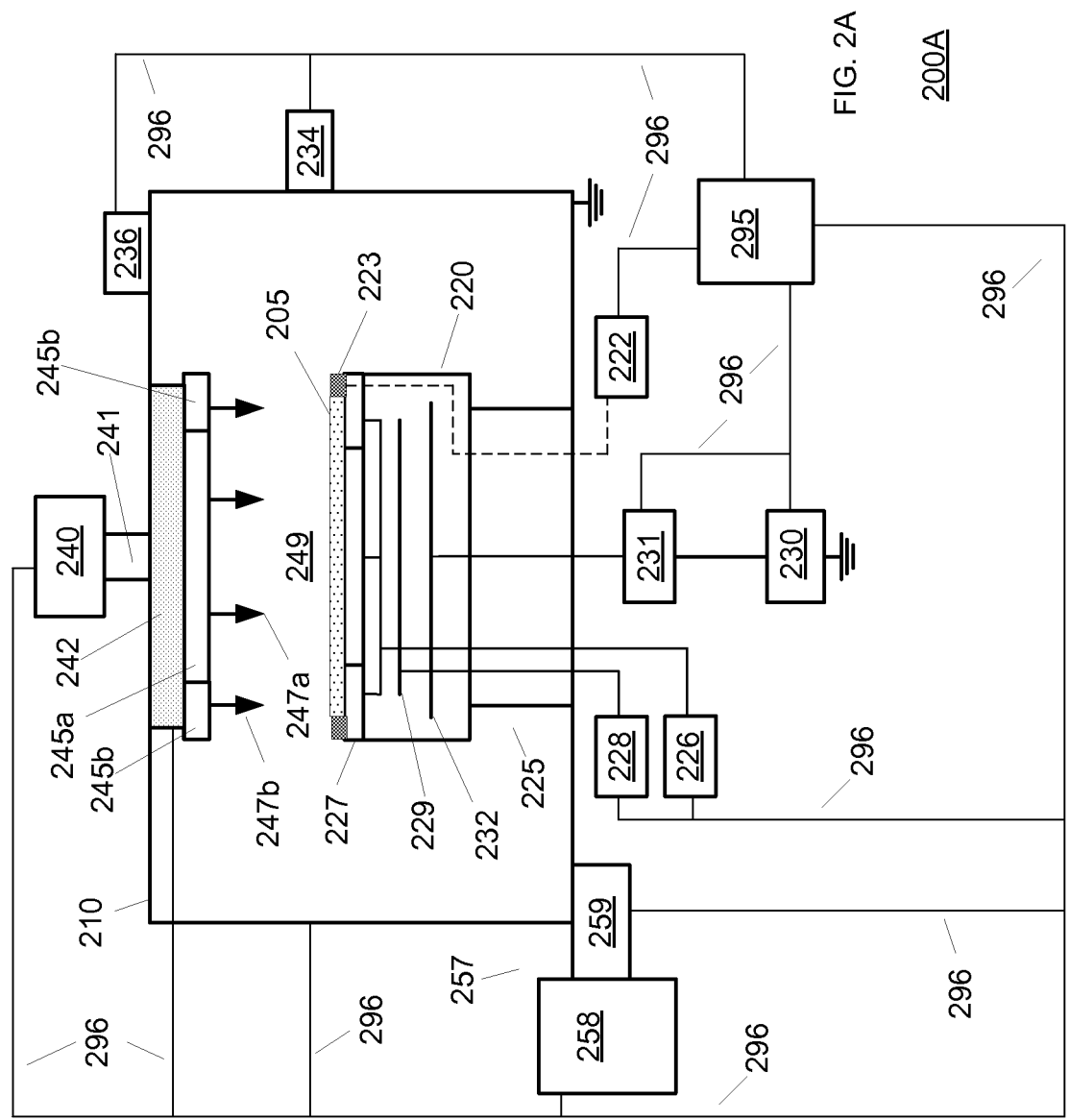

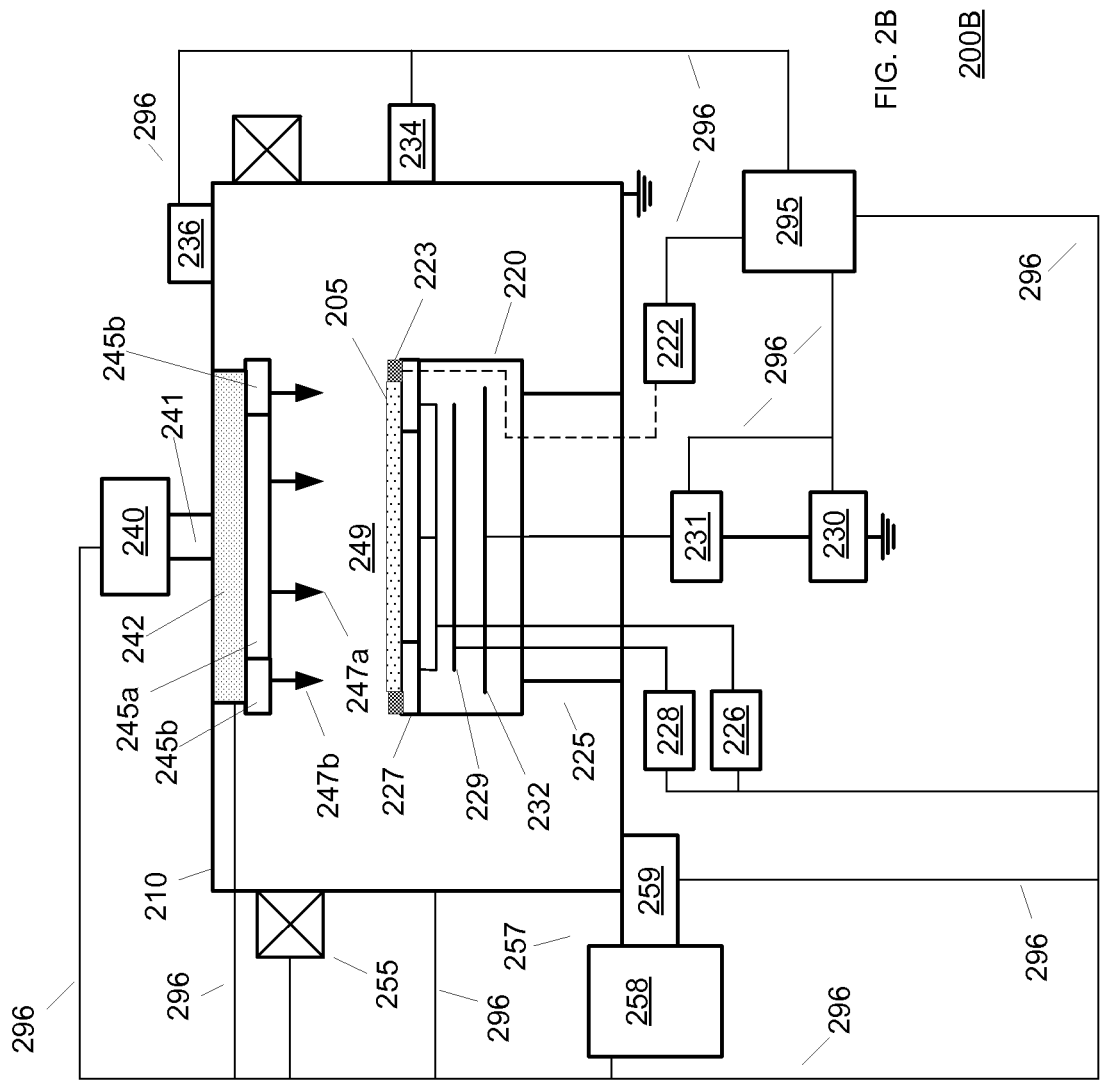

200C

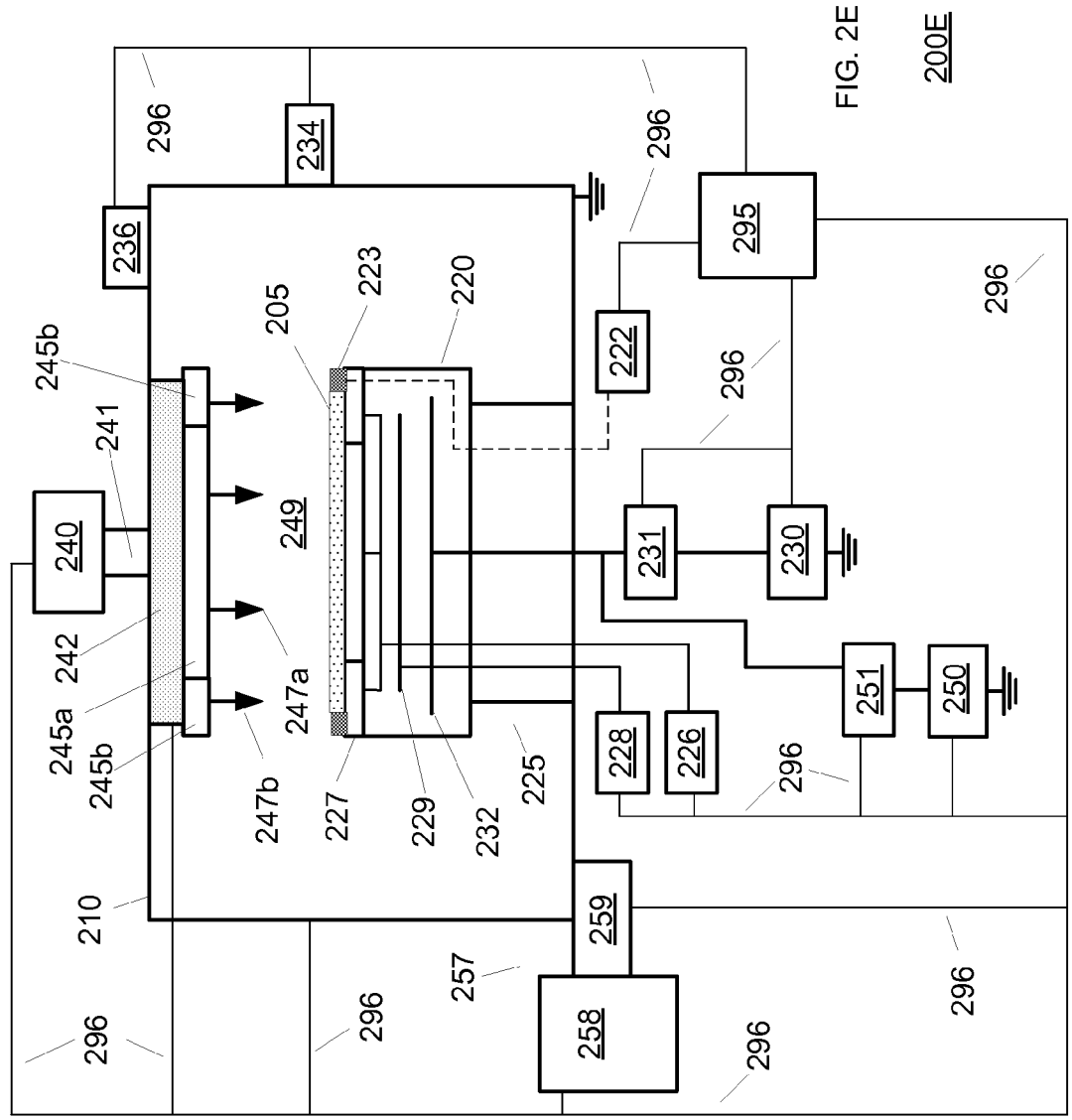

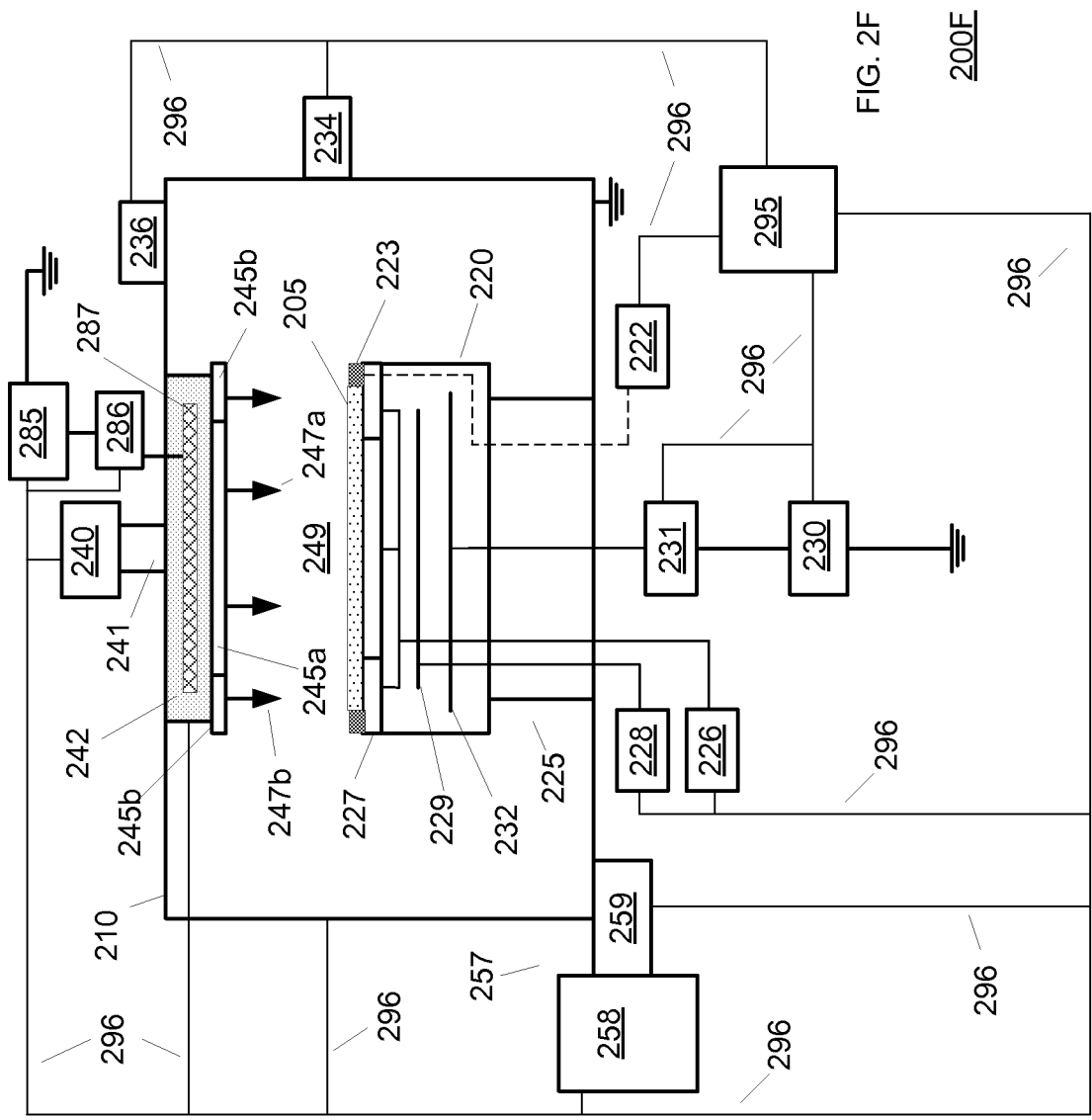

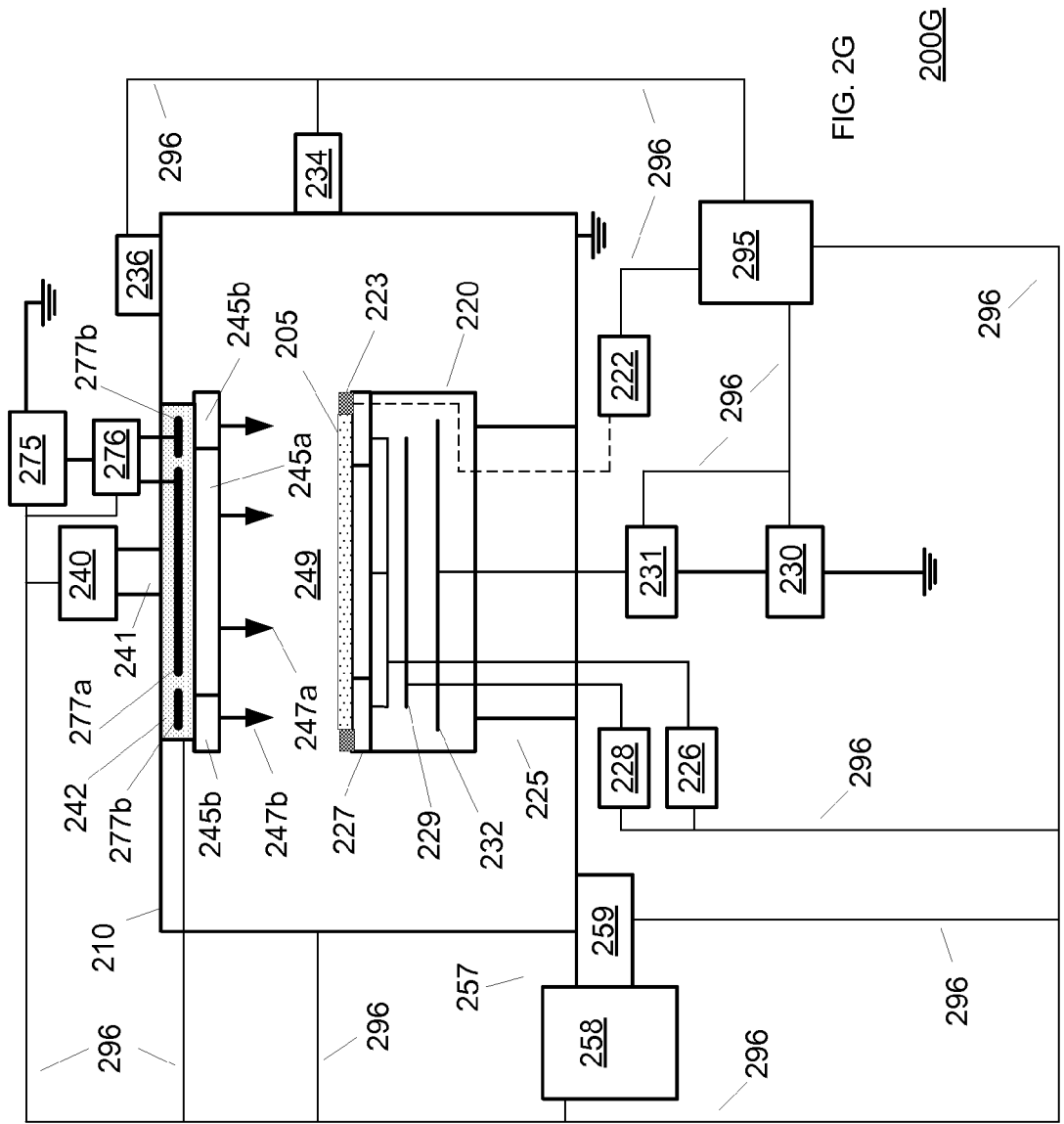

300A

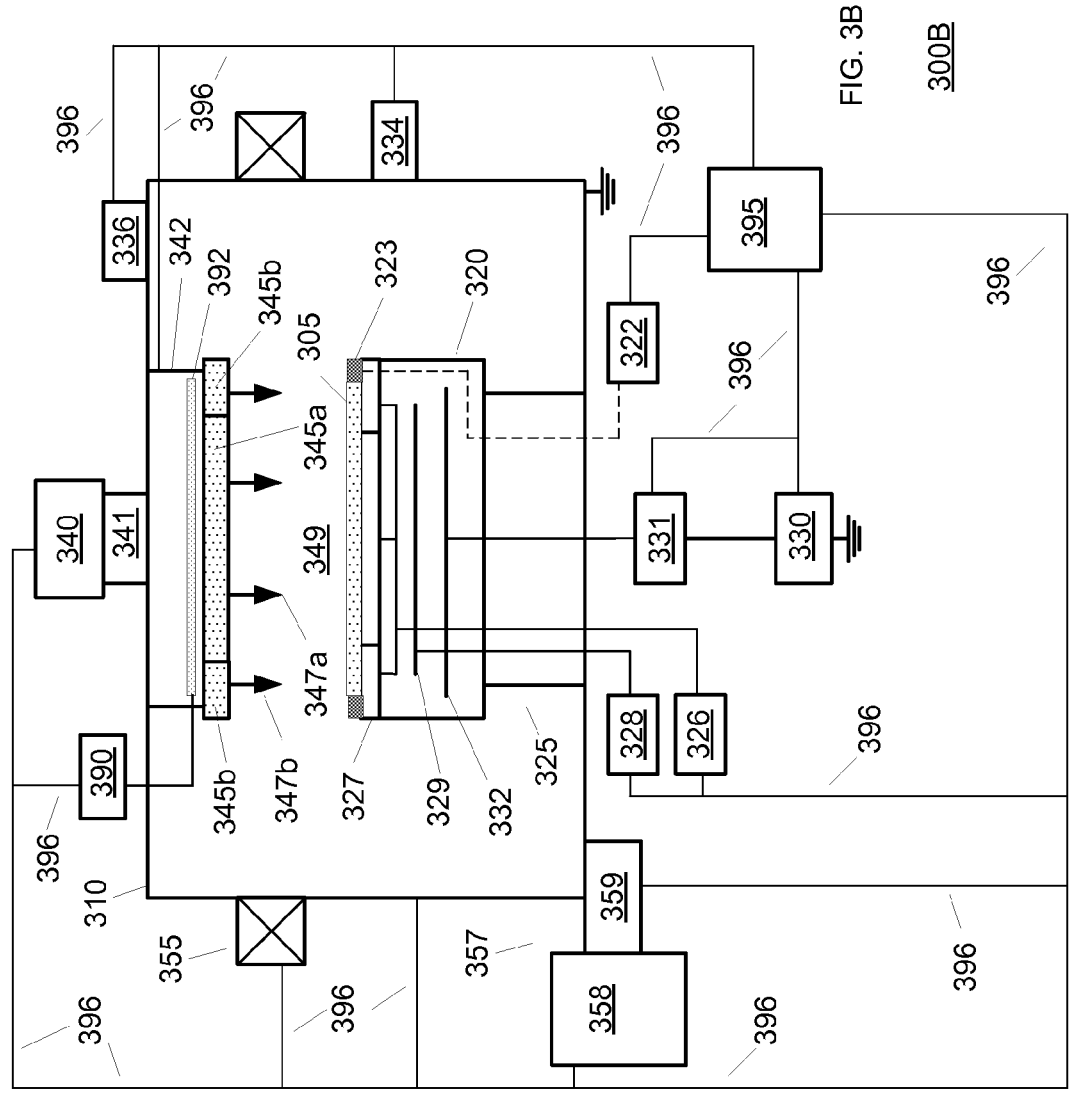

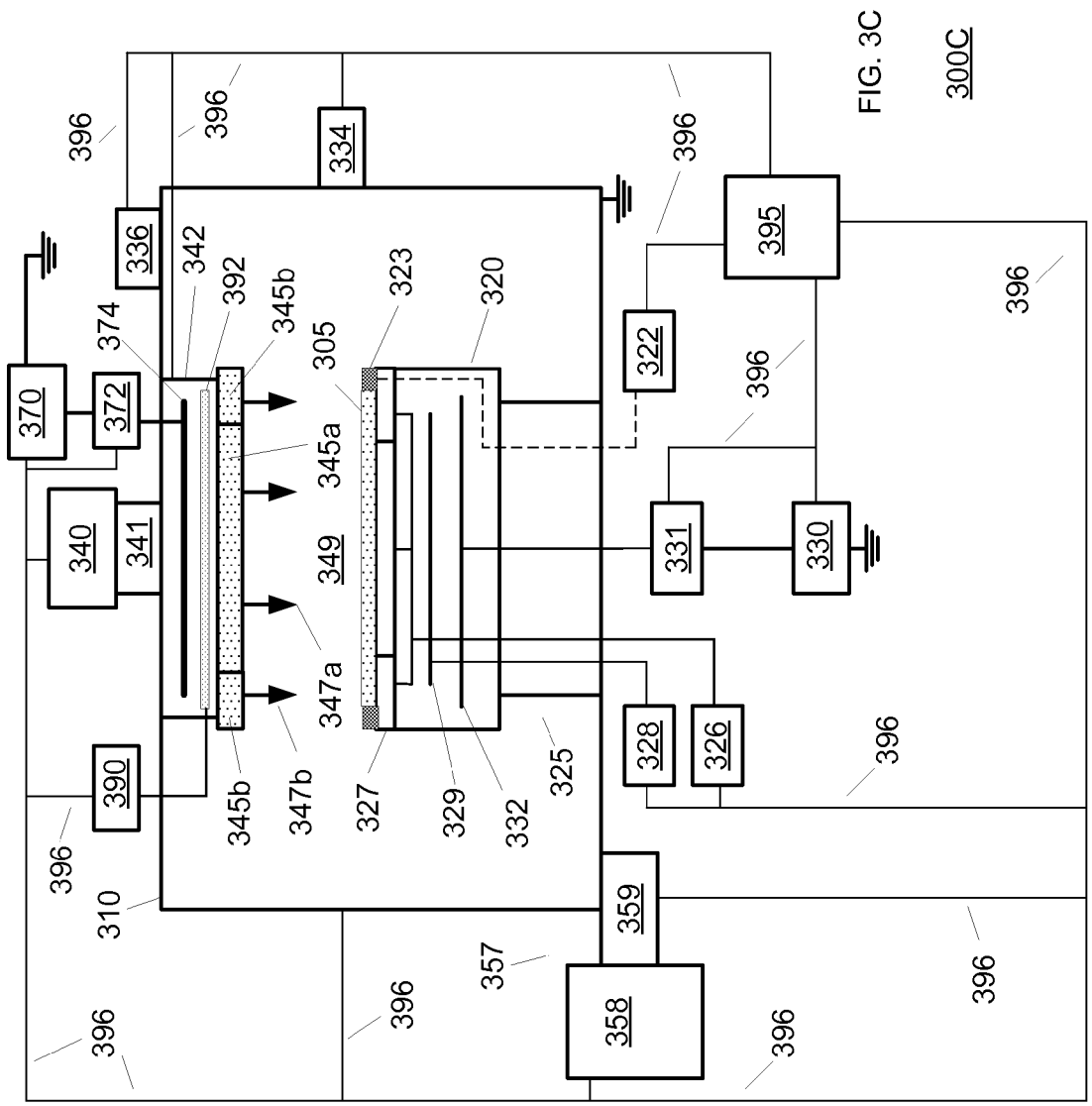

300E

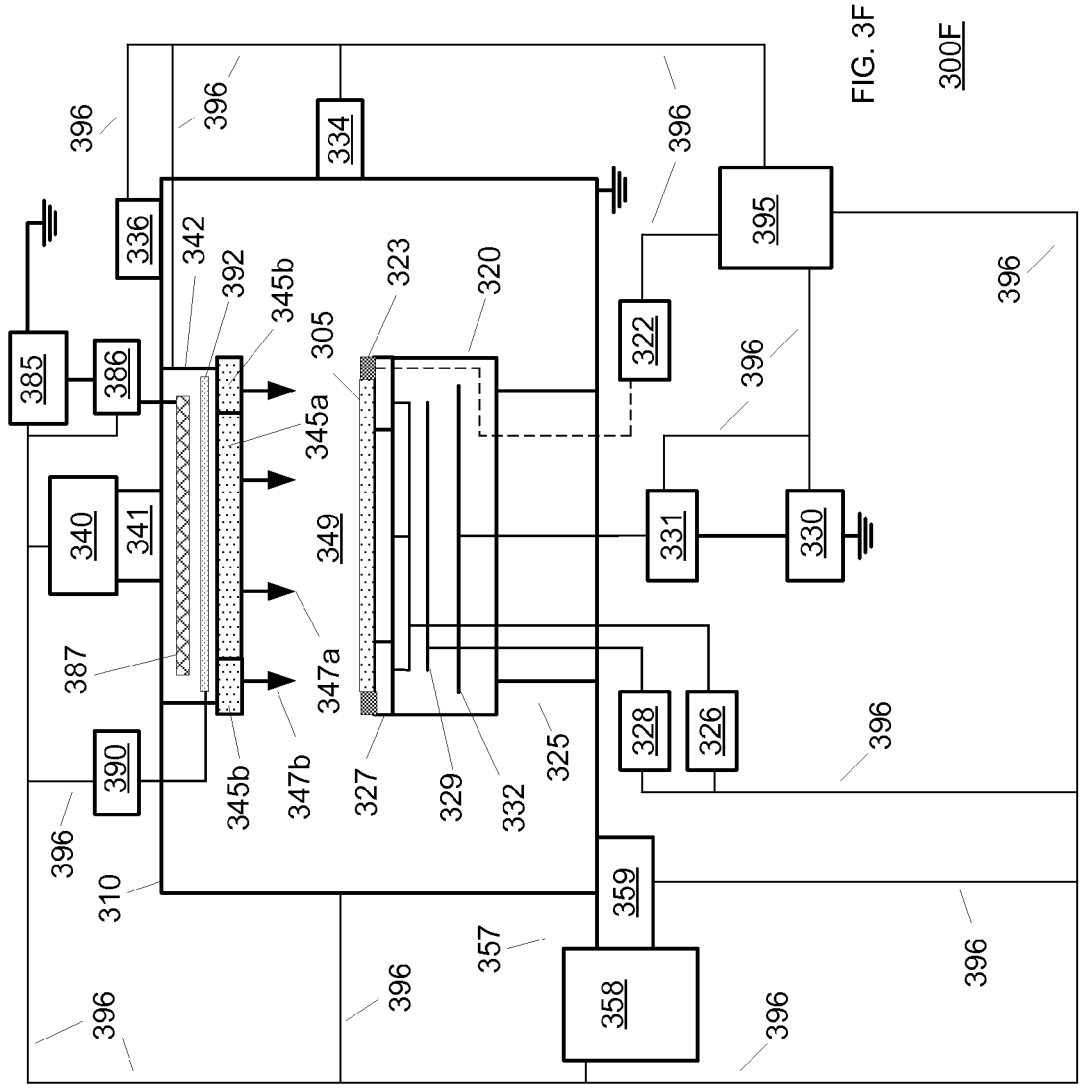

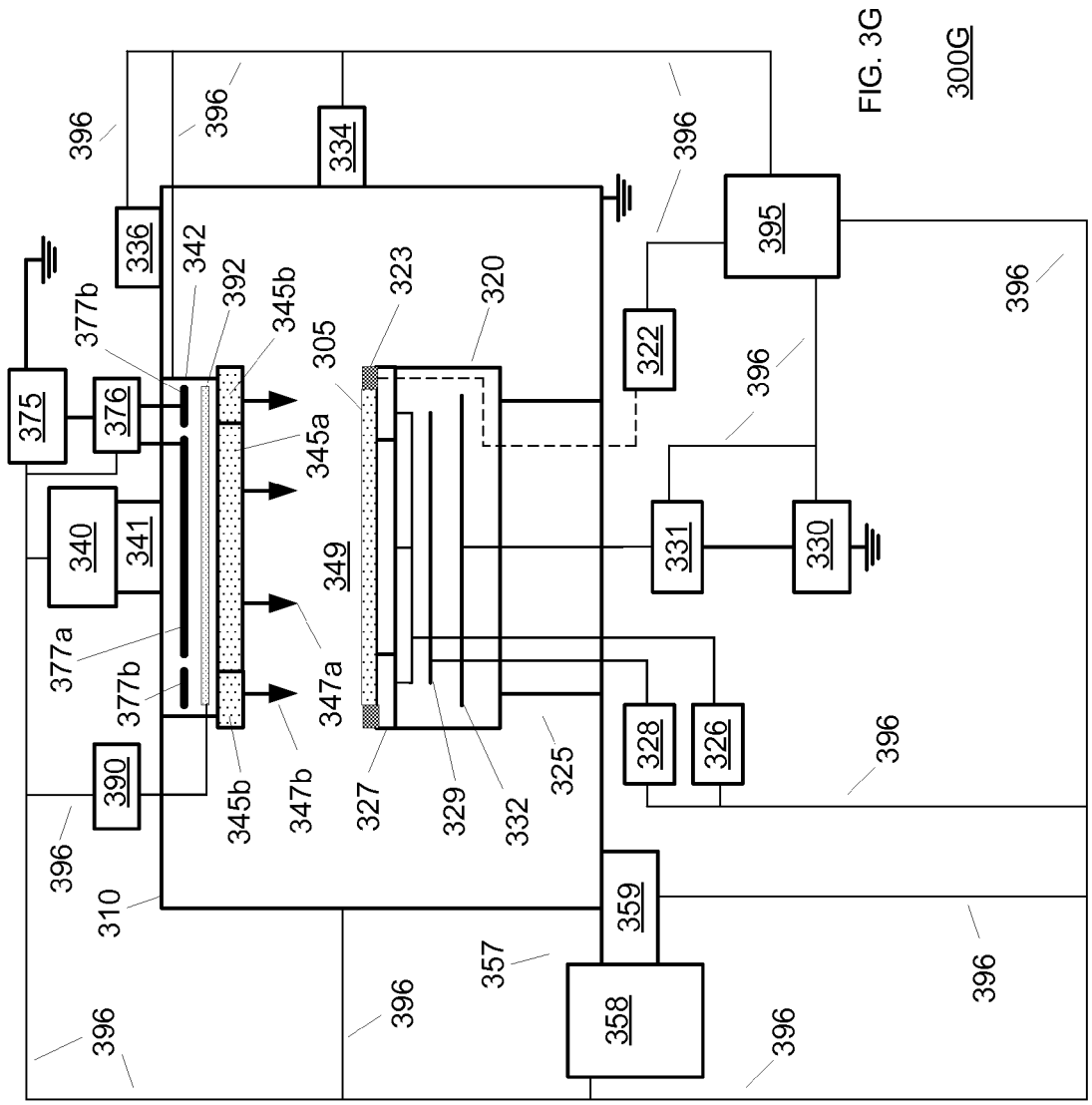

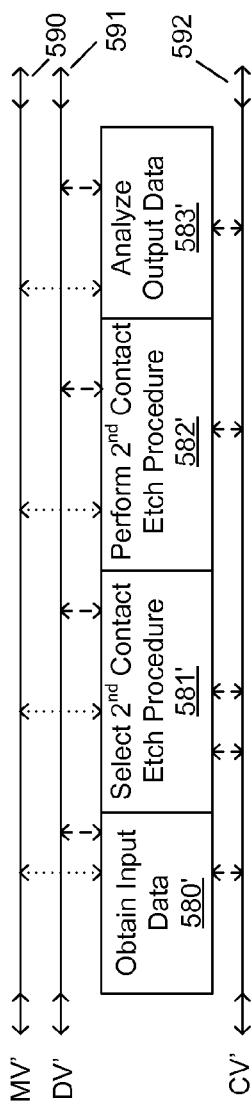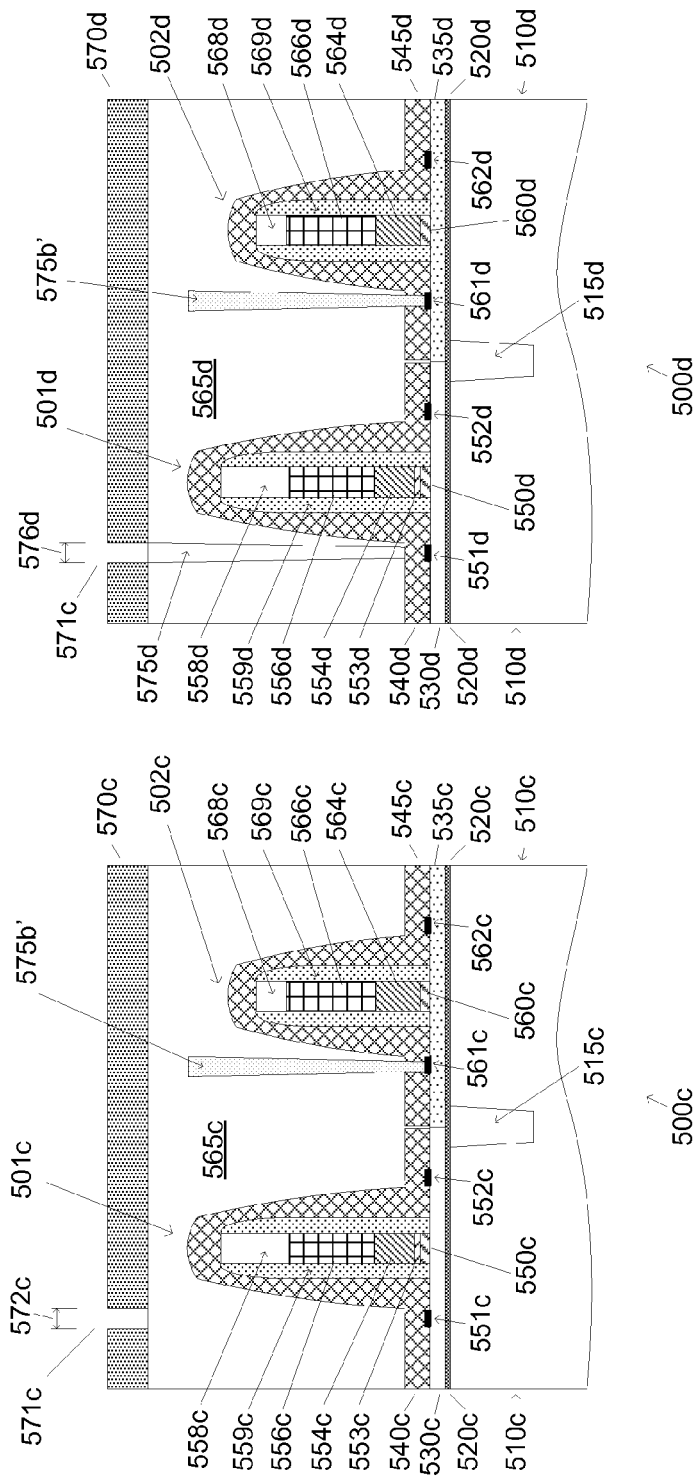
FIG. 5'

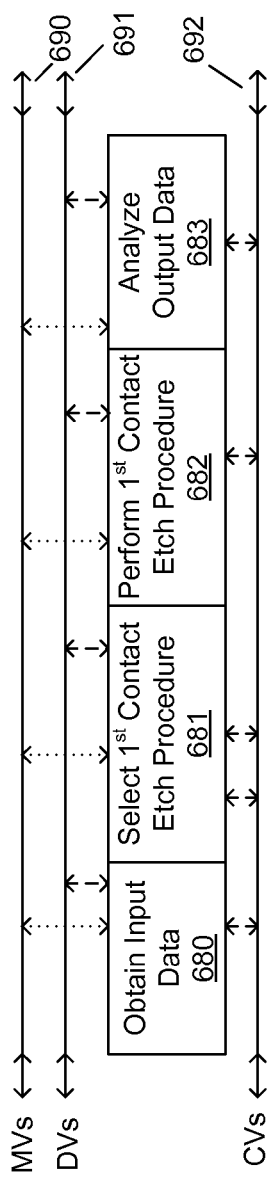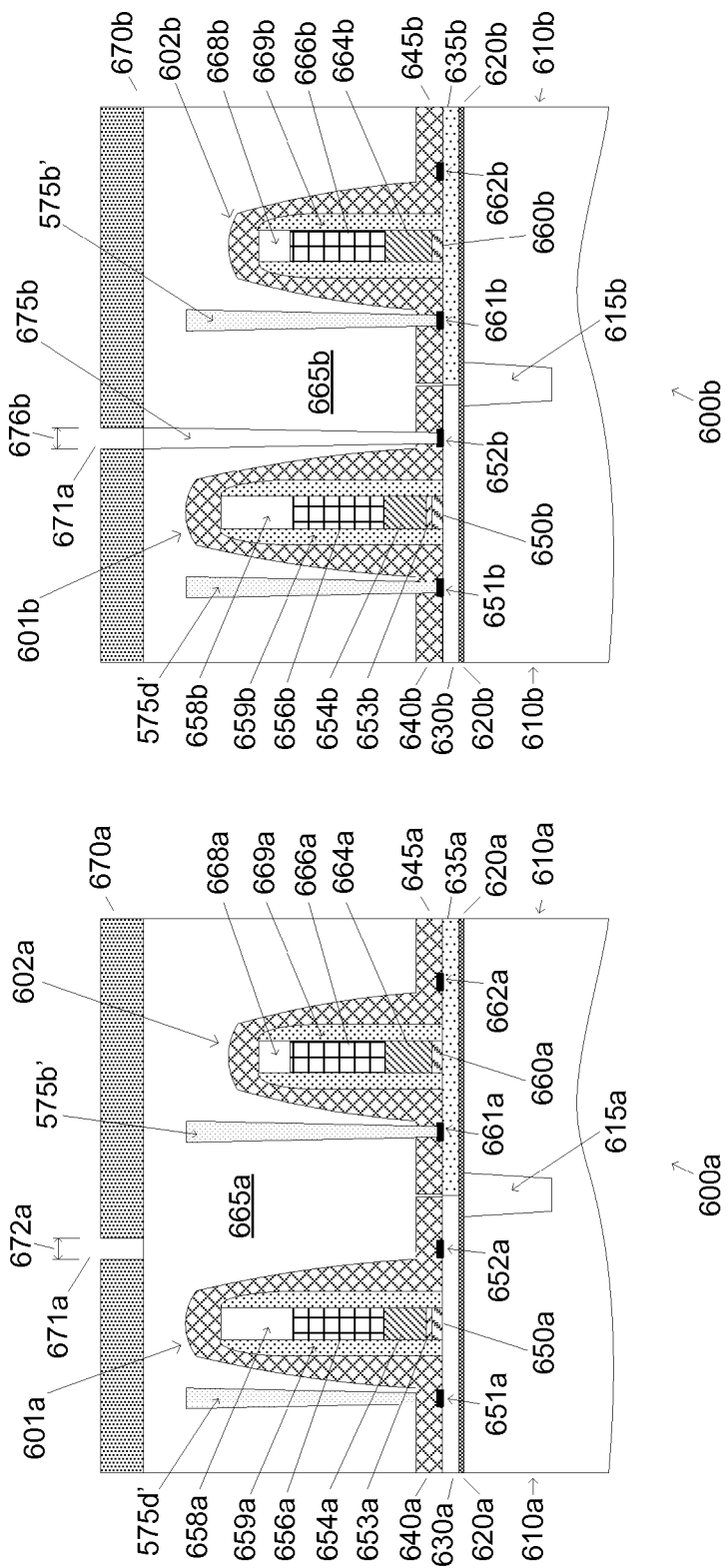
FIG. 6

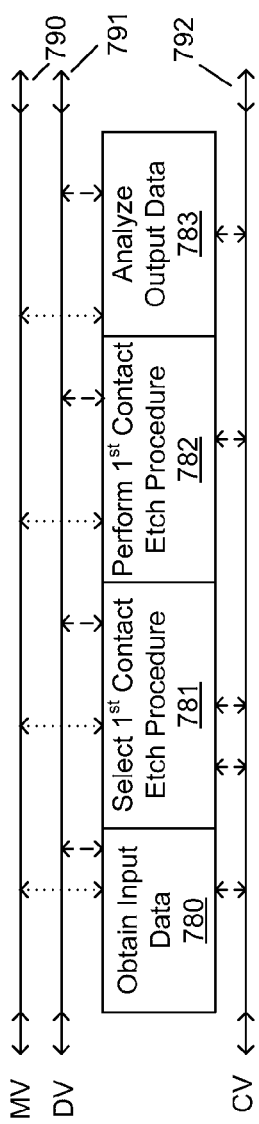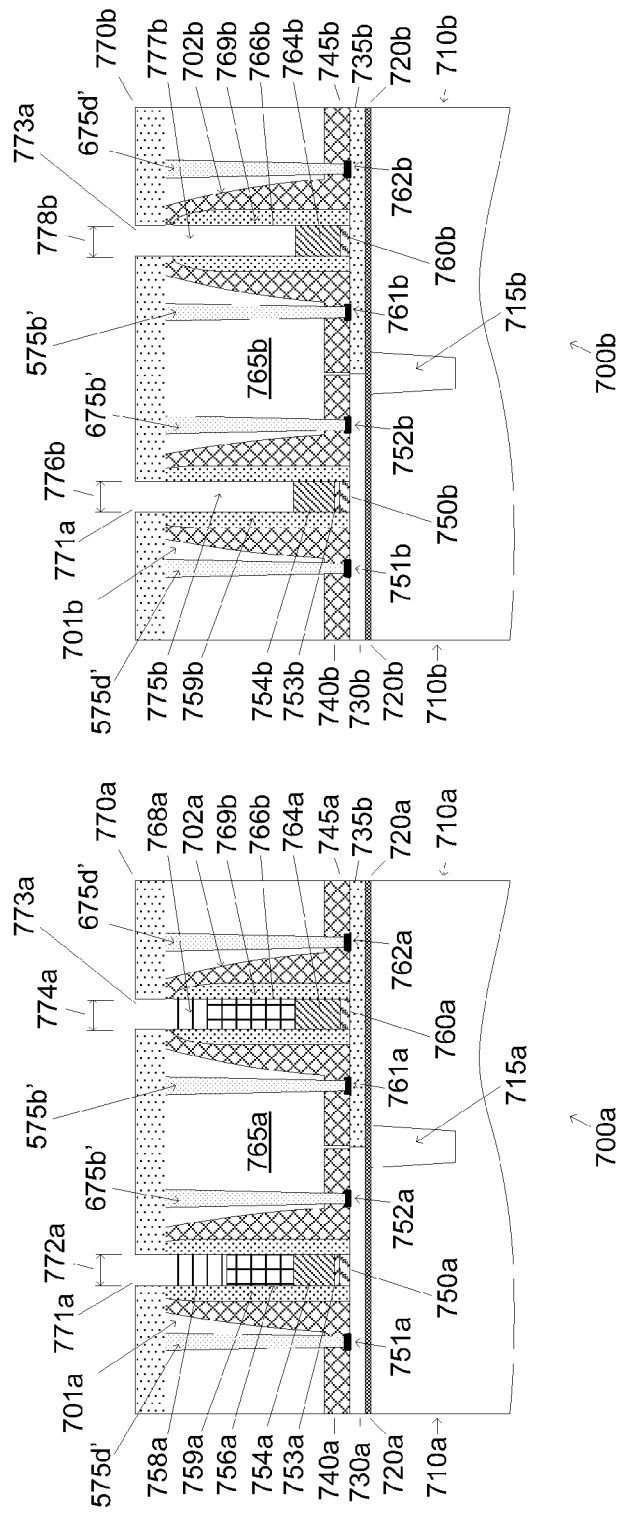
FIG. 7

CONTACT PROCESSING USING MULTI-INPUT/MULTI-OUTPUT (MIMO) MODELS

CROSS-REFERENCE TO RELATED APPLICATIONS

This application is related to co-pending U.S. patent application Ser. No. 12/186,668, entitled "Creating Multi-Layer/Multi-Input/Multi-Output (MLMIMO) Models for Metal-Gate Structures", published as 2010/0036514 on Feb. 11, 2010; and co-pending U.S. patent application Ser. No. 12/059,624, entitled "Multi-Layer/Multi-Input/Multi-Output (MLMIMO) Models and Method for Using", published as 2009/0242513 on Oct. 1, 2009. The contents of each of these applications are herein incorporated by reference in their entireties. This application is also related to U.S. Pat. No. 7,777,179, entitled "Two-Grid Ion Energy Analyzer and Methods of Manufacturing and Operating", by Chen, et al., issued on Aug. 17, 2010, and this patent is incorporated in its entirety herein by reference. In addition, this application is also related to U.S. Pat. No. 7,875,859, entitled "Ion Energy Analyzer and Methods of Manufacturing and Operating", by Chen, et al., issued on Jan. 25, 2011, and this patent is incorporated in its entirety herein by reference. In addition, this application is also related to U.S. Pat. No. 7,894,927, entitled "Using Multi-Layer/Multi-Input/Multi-Output (MLMIMO) Models For Metal-Gate Structures", by Funk, et al., issued on Jan. 25, 2011, and this patent is incorporated in its entirety herein by reference.

BACKGROUND OF THE INVENTION

1. Field of the Invention

The present invention relates to wafer processing, and more particularly to apparatus and methods for creating Double Pattern (DP) structures on a patterned wafer in real-time using Dual Pattern Contact-etch (DPCE) processing sequences and associated Contact-Etch-Multi-Input/Multi-Output (CE-MIMO) models.

2. Description of the Related Art

Etch process behavior is inherently non-linear and interacting step-to-step (layers), or as process stacks are compiled (etch/cvd/implant). With the knowledge of the process interactions based on physical modeling of Tokyo Electron Limited (TEL) chambers and base processes and imperial data and measurements from process refinement and tuning the control of Critical Dimension (CD), Sidewall Angle (SWA), depths, film thicknesses, over etching, undercuts, surface cleaning and damage control can be recursively calculated and optimized using multi-input multi-output non-linear models. Current low cost products use a bulk silicon technology. As the transistor continues to shrink, the impact of the channel depth is becoming critical (ultra-shallow source/drain extensions). As the Silicon-on-Insulator (SOI) film shrinks, smaller variations in the gate and/or spacer thickness and thickness of the SOI film can affect the transistor's performance. When etch procedures are not controlled, the removal of the material near the gate affects the electrical performance.

Current high performance microprocessors use PD SOI (partially depleted Silicon-on-Insulator film—giving a threshold voltage 0.2 volts. PD SOI films are around 50 nm thick while the gate and/or spacer reduction amount can be a large percentage (10%) of the total gate and/or spacer thickness. Future generations of SOI films are called FD SOI (fully depleted SOI), giving a threshold voltage 0.08 volts and a thickness of ~25 nm). Currently these films are not in production due to limitations in thickness control uniformity and defects. Channel mobility degrades with decreasing SOI thickness. With thinner films, the control of the metal-gate structures becomes more critical

SUMMARY OF THE INVENTION

The invention can provide apparatus and methods of creating Double Pattern (DP) structures on a pattern wafer in real-time using Dual Pattern Contact-etch (DPCE processing sequences and associated Contact-Etch-Multi-Input/Multi-Output (CE-MIMO) models. Other aspects of the invention will be made apparent from the description that follows and from the drawings appended hereto.

BRIEF DESCRIPTION OF THE DRAWINGS

Embodiments of the invention will now be described, by way of example only, with reference to the accompanying schematic drawings in which corresponding reference symbols indicate corresponding parts, and in which:

FIGS. 2A-2G show exemplary block diagrams of contact-etch subsystems in accordance with embodiments of the invention;

FIGS. 3A-3G show exemplary block diagrams of additional contact-etch subsystems in accordance with embodiments of the invention;

FIG. 7 illustrates exemplary views of a third Double-Pattern-Contact-Etch (DPCE) processing sequence for creating third double pattern (DP) features in accordance with embodiments of the invention;

DETAILED DESCRIPTION

Figure 1:
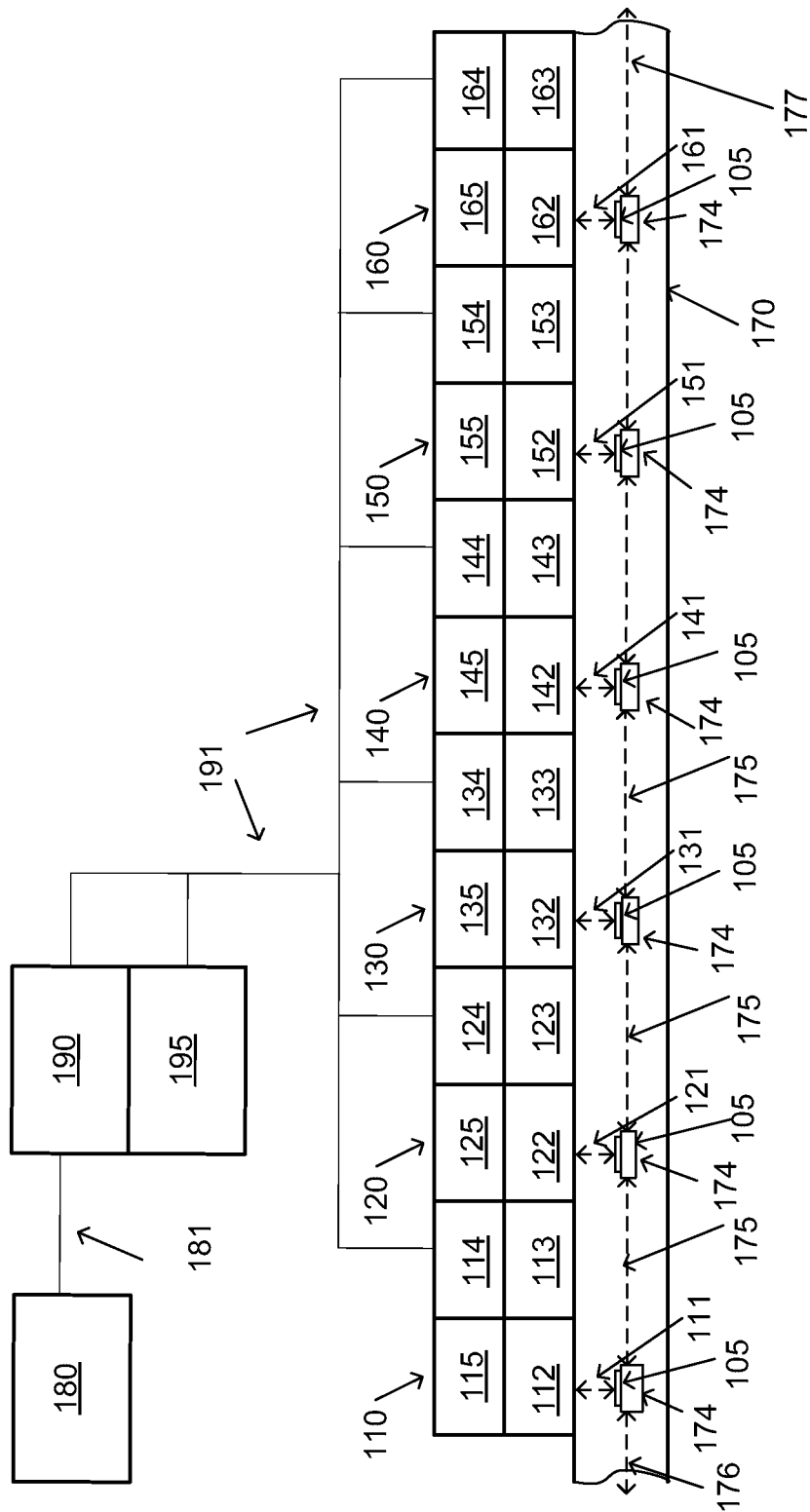
FIG. 1 shows an exemplary block diagram of a processing system in accordance with embodiments of the invention.

The contact-etch CE-MIMO models can be subdivided into layers of a finite granularity based on the application need. Each layer can be a physical material, with layer separation denoted by material changes or dimensional layer boundaries. Layers can be combination of layers of layers, such as metal gate stack layers and subsequent spacer deposition and etching of the spacer layer covering the metal gate layers. Layers can be mapped to DPCE processing sequences or contact-etch procedures with time or End Point Detection (EPD) being used to separate the steps. Additionally a continuous real-time controller can run with real-time updates from a combination of metrology data, sensors, and etch models.

Design of Experiments (DOEs) can be run to model the process gain of each potential control knob and the interactions of the inputs and outputs associated with each layer, and the interactions and gains of process control loops layer to layer. A method of determining interaction between each control knob and output can be used to evaluate and optimize the model stability such as Relative Gain Array (RGA). This information can also drive setup of individual feedback loops that are non-interacting.

The CE-MIMO models can be used to calculate the optimum inputs for a set of goals (or targeted outputs). Constraints can be ranges of process parameters such as time, gas flows, and temperature by layer. During CE-MIMO model development, a set of weightings can be applied to guide the optimizer to prioritize the outputs with most value to the current process calculations at a given time. Target weightings can be used where an equation is applied to the weighting calculation given a target and gain constants that effectively penalizes as the optimizer moves away from target in a linear or non-linear way. Targets can be a center target or and limit target (above a given value—for example with SWA).

Feedback can take the form of multiple loops, one for each targeted output with a calculation of the feedback error based on the actual less predicted error. When using an CE-MIMO model, each predicted output error could be calculated and matched with the feedback measurements to determine the real error. Feedback filtering methods such as Exponentially Weighted Moving Averages (EWMA) filters or Kalman filters can be used to filter noise. Outputs from a controller associated with a contact-etch procedure or an Ion Energy Optimized (IEO) etch procedure can include a goodness of fit value, and the GOF value can then be used as the input to a cascaded controller.

MIMO controllers can calculate updates at different times as the processing steps are performed allowing the controller to make new updates based on past calculations, errors in calculations, changes in tool state or material state then incorporated into the most recent update.

In some contact-etch procedures, when the resist parameters are measured, they can be used for feed forward, and can be weighted based on previous wafers feedback and chamber state information. At the beginning of a Lot, the CE-MIMO model can be configured to use the best known values for the patterned etch mask layer, and these can be weighted to the center of the previous lot's distribution, During the lot processing, the parameters for the inter-dielectric layer (IDL) or the hard mask layers can be measured and filtered using a weighting method such as EWMA to smooth wafer-to-wafer (W2W) variations and can be fed back to update the current feed forward SWA value. The SWA pattern analysis function can group bimodal patterns so two threads can be managed to feedback and/or feed forward data. In one example, the SWA W2W variation is more commonly driven by scanner stage so two feed forward/feedback threads can be maintained to optimize performance. In a second example, the W2W CD variation from the lithography tool can be dominated by the hot plates, so a two, three, or four variation pattern can be observed. When IM measurements are made after the lithography processes, the pattern across the wafer can be established before wafer processing and the wafer CD and SWA patterns can be established before the wafers are sent to the etcher. When more than one processing threads are used, the thread number can be added as a context item for the wafer. In addition, when the scanner and/or track cell number, scanner module number, and hot plate number are available, they can also be used to group wafers and establish feed forward threads from the Lithography tool to the Etch Tool. Alternatively, other combinations of coater/developers may also be used.

When the wafers are sorted based on context groups, the wafers can be processed based on their group or contact-etch procedure. When processing order in the etch tool is the same as the processing order in the lithography tool, the current feedback (FB) controller can be programmed to adjust for W2W for incoming drift inside the lithography tool and for drift inside the etch tool The invention provides apparatus and methods for processing wafers having a large number of semiconductor devices thereon and an even larger number of transistor gate and/or spacer structures. In various embodiments, apparatus and methods are provided for creating and/or using a CE-MIMO evaluation library, for performing DPCE processing sequences that can include one or more contact-etch metal gate sequences, one or more contact-etch via-etch sequences, one or more CE measurement procedures, one or more cleaning procedures, and/or one or more verification procedures.

One or more periodic structures can be provided at various locations on a wafer and can be used to evaluate and/or verify contact-etch (CE) MIMO models and associated DPCE processing sequences. Wafers can have wafer data associated with them, and the wafer data can include real-time and historical contact-etch (CE) data. In addition, the wafer can have other data associated with them, and the other data can include gate structure data, the number of required sites, the number of visited sites, confidence data and/or risk data for one or more of the sites, site ranking data, transferring sequence data, or process-related data, or evaluation/verification-related data, or any combination thereof. The data associated with DPCE processing sequences can include transfer sequence data that can be used to establish when and where to transfer the wafers, and contact-etch procedures can be change using operational state data.

The contact-etch (CE) MIMO model can be subdivided into layers of a finite granularity based on the application need. Each layer can be a physical material, with layer separation denoted by material changes or dimensional layer boundaries. Layers can be combination of layers of layers, such as a metal gate stack of layers and a subsequent spacer deposition and etching of the layer covering the metal gate layers.

Layers can be mapped to etch steps with time or End Point Data (EPD) being used to separate the steps. Additionally a continuous real-time controller can run with real-time updates from a combination of metrology data, sensors, and etch models.

An analytical device used in process control multivariable applications, based on the comparison of single-loop control to multivariable control; expressed as an array (for all possible input-output pairs) of the ratios of a measure of the single-loop behavior between an input-output variable pair, to a related measure of the behavior of the same input-output pair under some idealization of multivariable control.

CE-MIMO modeling is used to calculate the optimum inputs for a set of goals (or targeted outputs). Constraints can be ranges of process parameters such as time, gas flows, and temperature by layer. With a CE-MIMO model, a set of weightings can be applied to guide the optimizer to prioritize the outputs with most value to the current process calculations at a given time. Target weightings can be used where an equation is applied to the weighting calculation given a target and gain constants that effectively penalizes as the optimizer moves away from target in a linear or non-linear way. Targets can be a center target or and limit target (above a given value—for example with SWA).

Feedback can take the form of multiple loops, one for each targeted output with a calculation of the feedback error based on the actual less predicted error. With a CE-MIMO model, each prediction output error needs to be calculated and matched with the feedback measurements to determine the real error. Feedback filtering methods such as EWMA or Kalman filters can be used to filter noise. Outputs of a layer controller can include a goodness of fit (GOF), and this GOF value can then be used as the input of a cascading layer controller.

The wafer can be partitioned into one or more upper edge regions, one or more center regions, and one or more lower edge regions.

Layer controllers can contain updates at different times as the processing steps are performed, thereby allowing the controller to make new updates based on past calculations, errors in the calculations, changes in tool state or material state then incorporated into the updates.

As feature sizes decrease below the 65 nm node, accurate processing, and/or measurement data becomes more important and more difficult to obtain. CE-MIMO models and associated DPCE processing sequences can be used to more accurately process and/or measure these ultra-small devices and features. The data from a contact-etch (CE) procedure can be compared with the warning and/or control limits, when a run-rule is violated, an alarm can be generated indicating a processing problem, and correction procedures can be performed in real time.

FIG. 1 shows an exemplary block diagram of a processing system in accordance with embodiments of the invention. In the illustrated embodiment, processing system 100 comprises a lithography subsystem 110, a scanner subsystem 120, an etch subsystem 130, a deposition subsystem 140, an inspection subsystem 150, a metrology subsystem 160, a transfer subsystem 170, a manufacturing execution system (MES) 180, a system controller 190, and a memory/database 195. Single subsystems (110, 120, 130, 140, 150, 160, and 170) are shown in the illustrated embodiment, but this is not required for the invention. In some embodiments, multiple subsystems (110, 120, 130, 140, 150, 160, and 170) can be used in a processing system 100. In some embodiments, one or more of the subsystems (110, 120, 130, 140, 150, 160, and 170) can comprise one or more processing elements that can be used in CE-MIMO models and associated DPCE processing sequences. In other embodiments, one or more of the subsystems (110, 120, 130, 140, 150, 160, and 170) can comprise one or more processing elements that can be used in Ion Energy Controlled (IEC) MIMO models, IEC etch sequences, and associated Ion Energy Optimized (IEO) etch procedures.

The system controller 190 can be coupled to the lithography subsystem 110, the scanner subsystem 120, the etch subsystem 130, the deposition subsystem 140, the inspection subsystem 150, the metrology subsystem 160, and the transfer subsystem 170 using a data transfer subsystem 191. The system controller 190 can be coupled to the MES 180 using the data transfer subsystem 181. Alternatively, other configurations may be used. For example, the etch subsystem 130, the deposition subsystem 140, the metrology subsystem 160, and a portion of the transfer subsystem 170 can be part of a Tactras™ System available from Tokyo Electron Limited.

The lithography subsystem 110 can comprise one or more transfer/storage elements 112, one or more processing elements 113, one or more controllers 114, and one or more evaluation elements 115. One or more of the transfer/storage elements 112 can be coupled to one or more of the processing elements 113 and/or to one or more of the evaluation elements 115 and can be coupled by link 111 to the transfer subsystem 170. The transfer subsystem 170 can be coupled by the link 111 to the lithography subsystem 110, and one or more wafers 105 can be transferred by the link 111 between the transfer subsystem 170 and the lithography subsystem 110 in real time. For example, the transfer subsystem 170 can be coupled to one or more of the transfer/storage elements 112, to one or more of the processing elements 113, and/or to one or more of the evaluation elements 115. One or more of the controllers 114 can be coupled to one or more of the transfer/storage elements 112, to the one or more of the processing elements 113, and/or to one or more of the evaluation elements 115.

In some embodiments, the lithography subsystem 110 can perform coating procedures, thermal procedures, measurement procedures, inspection procedures, alignment procedures, and/or storage procedures on one or more wafers using procedures and/or procedures. For example, one or more lithography-related processes can be used to deposit one or more masking layers that can include photoresist material, and/or anti-reflective coating (ARC) material, and can be used to thermally process (bake) one or more of the masking layers. In addition, lithography subsystem 110 can be used to develop, measure, and/or inspect one or more of the patterned masking layers on one or more of the wafers.

The scanner subsystem 120 can comprise one or more transfer/storage elements 122, one or more processing elements 123, one or more controllers 124, and one or more evaluation elements 125. One or more of the transfer/storage elements 122 can be coupled to one or more of the processing elements 123 and/or to one or more of the evaluation elements 125 and can be coupled by link 121 to the transfer subsystem 170. The transfer subsystem 170 can be coupled by the link 121 to the scanner subsystem 120, and one or more wafers 105 can be transferred by the link 121 between the transfer subsystem 170 and the scanner subsystem 120 in real time. For example, the transfer subsystem 170 can be coupled to one or more of the transfer/storage elements 122, to one or more of the processing elements 123, and/or to one or more of the evaluation elements 125. One or more of the controllers 124 can be coupled to one or more of the transfer/storage elements 122, to the one or more of the processing elements 123, and/or to one or more of the evaluation elements 125.

In some embodiments, the scanner subsystem 120 can be used to perform wet and/or dry exposure procedures, and in other cases, the scanner subsystem 120 can be used to perform extreme ultraviolet (EUV) exposure procedures.

The etch subsystem 130 can comprise one or more transfer/storage elements 132, one or more processing elements 133, one or more controllers 134, and one or more evaluation elements 135. One or more of the transfer/storage elements 132 can be coupled to one or more of the processing elements 133 and/or to one or more of the evaluation elements 135 and can be coupled by link 131 to the transfer subsystem 170. The transfer subsystem 170 can be coupled by the link 131 to the etch subsystem 130, and one or more wafers 105 can be transferred by the link 131 between the transfer subsystem 170 and the etch subsystem 130 in real time. For example, the transfer subsystem 170 can be coupled to one or more of the transfer/storage elements 132, to one or more of the processing elements 133, and/or to one or more of the evaluation elements 135. One or more of the controllers 134 can be coupled to one or more of the transfer/storage elements 132, to the one or more of the processing elements 133, and/or to one or more of the evaluation elements 135. For example, one or more of the processing elements 133 can be used to perform plasma or non-plasma etching, ashing, trimming, and cleaning procedures. Evaluation procedures and/or inspection procedures can be used to measure and/or inspect one or more surfaces and/or layers of the wafers. The etch subsystem 130 can be configured as described herein in FIGS. 2A-2G and FIGS. 3A-3G.

The deposition subsystem 140 can comprise one or more transfer/storage elements 142, one or more processing elements 143, one or more controllers 144, and one or more evaluation elements 145. One or more of the transfer/storage elements 142 can be coupled to one or more of the processing elements 143 and/or to one or more of the evaluation elements 145 and can be coupled by link 141 to the transfer subsystem 170. The transfer subsystem 170 can be coupled by the link 141 to the deposition subsystem 140, and one or more wafers 105 can be transferred by the link 141 between the transfer subsystem 170 and the deposition subsystem 140 in real time. For example, the transfer subsystem 170 can be coupled to one or more of the transfer/storage elements 142, to one or more of the processing elements 143, and/or to one or more of the evaluation elements 145. One or more of the controllers 144 can be coupled to one or more of the transfer/storage elements 142, to the one or more of the processing elements 143, and/or to one or more of the evaluation elements 145. For example, one or more of the processing elements 143 can be used to perform physical vapor deposition (PVD) procedures, chemical vapor deposition (CVD) procedures, ionized physical vapor deposition (iPVD) procedures, atomic layer deposition (ALD) procedures, plasma enhanced atomic layer deposition (PEALD) procedures, and/or plasma enhanced chemical vapor deposition (PECVD) procedures. Evaluation procedures and/or inspection procedures can be used to measure and/or inspect one or more surfaces of the wafers.

The inspection subsystem 150 can comprise one or more transfer/storage elements 152, one or more processing elements 153, one or more controllers 154, and one or more evaluation elements 155. One or more of the transfer/storage elements 152 can be coupled to one or more of the processing elements 153 and/or to one or more of the evaluation elements 155 and can be coupled by link 151 to the transfer subsystem 170. The transfer subsystem 170 can be coupled by the link 151 to the inspection subsystem 150, and one or more wafers 105 can be transferred by the link 151 between the transfer subsystem 170 and the inspection subsystem 150 in real time. For example, the transfer subsystem 170 can be coupled to one or more of the transfer/storage elements 152, to one or more of the processing elements 153, and/or to one or more of the evaluation elements 155. One or more of the controllers 154 can be coupled to one or more of the transfer/storage elements 152, to the one or more of the processing elements 153, and/or to one or more of the evaluation elements 155.

The metrology subsystem 160 can comprise one or more transfer/storage elements 162, one or more processing elements 163, one or more controllers 164, and one or more evaluation elements 165. One or more of the transfer/storage elements 162 can be coupled to one or more of the processing elements 163 and/or to one or more of the evaluation elements 165 and can be coupled by link 161 to the transfer subsystem 170. The transfer subsystem 170 can be coupled by the link 161 to the metrology subsystem 160, and one or more wafers 105 can be transferred by the link 161 between the transfer subsystem 170 and the metrology subsystem 160 in real time. For example, the transfer subsystem 170 can be coupled to one or more of the transfer/storage elements 162, to one or more of the processing elements 163, and/or to one or more of the evaluation elements 165. One or more of the controllers 164 can be coupled to one or more of the transfer/storage elements 162, to the one or more of the processing elements 163, and/or to one or more of the evaluation elements 165. The metrology subsystem 160 can comprise one or more processing elements 163 that can be used to perform real-time optical metrology procedures that can be used to measure target structures at one or more sites on a wafer using library-based or regression-based techniques. For example, the sites on wafer can include MIMO sites, target sites, overlay sites, alignment sites, measurement sites, verification sites, inspection sites, or damage-assessment sites, or any combination thereof. For example, one or more "golden wafers" or reference chips can be stored and used periodically to verify the performance of one or more of the processing elements 163, and/or one or more of the evaluation elements 165.

In some embodiments, the metrology subsystem 160 can include integrated Optical Digital Profilometry (iODP) elements (not shown), and iODP elements/systems are available from Timbre Technologies Inc. (a TEL company). Alternatively, other metrology systems may be used. For example, iODP techniques can be used to obtain real-time data that can include critical dimension (CD) data, gate structure data, and thickness data, and the wavelength ranges for the iODP data can range from less than about 200 nm to greater than about 900 nm. Exemplary iODP elements can include ODP Profiler Library elements, Profiler Application Server (PAS) elements, and ODP Profiler Software elements. The ODP Profiler Library elements can comprise application specific database elements of optical spectra and its corresponding semiconductor profiles, CDs, and film thicknesses. The PAS elements can comprise at least one computer that connects with optical hardware and computer network. The PAS elements can be configured to provide the data communication, ODP library operation, measurement process, results generation, results analysis, and results output. The ODP Profiler Software elements can include the software installed on PAS elements to manage measurement recipe, ODP Profiler library elements, ODP Profiler data, ODP Profiler search/match results, ODP Profiler calculation/analysis results, data communication, and PAS interface to various metrology elements and computer network.

The metrology subsystem 160 can use polarizing reflectometry, spectroscopic ellipsometry, reflectometry, or other optical measurement techniques to measure accurate device profiles, accurate CDs, and multiple layer film thickness of a wafer. The integrated metrology process (iODP) can be executed as an integrated process in an integrated group of subsystems. In addition, the integrated process eliminates the need to break the wafer for performing the analyses or waiting for long periods for data from external systems. iODP techniques can be used with the existing thin film metrology systems for inline profile and CD measurement, and can be integrated with TEL processing systems and/or lithography systems to provide real-time process monitoring and control. Simulated metrology data can be generated by applying Maxwell's equations and using a numerical analysis technique to solve Maxwell's equations.

The transfer subsystem 170 can comprise transfer elements 174 coupled to transfer tracks (175, 176, and 177) that can be used to receive wafers, transfer wafers, align wafers, store wafers, and/or delay wafers. For example, the transfer elements 174 can support two or more wafers. Alternatively, other transferring means may be used. The transfer subsystem 170 can load, transfer, store, and/or unload wafers based on a CE-MIMO model, a DPCE processing sequence, a transfer sequence, operational states, the wafer and/or processing states, the processing time, the current time, the wafer data, the number of sites on the wafer, the type of sites on the wafers, the number of required sites, the number of completed sites, the number of remaining sites, or confidence data, or any combination thereof.

In some examples, transfer subsystem 170 can use loading data to determine where and when to transfer a wafer. In other examples, a transfer system can use MIMO modeling data to determine where and when to transfer a wafer. Alternatively, other procedures may be used. For example, when the first number of wafers is less than or equal to the first number of available processing elements, the first number of wafers can be transferred to the first number of available processing elements in the one or more of the subsystems using the transfer subsystem 170. When the first number of wafers is greater than the first number of available processing elements, some of the wafers can be stored and/or delayed using one or more of the transfer/storage elements (112, 122, 132, 142, 152, and 162) and/or the transfer subsystem 170.

In addition, the one or more subsystems (110, 120, 130, 140, 150, 160, and 170) can be used when performing lithography-related procedures, scanner-related procedures, inspection-related procedures, measurement-related procedures, evaluation-related procedures, etch-related procedures, deposition-related procedures, thermal processing procedures, coating-related procedures, alignment-related procedures, polishing-related procedures, storage-related procedures, transfer procedures, cleaning-related procedures, rework-related procedures, oxidation-related procedures, nitridation-related procedures, or external processing elements, or any combination thereof.

Operational state data can be established for the subsystems (110, 120, 130, 140, 150, 160, and 170) and can be used and/or updated by contact-etch procedures. In addition, operational state data can be established for the transfer/storage elements (112, 122, 132, 142, 152, and 162), processing elements (113, 123, 133, 143, 153, and 163), and evaluation elements (115, 125, 135, 145, 155, and 165), and can be updated by contact-etch procedures. For example, the operational state data for the processing elements can include availability data, matching data for the processing elements, expected processing times for some process steps and/or sites, yield data, confidence data and/or risk data for the processing elements, or confidence data and/or risk data for one or more DPCE processing sequences. Updated operational states can be obtained by querying in real-time one or more processing elements, and/or one or more subsystems. Updated loading data can be obtained by querying in real-time one or more transfer elements, and/or one or more transfer subsystems.

One or more of the controllers (114, 124, 134, 144, 154, and 164) can be coupled to the system controller 190 and/or to each other using a data transfer subsystem 191. Alternatively, other coupling configurations may be used. The controllers can be coupled in series and/or in parallel and can have one or more input ports and/or one or more output ports. For example, the controllers may include microprocessors having one or more core processing elements.

In addition, subsystems (110, 120, 130, 140, 150, 160, and 170) can be coupled to each other and to other devices using intranet, internet, wired, and/or wireless connections. The controllers (114, 124, 134, 144, 154, 164, and 190) can be coupled to external devices as required.

One or more of the controllers (114, 124, 134, 144, 154, 164, and 190) can be used when performing real-time DPCE processing sequences. A controller can receive real-time data from an Ion Energy (IE)-MIMO model to update subsystem, processing element, process, recipe, profile, image, pattern, simulation, sequence data, and/or model data. One or more of the controllers (114, 124, 134, 144, 154, 164, and 190) can be used to exchange one or more Semiconductor Equipment Communications Standard (SECS) messages with the Manufacturing Execution Systems (MES) 180 or other systems (not shown), read and/or remove information, feed forward, and/or feedback the information, and/or send information as a SECS message. One or more of the formatted messages can be exchanged between controllers, and the controllers can process messages and extract new data in real-time. When new data is available, the new data can be used in real-time to update a model and/or procedure currently being used for the wafer and/or lot. For example, the current layout can be examined using the updated model and/or procedure when the model and/or procedure can be updated before the current layout is examined. The current layout can be examined using a non-updated model and/or procedure when an update cannot be performed before the current layout is processed. In addition, formatted messages can be used when contact-etch procedures are changed, when contact-etch-related models are changed, when DPCE processing sequences are changed, when design rules are changed, or when layouts are changed.

In some examples, the MES 180 may be configured to monitor some subsystem and/or system processes in real-time, and factory level intervention and/or judgment rules can be used to determine which processes are monitored and which data can be used. For example, factory level intervention and/or judgment rules can be used to determine how to manage the data when a MIMO-related error condition occurs. The MES 180 can also provide modeling data, sequence data, process data, and/or wafer data.

In addition, controllers (114, 124, 134, 144, 154, 164, and 190) can include memory (not shown) as required. For example, the memory (not shown) can be used for storing information and instructions to be executed by the controllers, and may be used for storing temporary variables or other intermediate information during the execution of instructions by the various computers/processors in the processing system 100. One or more of the controllers (114, 124, 134, 144, 154, 164, and 190), or other system components can comprise the means for reading data and/or instructions from a computer readable medium and can comprise the means for writing data and/or instructions to a computer readable medium.

The processing system 100 can perform a portion of or all of the processing steps of the invention in response to the computers/processors in the processing system 100 executing one or more sequences of one or more instructions contained in a memory and/or received in a message. Such instructions may be received from another computer, a computer readable medium, or a network connection.

In some embodiments, an integrated system can be configured using system components from Tokyo Electron Limited (TEL), and external subsystems and/or tools may be included. For example, measurement elements can be provided that can include a CD-Scanning Electron Microscopy (CDSEM) system, a Transmission Electron Microscopy (TEM) system, a focused ion beam (FIB) system, an Optical Digital Profilometry (ODP) system, an Atomic Force Microscope (AFM) system, or another optical metrology system.

The subsystems and/or processing elements can have different interface requirements, and the controllers can be configured to satisfy these different interface requirements.

One or more of the subsystems (110, 120, 130, 140, 150, 160, and 170) can perform control applications, Graphical User Interface (GUI) applications, and/or database applications. In addition, one or more of the subsystems (110, 120, 130, 140, 150, 160, and 170) and/or controllers (114, 124, 134, 144, 154, 164, and 190) can include Design of Experiment (DOE) applications, Advanced Process Control (APC) applications, Fault Detection and Classification (FDC) applications, and/or Run-to-Run (R2R) applications.

Output data and/or messages from DPCE processing sequences or contact-etch modeling procedures can be used in subsequent sequences and/or procedures to optimize the process accuracy and precision. Data can be passed to DPCE processing sequences or contact-etch procedures in real-time as real-time variable parameters, overriding current model values, and reducing DOE tables. Real-time data can be used with a library-based system, or regression-based system, or any combination thereof to optimize the DPCE processing sequences or the contact-etch procedures.

When a regression-based library creation procedure is used, measured CE-MIMO model data can be compared to simulated CE-MIMO model data. The simulated CE-MIMO model data can be iteratively generated, based on sets of contact-etch process parameters, to obtain a convergence value for the set of contact-etch process parameters that generates the closest match simulated CE-MIMO model data compared to the measured CE-MIMO model data. When a library-based process is used, a CE-MIMO model library can be generated and/or enhanced using CE-MIMO model procedures, recipes, profiles, and/or models. For example, an CE-MIMO model library can comprise simulated and/or measured CE-MIMO data and corresponding sets of contact-etch procedure data. The regression-based and/or the library-based processes can be performed in real-time. An alternative procedure for generating data for an CE-MIMO library can include using a machine learning system (MLS). For example, prior to generating the CE-MIMO library data, the MLS can be trained using known input and output data, and the MLS may be trained with a subset of the CE-MIMO library data.

The CE-MIMO models can include intervention and/or judgment rules that can be executed whenever a matching context is encountered. Intervention and/or judgment rules and/or limits can be established based on historical procedures, on the customer's experience, or process knowledge, or obtained from a host computer. Rules can be used in Fault Detection and Classification (FDC) procedures to determine how to respond to alarm conditions, error conditions, fault conditions, and/or warning conditions. The rule-based FDC procedures can prioritize and/or classify faults, predict system performance, predict preventative maintenance schedules, decrease maintenance downtime, and extend the service life of consumable parts in the system. Various actions can take place in response to an alarm/fault, and the actions taken on the alarm/fault can be context-based, and the context data can be specified by a rule, a system/process recipe, a chamber type, identification number, load port number, cassette number, lot number, control job ID, process job ID, slot number and/or the type of data.

Unsuccessful contact-etch procedures or DPCE processing sequences can report a failure when a limit is exceeded, and successful contact-etch procedures or DPCE processing sequences can create warning messages when limits are being approached. Pre-specified failure actions for known errors can be stored in a database, and can be retrieved from the database when an error occurs. For example, contact-etch procedures or DPCE processing sequences can reject some of the contact-etch data at one or more of the process times when a data collection or validation procedure fails. In addition, contact-etch procedures or DPCE processing sequences can reject the data at one or more of the sites for a wafer when a measurement procedure fails.

Contact-etch procedures, DPCE processing sequences, and/or CE-MIMO models can be used to create, modify, and/or evaluate isolated and/or nested structures at different times and/or sites. For example, gate stack dimensions and wafer thickness data can be different near isolated and/or nested structures, and gate stack dimensions and wafer thickness data can be different near open areas and/or trench array areas. A CE-MIMO model can create optimized data for isolated and/or nested structures to update and/or optimize a process recipe and/or process time.

Contact-etch procedures, DPCE processing sequences, and/or CE-MIMO models can use end-point detection (EPD) data and process time data to improve the accuracy. When EPD data is used to stop an etch procedure, the EPD time data and the process rate data can be used to estimate the amount of etch and/or to estimate a thickness.

In various examples, CE-related data limits can be obtained by performing one or more contact-etch procedure in a test processing chamber using an CE-sensor wafer, can be historical data that is stored in a library, can be obtained by performing a verified contact-etch procedure, can be obtained from the MES 180, can be simulation data, and can be predicted data. In addition, IE-related procedure limits can be obtained by performing the IE-related etch procedure in a "reference/golden" processing chamber.

FIGS. 2A-2G show exemplary block diagrams of contact-etch subsystems in accordance with embodiments of the invention.

A first exemplary contact-etch subsystem 200A is shown in FIG. 2A, and the illustrated contact-etch subsystem 200A includes a process chamber 210, wafer holder 220, upon which a wafer 205 to be processed is affixed, gas supply system 240, and vacuum pumping system 257. For example, wafer holder 220 can be coupled to and insulated from the process chamber 210 using base 225. Wafer 205 can be, for example, a semiconductor wafer, a work piece, or a liquid crystal display (LCD). For example, process chamber 210 can be configured to facilitate the generation of contact-etch (CE) plasma in processing region 249 adjacent a surface of wafer 205, and the CE-plasma is formed via collisions between heated electrons and an ionizable gas. An ionizable gas or mixture of gases can be introduced from the gas supply system 240, and process pressure is adjusted using vacuum pumping system 257. Desirably, the CE-plasma can be used to create materials specific to a predetermined material process, and to aid either the deposition of material to wafer 205 or the removal of material from the exposed surfaces of wafer 205. For example, controller 295 can be used to control vacuum pumping system 257 and gas supply system 240.

Wafer 205 can be, for example, transferred into and out of the process chamber 210 through a slot valve (not shown) and chamber feed-through (not shown) via robotic transfer system where it is received by wafer lift pins (not shown) housed within wafer holder 220 and mechanically translated by devices housed therein. After the wafer 205 is received from transfer system, it is lowered to an upper surface of wafer holder 220.

For example, wafer 205 can be affixed to the wafer holder 220 via an electrostatic clamping system (not shown). The wafer holder 220 can include temperature control elements 229 that can be coupled to a temperature control system 228. For example, the temperature control elements 229 can include resistive heating elements, or thermo-electric heaters/coolers. Backside gas can be delivered to the backside of the wafer via a dual (center/edge) backside gas delivery system (226, and 227) to improve the gas-gap thermal conductance between wafer 205 and wafer holder 220. A dual (center/edge) backside gas delivery system (226 and 227) can be utilized when additional temperature control of the wafer is required at elevated or reduced temperatures. For example, temperature control of the wafer 205 can be useful at temperatures in excess of the steady-state temperature achieved due to a balance of the heat flux delivered to the wafer 205 from the plasma and the heat flux removed from wafer 205 by conduction to the wafer holder 220.

As shown in FIG. 2A, wafer holder 220 includes a lower electrode 232 through which Radio Frequency (RF) power can be coupled to plasma in processing region 249. For example, lower electrode 232 can be electrically biased at an RF voltage via the transmission of RF power from first RF generator 230 through impedance match network 231 to lower electrode 232. The RF bias can serve to heat electrons to form and maintain the CE-plasma. A typical frequency for the RF bias can range from 1 MHz to 100 MHz and is preferably 13.56 MHz.

Alternatively, RF power may be applied to the lower electrode 232 at multiple frequencies. Furthermore, impedance match network 231 serves to maximize the transfer of RF power to CE-plasma in process chamber 210 by minimizing the reflected power. Various match network topologies and automatic control methods can be utilized.

With continuing reference to FIG. 2A, gas supply system 240 can be coupled to gas plenum 242 using interface elements 241, and the gas plenum 242 can be coupled to gas distribution elements (245a and 245b). The gas distribution elements (245a and 245b) can provide different flow rates (247a and 247b) of process gases to one or more areas of the processing region 249. Process gas can, for example, include a mixture of gases such as Argon (Ar), Tetrafluoromethane ($CF_4$) and Oxygen ($O_2$), or Ar, $C_4F_8$ and $O_2$ for oxide etch applications, or other chemistries such as, for example, $O_2/CO/Ar/C_4F_8$, $O_2/CO/Ar/C_5F_8$, $O_2/CO/Ar/C_4F_6$, $O_2/Ar/C_4F_6$, $N_2/H_2$, and hydrogen bromide (HBr). Gas distribution elements (245a and 245b) can be configured to reduce or minimize the introduction of contaminants to wafer 205 and can include a multi-orifice gas injection showerhead. For example, process gas can be supplied from the gas supply system 240. In addition, gas distribution elements (245a and 245b) can provide different process gases to different regions of the processing region 249.

The vacuum pumping system 257 can include a turbo-molecular vacuum pump (TMP) 258 capable of a pumping speed up to 5000 liters per second (and greater) and a gate valve 259 for controlling the chamber pressure. In conventional plasma processing devices utilized for dry plasma etch processes, a 1000 to 3000 liter per second TMP is generally employed. TMPs are useful for low pressure processing, typically less than 50 mTorr. At higher pressures, the TMP pumping speed falls off dramatically. For high pressure processing (i.e., greater than 100 mTorr), a mechanical booster pump and dry roughing pump can be used. Furthermore, a device for monitoring chamber pressure (not shown) may be coupled to the process chamber 210. The pressure-measuring device can be, for example, a Type 628B Baratron absolute capacitance manometer commercially available from MKS Instruments, Inc. (Andover, Mass.).

As depicted in FIG. 2A, the contact-etch subsystem 200A can include one or more process sensors 236 coupled to the process chamber 210 to obtain process data, and controller 295 can be coupled to the process sensors 236 to receive process data. The process sensors 236 can include both sensors that are intrinsic to the process chamber 210 and sensors extrinsic to the process chamber 210. Intrinsic sensors can include those sensors pertaining to the functionality of process chamber 210 such as the measurement of the Helium backside gas pressure, Helium backside flow, electrostatic clamping (ESC) voltage, ESC current, wafer holder temperature (or lower electrode (LEL) temperature), coolant temperature, upper electrode (UEL) temperature, forward RF power, reflected RF power, RF self-induced DC bias, RF peak-to-peak voltage, chamber wall temperature, process gas flow rates, process gas partial pressures, chamber pressure, matching network settings, a focus ring thickness, RF hours, focus ring RF hours, and any statistic thereof. In addition, extrinsic sensors can include one or more optical devices for monitoring the light emitted from the plasma in processing region 249 as shown in FIG. 2A. The optical devices can include an optical sensor that can be used as an End Point Detector (EPD) and can provide EPD data. For example, an Optical Emissions Spectroscopy (OES) sensor may be used. The process sensors 236 can include a current and/or voltage probe, a power meter, or spectrum analyzer. For example, process sensors 236 can include a RF Impedance analyzer.

In some embodiments, the contact-etch subsystem 200A can include one or more first contact-etch (CE) sensors 234 coupled to process chamber 210 to obtain first contact-etch performance data, and controller 295 coupled to the first CE-sensors 234 to receive the first IE-related performance data. In addition, the contact-etch subsystem 200A can include one or more second contact-etch (CE) sensors 223 coupled to the wafer holder 220 to obtain second IE-related performance data, and an IE control unit 222 can be coupled to the CE-sensors 223 to process the IE-related performance data. For example, the measurement of an IE signal, such as a time trace of voltage or current, permits the transformation of the IE signal into frequency domain using discrete Fourier series representation (assuming a periodic signal). Thereafter, the Fourier spectrum (or for a time varying signal, the frequency spectrum) can be monitored and analyzed to characterize the state of the CE-plasma.

Controller 295 includes a microprocessor, memory, and a digital I/O port (potentially including D/A and/or A/D converters) capable of generating control voltages sufficient to communicate and activate inputs to contact-etch subsystem 200 as well as monitor outputs from contact-etch subsystem 200. As shown in FIG. 2A, controller 295 can be coupled to and exchange information with process chamber 210, IE control unit 222, backside gas delivery system (226 and 227), temperature control system 228, first RF generator 230, impedance match network 231, CE-sensors 234, process sensors 236, gas supply system 240, gas plenum 242, and vacuum pumping system 257 using one or more interfaces 296. Programs stored in the memory can be utilized to interact with the aforementioned components of the contact-etch subsystem 200A according to a stored IE-related process recipe.

In the exemplary embodiment shown in FIG. 2B, the contact-etch subsystem 200B can be similar to the embodiment of FIG. 2A and further comprise either a stationary, or mechanically or electrically rotating magnetic field system 255, in order to potentially increase plasma density and/or improve plasma processing uniformity, in addition to those components described with reference to FIG. 2A. Moreover, controller 295 can be coupled to magnetic field system 255 in order to regulate the speed of rotation and field strength. The design and implementation of a rotating magnetic field is known to those skilled in the art.

Figure 2C:
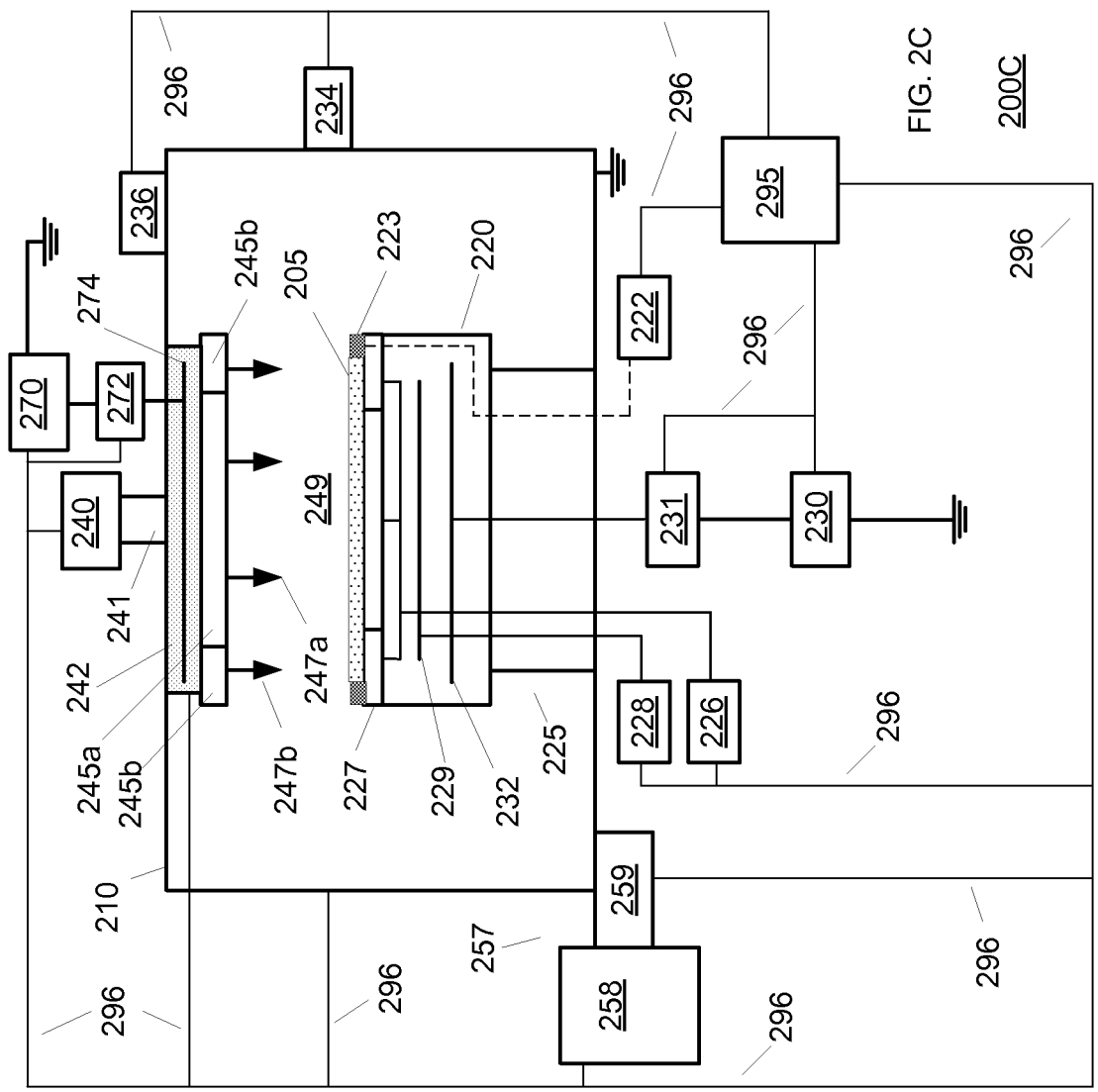

In the embodiment shown in FIG. 2C, the contact-etch subsystem 200C can be similar to the embodiment of FIG. 2A or FIG. 2B, and can further comprise an upper electrode 274 to which RF power can be coupled from RF generator 270 through optional impedance match network 272. A frequency for the application of RF power to the upper electrode 274 can range from about 0.1 MHz to about 200 MHz. Additionally, a frequency for the application of power to the lower electrode 232 can range from about 0.1 MHz to about 100 MHz. Moreover, controller 295 can be coupled to RF generator 270 and impedance match network 272 in order to control the application of RF power to upper electrode 274. The design and implementation of an upper electrode is well known to those skilled in the art. The upper electrode 274 and the gas plenum 242 can be coupled to each other as shown.

Figure 2D:
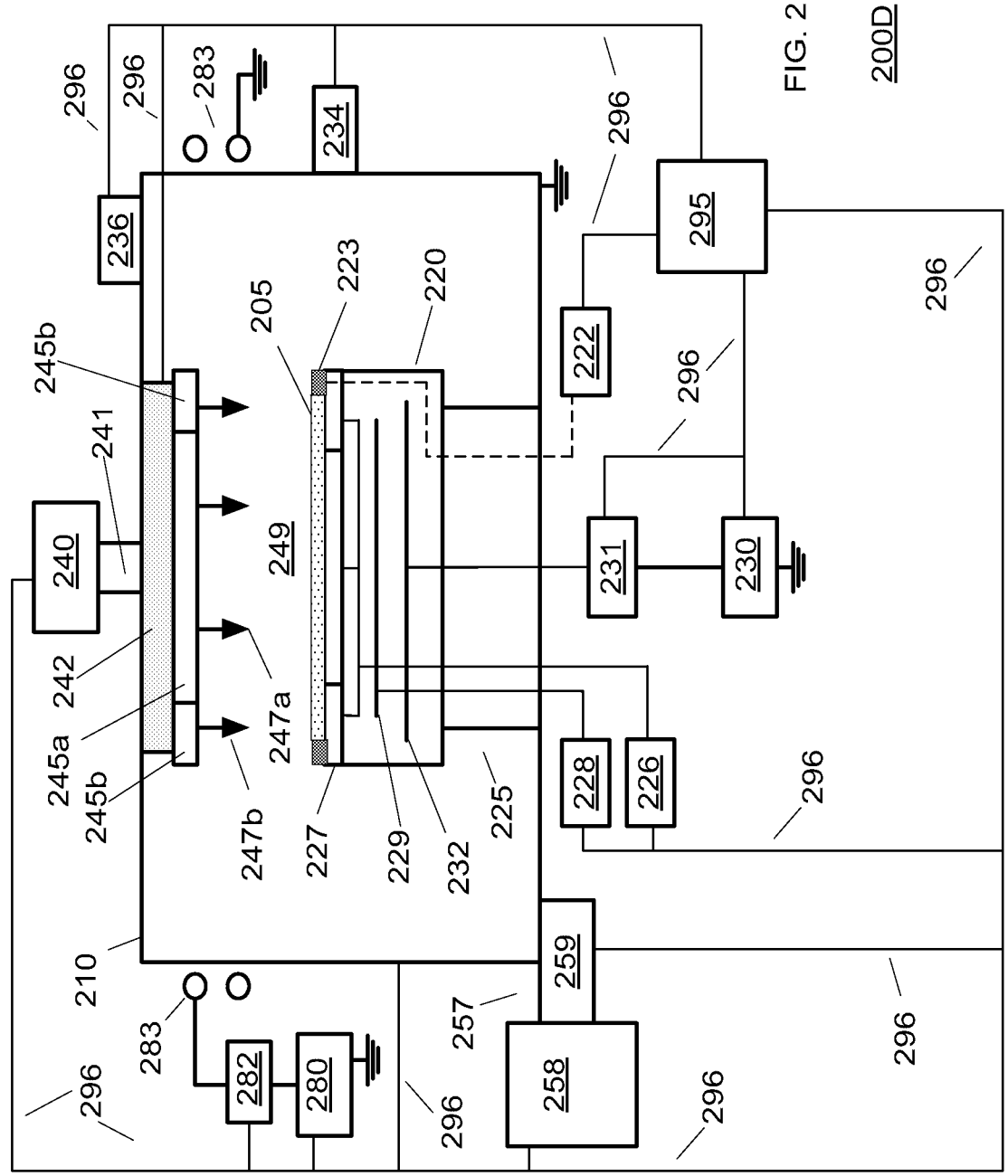

In the embodiment shown in FIG. 2D, the contact-etch subsystem 200D can be similar to the embodiments of FIGS. 2A and 2B, and can further comprise an inductive coil 283 to which RF power can be coupled via RF generator 280 through optional impedance match network 282. RF power can be inductively coupled from inductive coil 283 through a dielectric window (not shown) to processing region 249. A frequency for the application of RF power to the inductive coil 283 can range from about 10 MHz to about 100 MHz. Similarly, a frequency for the application of power to the lower electrode 232 can range from about 0.1 MHz to about 100 MHz. In addition, a slotted Faraday shield (not shown) can be employed to reduce capacitive coupling between the inductive coil 283 and the contact-etch plasma. Moreover, controller 295 can be coupled to RF generator 280 and impedance match network 282 in order to control the application of power to inductive coil 283.

In an alternate embodiment (not shown), is a "spiral" coil or "pancake" coil configuration may be used for the inductive coil. The design and implementation of an inductively coupled plasma (ICP) source, or transformer coupled plasma (TCP) source, is well known to those skilled in the art.

In the embodiment shown in FIG. 2E, the contact-etch subsystem 200E can, for example, be similar to the embodiments of FIGS. 2A, 2B, 2C, and 2D, and can further comprise a second RF generator 250 configured to couple RF power to wafer holder 220 through another optional impedance match network 251. A typical frequency for the application of RF power to wafer holder 220 can range from about 0.1 MHz to about 200 MHz for either the first RF generator 230 or the second RF generator 250 or both. The RF frequency for the second RF generator 250 can be relatively greater than the RF frequency for the first RF generator 230. Furthermore, the RF power to the wafer holder 220 from the first RF generator 230 can be amplitude modulated, the RF power to the wafer holder 220 from the second RF generator 250 can be amplitude modulated, or both RF powers can be amplitude modulated. Desirably, the RF power at the higher RF frequency is amplitude modulated. Moreover, controller 295 can be coupled to the second RF generator 250 and impedance match network 251 in order to control the application of RF power to wafer holder 220. The design and implementation of an RF system for a wafer holder is well known to those skilled in the art.

In the embodiment shown in FIG. 2F, the contact-etch subsystem 200F can be similar to the embodiments of FIGS. 2A and 2E, and can further comprise a surface wave plasma (SWP) source. The SWP source can comprise a slot antenna 287, such as a radial line slot antenna (RLSA), to which microwave power is coupled via microwave generator 285 through optional impedance match network 286.

In the embodiment shown in FIG. 2G, the contact-etch subsystem 200G can be similar to the embodiment of FIG. 2C, and can further comprise a split upper electrode (277a, 277b) to which RF power can be coupled from RF generator 275 through an impedance match network/power splitter 276. A frequency for the application of RF power to the split upper electrode (277a, 277b) can range from about 0.1 MHz to about 200 MHz. Additionally, a frequency for the application of power to the lower electrode 232 can range from about 0.1 MHz to about 100 MHz. Moreover, controller 295 can be coupled to RF generator 275 and impedance match network/power splitter 276 in order to control the application of RF power to split upper electrode (277a, 277b). The power splitter and the split upper electrode can be designed and configured to provide different RF power levels to the center and the edge of the processing region 249 to facilitate the generation and control of a contact-etch plasma in processing region 249 adjacent a surface of wafer 205. The split upper electrode (270a, 270b) and the gas plenum 242 can be coupled to each other as shown, or other configurations may be used.

FIGS. 3A-3G show additional embodiments for contact-etch (CE) subsystems in accordance with embodiments of the invention. FIGS. 3A-3G illustrate exemplary contact-etch subsystems 300A-300G that are similar to the exemplary contact-etch subsystems 200A-200G shown in FIGS. 2A-2G, but contact-etch subsystems 300A-300G include at least one DC electrode 392 and at least one DC source 390.

During patterned etching, a dry plasma etch process is often utilized, and the plasma is formed from a process gas by coupling electro-magnetic (EM) energy, such as radio frequency (RF) power, to the process gas in order to heat electrons and cause subsequent ionization and dissociation of the atomic and/or molecular composition of the process gas. In addition, negative, high voltage direct current (DC) electrical power can be coupled to the plasma processing system in order to create an energetic (ballistic) electron beam that strikes the wafer surface during a fraction of the RF cycle, i.e., the positive half-cycle of the coupled RF power. It has been observed that the ballistic electron beam can enhance the properties of the dry plasma etch process by, for example, improving the etch selectivity between the underlying thin film (to be etched) and the mask layer, reducing charging damage such as electron shading damage, etc. Additional details regarding the generation of a ballistic electron beam are disclosed in pending U.S. patent application Ser. No. 11/156,559, entitled "Plasma processing apparatus and method" and published as US patent application no. 2006/0037701 A1; the entire contents of which are herein incorporated by reference in their entirety. In general, the ballistic electron beam can be implemented within various types of plasma processing system, as shown in FIGS. 3A-3G.

Figure 3A:
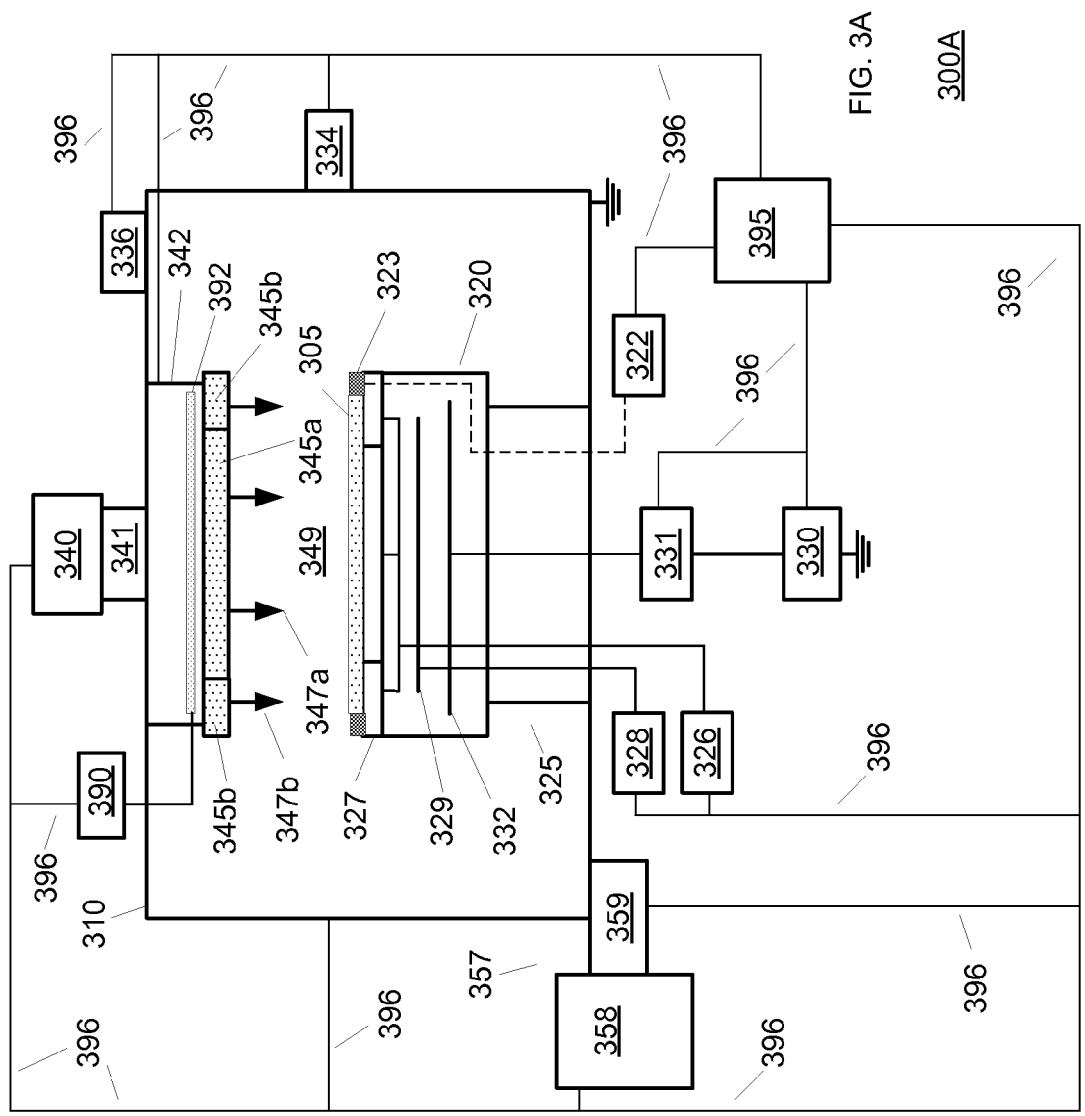

A first exemplary contact-etch subsystem 300A is shown in FIG. 3A, and the illustrated contact-etch subsystem 300A includes process chamber 310, wafer holder 320, upon which a wafer 305 to be processed is affixed, gas supply system 340, and vacuum pumping system 357. For example, wafer holder 320 can be coupled to and insulated from process chamber 310 using base 325. Wafer 305 can be, for example, a semiconductor wafer, a work piece, or a liquid crystal display (LCD). For example, process chamber 310 can be configured to facilitate the generation of CE-plasma in processing region 349 adjacent a surface of wafer 305, and the CE-plasma is formed via collisions between heated electrons and an ionizable gas. An ionizable gas or mixture of gases can be introduced from the gas supply system 340, and process pressure is adjusted using vacuum pumping system 357. Desirably, the CE-plasma can be used to create materials specific to a predetermined material process, and to aid either the deposition of material to wafer 305 or the removal of material from the exposed surfaces of wafer 305. For example, controller 395 can be used to control vacuum pumping system 357 and gas supply system 340.

Wafer 305 can be, for example, transferred into and out of process chamber 310 through a slot valve (not shown) and chamber feed-through (not shown) via robotic transfer system where it is received by wafer lift pins (not shown) housed within wafer holder 320 and mechanically translated by devices housed therein. After the wafer 305 is received from transfer system, it is lowered to an upper surface of wafer holder 320.

For example, wafer 305 can be affixed to the wafer holder 320 via an electrostatic clamping system (not shown). The wafer holder 320 can include temperature control elements 329 that can be coupled to a temperature control system 328. For example, the temperature control elements 329 can include resistive heating elements, or thermo-electric heaters/coolers. Backside gas can be delivered to the backside of the wafer via a dual (center/edge) backside gas delivery system (326 and 327) to improve the gas-gap thermal conductance between wafer 305 and wafer holder 320. A dual (center/edge) backside gas delivery system (326 and 327) can be utilized when additional temperature control of the wafer is required at elevated or reduced temperatures. For example, temperature control of the wafer 305 can be useful at temperatures in excess of the steady-state temperature achieved due to a balance of the heat flux delivered to the wafer 305 from the plasma and the heat flux removed from wafer 305 by conduction to the wafer holder 320.

As shown in FIG. 3A, wafer holder 320 includes a lower electrode 332 through which Radio Frequency (RF) power can be coupled to plasma in processing region 349. For example, lower electrode 332 can be electrically biased at an RF voltage via the transmission of RF power from RF generator 330 through impedance match network 331 to lower electrode 332. The RF bias can serve to heat electrons to form and maintain the CE-plasma. A typical frequency for the RF bias can range from 1 MHz to 100 MHz and is preferably 13.56 MHz.

Alternatively, RF power may be applied to the lower electrode 332 at multiple frequencies. Furthermore, impedance match network 331 serves to maximize the transfer of RF power to CE-plasma in process chamber 310 by minimizing the reflected power. Various match network topologies and automatic control methods can be utilized.

With continuing reference to FIG. 3A, gas supply system 340 can be coupled to gas plenum 342 using interface elements 341, and the gas plenum 342 can be coupled to gas distribution elements (345a and 345b). The gas distribution elements (345a and 345b) can provide different flow rates (347a and 347b) of process gases to one or more areas of the processing region 349. Process gas can, for example, include a mixture of gases such as Argon (Ar), Tetrafluoromethane (CE) and Oxygen ($O_2$), or Ar, $C_4F_8$ and $O_2$ for oxide etch applications, or other chemistries such as, for example, $O_2/CO/Ar/C_4F_8$, $O_2/CO/Ar/C_5F_8$, $O_2/CO/Ar/C_4F_6$, $O_2/Ar/C_4F_6$, $N_2/H_2$, and hydrogen bromide (HBr). Gas distribution elements (345a and 345b) can be configured to reduce or minimize the introduction of contaminants to wafer 305 and can include a multi-orifice gas injection showerhead. For example, process gas can be supplied from the gas supply system 340.

The vacuum pumping system 357 can include a turbo-molecular vacuum pump (TMP) 358 capable of a pumping speed up to 5000 liters per second (and greater) and a gate valve 359 for controlling the chamber pressure. In conventional plasma processing devices utilized for dry plasma etch processes, a 1000 to 3000 liter per second TMP is generally employed. TMPs are useful for low pressure processing, typically less than 50 mTorr. At higher pressures, the TMP pumping speed falls off dramatically. For high pressure processing (i.e., greater than 100 mTorr), a mechanical booster pump and dry roughing pump can be used. Furthermore, a device for monitoring chamber pressure (not shown) may be coupled to the process chamber 310. The pressure-measuring device can be, for example, a Type 628B Baratron absolute capacitance manometer commercially available from MKS Instruments, Inc. (Andover, Mass.).

As depicted in FIG. 3A, the contact-etch subsystem 300A can include one or more process sensors 336 coupled to process chamber 310 to obtain performance data, and controller 395 coupled to the process sensors 336 to receive performance data. The process sensors 336 can include both sensors that are intrinsic to the process chamber 310 and sensors extrinsic to the process chamber 310. Intrinsic sensors can include those sensors pertaining to the functionality of process chamber 310 such as the measurement of the Helium backside gas pressure, Helium backside flow, electrostatic clamping (ESC) voltage, ESC current, wafer holder temperature (or lower electrode (LEL) temperature), coolant temperature, upper electrode (UEL) temperature, forward RF power, reflected RF power, RF self-induced DC bias, RF peak-to-peak voltage, chamber wall temperature, process gas flow rates, process gas partial pressures, chamber pressure, matching network settings, a focus ring thickness, RF hours, focus ring RF hours, and any statistic thereof. In addition, extrinsic sensors can include one or more optical devices for monitoring the light emitted from the plasma in processing region 349 as shown in FIG. 3A. The optical devices can include an optical sensor that can be used as an End Point Detector (EPD) and can provide EPD data. For example, an Optical Emissions Spectroscopy (OES) sensor may be used. The process sensors 336 can include a current and/or voltage probe, a power meter, or spectrum analyzer. For example, process sensors 336 can include a RF Impedance analyzer.

In some embodiments, the contact-etch subsystem 300A can include one or more ion energy (IE) sensors 334 coupled to process chamber 310 to obtain IE-related performance data, and controller 395 coupled to the CE-sensors 334 to receive IE-related performance data. In addition, the CE subsystem 300A can include one or more ion energy (IE) sensors 323 coupled to the wafer holder 320 to obtain IE-related performance data, and an IE control unit 322 can be coupled to the CE-sensors 323 to process the IE-related performance data. For example, the measurement of an IE signal, such as a time trace of voltage or current, permits the transformation of the IE signal into frequency domain using discrete Fourier series representation (assuming a periodic signal). Thereafter, the Fourier spectrum (or for a time varying signal, the frequency spectrum) can be monitored and analyzed to characterize the state of the CE-plasma.

Controller 395 includes a microprocessor, memory, and a digital I/O port (potentially including D/A and/or A/D converters) capable of generating control voltages sufficient to communicate and activate inputs to the CE subsystems (300A-300G) as well as monitor outputs from the CE subsystems (300A-300G). As shown in FIG. 3A, controller 395 can be coupled to and exchange information with process chamber 310, IE control unit 322, backside gas delivery system 326, temperature control system 328, first RF generator 330, impedance match network 331, CE-sensors 334, process sensors 336, gas supply system 340, gas plenum 342, and vacuum pumping system 357 using one or more interfaces 396. Programs stored in the memory can be utilized to interact with the aforementioned components of the CE subsystem 300A according to a stored IE-related process recipe.

In the exemplary embodiment shown in FIG. 3B, the CE subsystem 300B can be similar to the embodiment of FIG. 3A and further comprise either a stationary, or mechanically or electrically rotating magnetic field system 355, in order to potentially increase plasma density and/or improve plasma processing uniformity, in addition to those components described with reference to FIG. 3A. Moreover, controller 395 can be coupled to magnetic field system 355 in order to regulate the speed of rotation and field strength. The design and implementation of a rotating magnetic field is known to those skilled in the art. In the embodiment shown in FIG. 3C, the CE subsystem 300C can be similar to the embodiment of FIG. 3A or FIG. 3B, and can further comprise an upper electrode 374 to which RF power can be coupled from RF generator 370 through optional impedance match network 372. A frequency for the application of RF power to the upper electrode 374 can range from about 0.1 MHz to about 200 MHz. Additionally, a frequency for the application of power to the lower electrode 332 can range from about 0.1 MHz to about 100 MHz. Moreover, controller 395 can be coupled to RF generator 370 and impedance match network 372 in order to control the application of RF power to upper electrode 374. The design and implementation of an upper electrode is well known to those skilled in the art. The upper electrode 374 and the gas plenum 342 can be coupled to each other as shown.

Figure 3D:
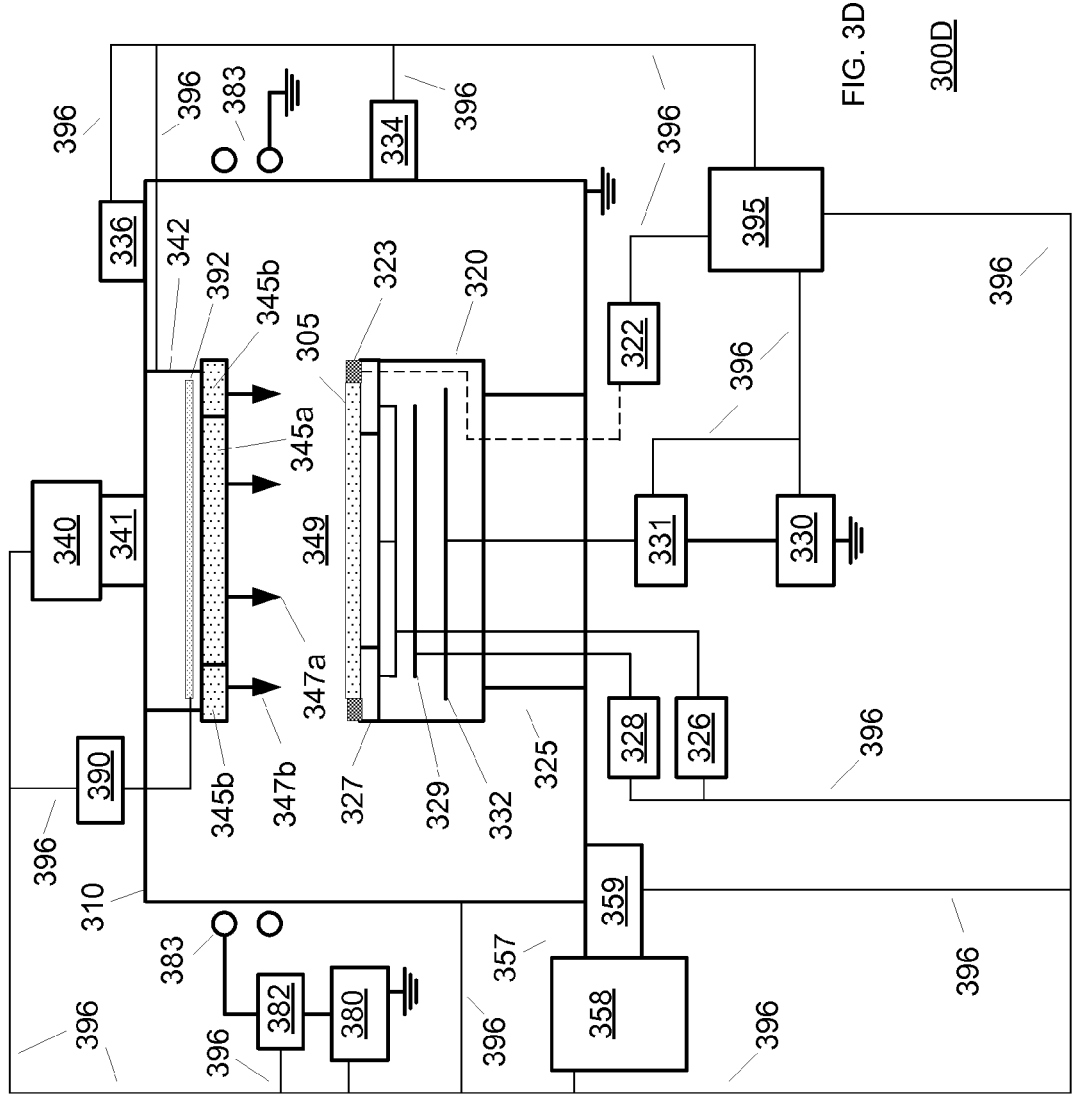

In the embodiment shown in FIG. 3D, the CE subsystem 300D can be similar to the embodiments of FIGS. 3A and 3B, and can further comprise an inductive coil 383 to which RF power can be coupled via RF generator 380 through optional impedance match network 382. RF power can be inductively coupled from inductive coil 383 through a dielectric window (not shown) to processing region 349. A frequency for the application of RF power to the inductive coil 383 can range from about 10 MHz to about 100 MHz. Similarly, a frequency for the application of power to the lower electrode 332 can range from about 0.1 MHz to about 100 MHz. In addition, a slotted Faraday shield (not shown) can be employed to reduce capacitive coupling between the inductive coil 383 and the CE-plasma. Moreover, controller 395 can be coupled to RF generator 380 and impedance match network 382 in order to control the application of power to inductive coil 383.

In an alternate embodiment (not shown), is a "spiral" coil or "pancake" coil configuration may be used for the inductive coil. The design and implementation of an inductively coupled plasma (ICP) source, or transformer coupled plasma (TCP) source, is well known to those skilled in the art.

Figure 3E:
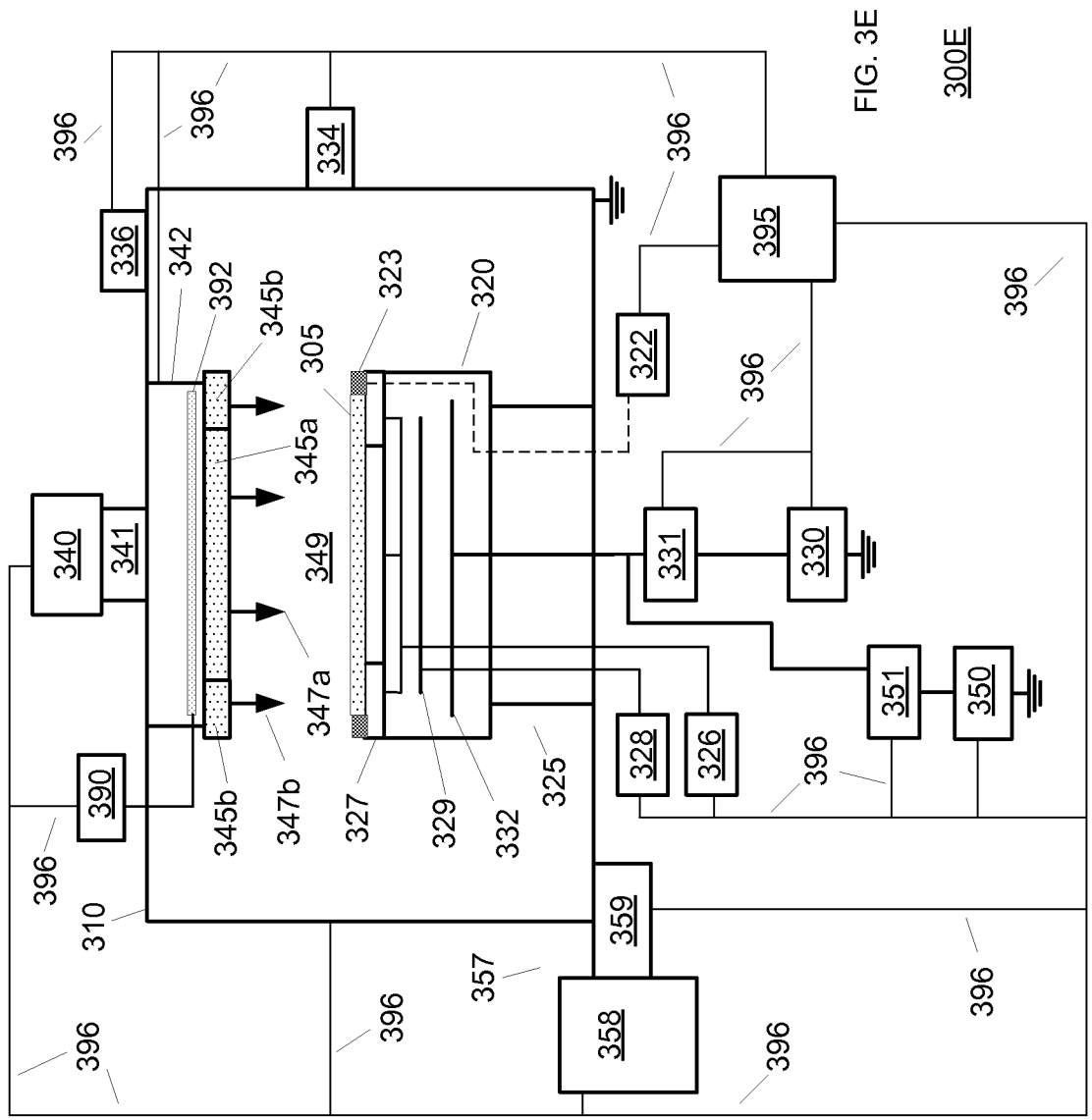

In the embodiment shown in FIG. 3E, the CE subsystem 300E can, for example, be similar to the embodiments of FIGS. 3A, 3B, 3C, and 3D, and can further comprise a second RF generator 350 configured to couple RF power to wafer holder 320 through another optional impedance match network 351. A typical frequency for the application of RF power to wafer holder 320 can range from about 0.1 MHz to about 200 MHz for either the first RF generator 330 or the second RF generator 350 or both. The RF frequency for the second RF generator 350 can be relatively greater than the RF frequency for the first RF generator 330. Furthermore, the RF power to the wafer holder 320 from the first RF generator 330 can be amplitude modulated, the RF power to the wafer holder 320 from the second RF generator 350 can be ampli-tude modulated, or both RF powers can be amplitude modulated. Desirably, the RF power at the higher RF frequency is amplitude modulated. Moreover, controller 395 can be coupled to the second RF generator 350 and impedance match network 351 in order to control the application of RF power to wafer holder 320. The design and implementation of an RF system for a wafer holder is well known to those skilled in the art.

In the embodiment shown in FIG. 3F, the CE subsystem 300F can be similar to the embodiments of FIGS. 3A and 3E, and can further comprise a surface wave plasma (SWP) source. The SWP source can comprise a slot antenna 387, such as a radial line slot antenna (RLSA), to which microwave power is coupled via microwave generator 385 through optional impedance match network 386.

In the embodiment shown in FIG. 3G, the CE subsystem 300G can be similar to the embodiment of FIG. 3C, and can further comprise a split upper electrode (377a, 377b) to which RF power can be coupled from RF generator 375 through an impedance match network/power splitter 376. A frequency for the application of RF power to the split upper electrode (377a, 377b) can range from about 0.1 MHz to about 200 MHz. Additionally, a frequency for the application of power to the lower electrode 332 can range from about 0.1 MHz to about 100 MHz. Moreover, controller 395 can be coupled to RF generator 375 and impedance match network/power splitter 376 in order to control the application of RF power to split upper electrode (377a, 377b). The power splitter and the split upper electrode can be designed and configured to provide different RF power levels to the center and the edge of the processing region 349 to facilitate the generation and control of a CE-plasma in processing region 349 adjacent a surface of wafer 305. The split upper electrode (370a, 370b) and the gas plenum 342 can be coupled to each other as shown, or other configurations may be used.

The DC electrode 392 shown in the CE subsystems (300A-300G) may comprise a silicon-containing material and/or a doped silicon-containing material. The DC source 390 can include a variable DC power supply. Additionally, the DC source 390 can include a bipolar DC power supply. The DC source 390 can further include a system configured to perform at least one of monitoring, adjusting, or controlling the polarity, current, voltage, and/or on/off state of the DC source 390. Once plasma is formed, the DC source 390 facilitates the formation of a ballistic electron beam. An electrical filter may be utilized to de-couple RF power from the DC source 390.

For example, the DC voltage applied to DC electrode 392 by DC source 390 may range from about −2000 volts (V) to about 1000 V. Desirably, the absolute value of the DC voltage has a value equal to or greater than about 100 V, and more desirably, the absolute value of the DC voltage has a value equal to or greater than about 500 V. Additionally, it is desirable that the DC voltage has a negative polarity. Furthermore, it is desirable that the DC voltage is a negative voltage having an absolute value greater than the self-bias voltage.

In alternate embodiments, a Chemical Oxide Removal (COR) subsystem (not shown) can be used to remove or trim oxidized poly-Si material. In addition, the COR subsystem may be used to remove or trim an oxide masking layer. For example, a COR subsystem can comprise a chemical treatment module (not shown) for chemically treating exposed surface layers, such as oxide surface layers, on a wafer, whereby adsorption of the process chemistry on the exposed surfaces affects chemical alteration of the surface layers. Additionally, the COR subsystem can comprise a thermal treatment module (not shown) for thermally treating the wafer, whereby the wafer temperature is elevated in order to desorb (or evaporate) the chemically altered exposed surface layers on the wafer.

Figure 4:
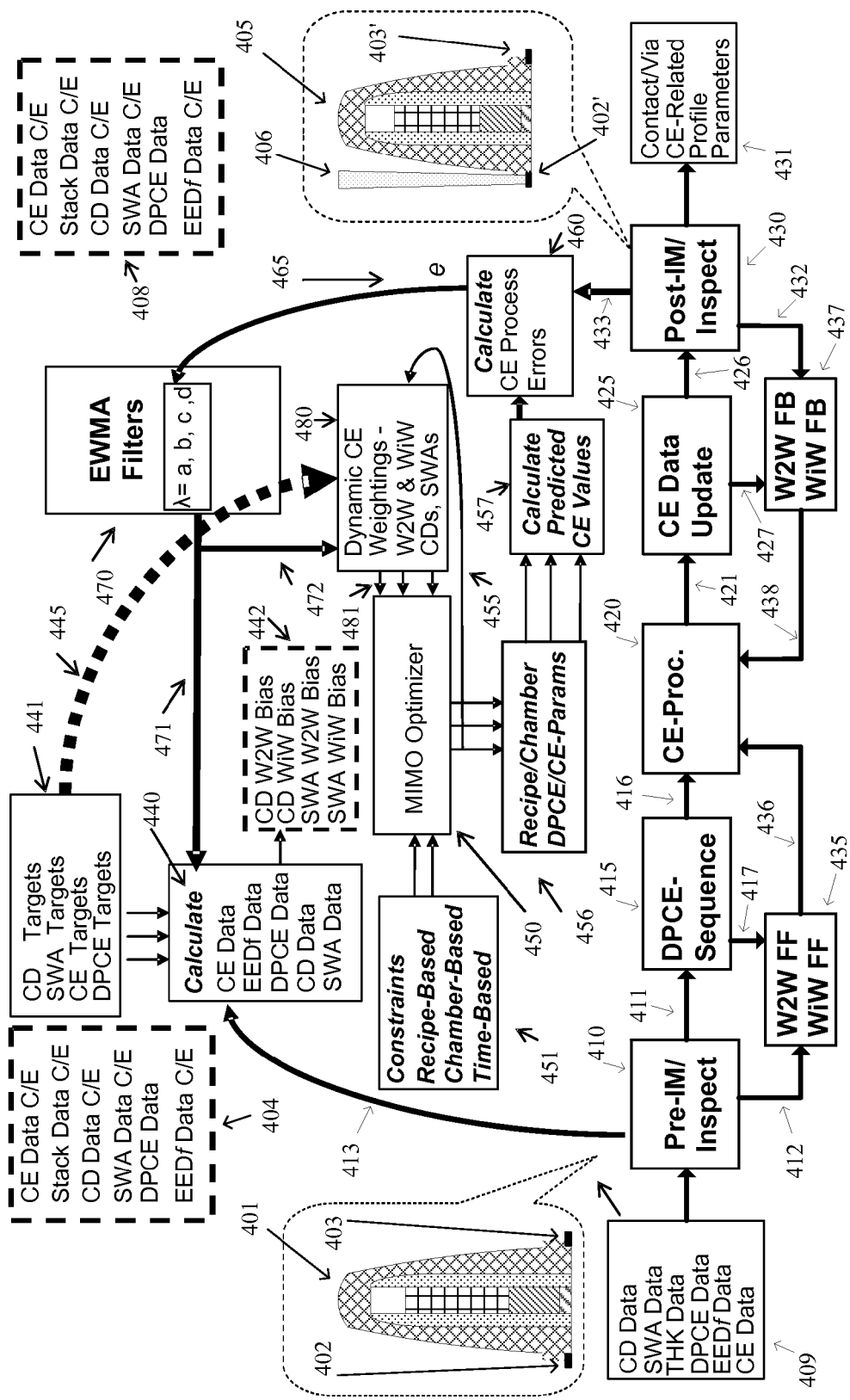
FIG. 4 shows a simplified block diagram of an exemplary contact-etch Multi-Input/Multi-Output (MIMO) model optimization and control methodology in accordance with embodiments of the invention.

FIG. 4 shows a simplified block diagram of an exemplary contact-etch (CE) Multi-Input/Multi-Output (CE-MIMO) model optimization and control methodology in accordance with embodiments of the invention. In the illustrated MIMO model methodology, exemplary images of a portion of a first patterned gate stack 401 and a post-processed gate stack 405 is shown. The first patterned gate stack 401 can include one or more first contact layer features 402 and one or more second contact layer features 403. The first patterned gate stack 401 can be characterized using a first set of CE-related parameters 404 that can include center/edge (C/E) CE data, stack data C/E, CD data C/E, SWA data C/E, IEA data C/E, and EEDf data C/E. Alternatively, a different set of CE-related parameters may be used. The post-processed gate stack 405 can include one or more previously-filled contacts/vias 406, one or more first post-processed contact layer features 402' and one or more second post-processed contact layer features 403'. The post-processed gate stack 405 can be characterized using CE-related output data 408 that can include center/edge (C/E) CE data, stack data C/E, CD data C/E, SWA data C/E, IEA data C/E, and EEDf data C/E. Alternatively, a different set of IC-related post-processing data may be used.

In the illustrated methodology, a pre-processing integrated metrology (IM) and/or inspect process/tool (Pre-IM/Inspect) model 410 can be coupled to one or more contact-etch (CE) sequence models 415. One or more of the (DPCE) sequence models 415 can be coupled to one or more contact-etch (CE) procedure models 420. One or more of the CE procedure models 420 can be coupled to one or more CE data update models 425. One or more of the CE data update models 425 can be coupled to one or more post-processing integrated metrology (IM) and/or inspect process/tool (Post-IM/Inspect) model 430.

The (Pre-IM/Inspect) model 410 can receive input data 409, can provide first output data 411 to the CE sequence model 415, and can provide first feed forward data 412 to the CE-related feed forward model 435. The DPCE sequence models 415 can receive first output data 411, can provide second output data 416 to the CE procedure model 420, and can provide second feed forward data 417 to the CE-related feed forward model 435. The CE procedure model 420 can receive the second output data 416, can receive third feed forward data 436, can receive feedback data 438, and can send CE-procedure data 421 to the CE data update models 425. The CE data update model 425 can receive CE-procedure data 421, can provide update data 426 to the (Post-IM/Inspect) model 430, and can provide first feedback data 427 to the CE-related feedback model 437. The (Post-IM/Inspect) model 430 can receive the update data 426, can provide third output data 431, and can provide second feedback data 432 to the CE-related feedback model 437. The CE-related feed forward model 435 can receive first feed forward data 412, can receive second feed forward data 417, and can provide the third feed forward data 436, and the CE-related feedback model 437 can receive first feedback data 427, can receive second feedback data 432, and can provide the third feedback data 438.

In some examples, the input data 409 can include CD data, SWA data, thickness data, CE data, EEDf data, DPCE data, contact data or transistor stack data, or any combination thereof, and the first output data 411 and the first feed forward data 412 can include CD data, SWA data, ODP data, inspection data, thickness data, CE data, EEDf data, DPCE data, or etched contact data, or any combination thereof. The second output data 416 and the second feed forward data 417 can include recipe data, CD data, SWA data, ODP data, inspection data, thickness data, CE data, EEDf data, or gate data, or any combination thereof, and the CE-procedure data 421 can include result data, CD data, SWA data, ODP data, inspection data, thickness data, CE data, EEDf data, or gate data, or any combination thereof. The update data 426 and the first feedback data 427 can include recipe data, CE data, EEDf data, ODP data, inspection data, thickness data, DPCE data, EEDf data, or contact data, or any combination thereof, and the third output data 431 and the second feedback data 432 can include result data, CD data, SWA data, ODP data, inspection data, thickness data, CE data, EEDf data, or contact data, or any combination thereof. The third feed forward data 436 can include wafer-to-wafer feed-forward data (W2W FF) and within-wafer feed-forward data (WiW FF), and the third feedback data 438 can include wafer-to-wafer feedback data (W2W FB) and within-wafer feedback data (WiW FB). In addition, one or more of the models (410, 415, 420, 425, and 430) can be used to control the post-processed gate stack 405 and/or the etched contacts 406 on a wafer-to-wafer (W2W) basis and/or to control the post-processed gate stack 405 and/or the etched contacts 406 on a Within-Wafer (WiW) basis.

Data items 413 can be sent to a first calculation element 440 that can be used to calculate some of the CE data, the EEDf data, the DPCE data, the CD data, the SWA data, and/or other gate stack data at the center of the wafer and at the edge of the wafer. For example, the first calculation element 440 can be used to calculate the CE-related bias at the center of the wafer and at the edge of the wafer. A first set of target parameters 441 can be provided to the first calculation element 440, and a first set of filter outputs 471 can be provided to the first calculation element 440. Output data items 442 from the first calculation element 440 can be provided to one or more MIMO model Optimizers 450.

One or more of the MIMO model Optimizers 450 can be provided with one or more CE-related constraint parameters 451 that can include tool limits, recipe limits, and/or time limits that are CE-related. For example, the CE-related constraint parameters 451 can include step-based wafer temperature limits or process gas limits during a contact-etch procedure. One or more of the MIMO model Optimizers 450 can determine one or more sets of recipe/chamber parameters 456 that can be sent to one or more of the tool controller/models (410, 415, 420, 425, and 430).

One or more of the tool controller/models (410, 415, 420, 425, and 430) can be used to calculate predicted CE values 457 that can include one or more predicted etch biases, one or more predicted SWA biases, one or more predicted step times for one or more CE recipes, and one or more predicted process gas flows for one or more CE-recipes.

One or more of the (Post-IM/Inspect) model 430 can provide one or more actual outputs 433 to one or more comparison elements 460, and one or more of the actual outputs 433 can be compared to one of more of the predicted CE values 457. One or more of the error values 465 from one or more of the comparison elements 460 can be provided to one or more of the EWMA filters 470.

One or more of the EWMA filters 470 can provide one or more first filtered outputs 471 to the first calculation element 440, and one or more of the EWMA filters 470 can provide one or more second filtered outputs 472 to one or more of the weighting controller/models 480. Each of the EWMA filters 470 can filter and provide feedback data for a single parameter or error value. Alternatively, each of the EWMA filters 470 can filter and provide feedback data for multiple parameters or error values. One or more of the weighting controller/models 480 can receive one or more target data items 445 and one or more feedback data items 455 from one or more of the MIMO model Optimizers 450. In addition, one or more of the weighting controller/models 480 can provide one or more dynamically varying weighting inputs 481 to one or more of the MIMO model Optimizers 450. The concept of using dynamic weightings based on the feedback error is to force the optimizer to prioritize the weightings (rebalance) with a goal of better control of the most important CVs—automation of a manual tuning of a control system in runtime.

In some embodiments, the manipulated variables and/or the disturbance variables used for control can include a calculated value that can be dynamically modeled and updated during the runtime processing by the following method: 1) the modeling procedure can start with a basic model relationship that "pairs" CE-sensor data to a controlled variable (CV). For example, the amount of atomic O or F can be calculated by using process gas data from the CE-sensor or a process sensor, and the amount of atomic O or F that is consumed can be used to predict a CD or a SWA. This could be a feedback update loop, or a real-time adjustment during an etch step. 2) After a wet clean is performed, the first patterned gate stacks processed during conditioning or production would be used to calculate and update this trace gas model. 3) The Relative Gain Array (RGA) method can be used at run-time with production patterned wafers to evaluate when to use the CE-sensor data vs. CV feedback in place of just calculating a value. The RGA matrix for the given CV value would be re-evaluated to determine if the value of the sensor based MV is stronger than the litho incoming CV for use as a real-time CV value. 4) In addition, center to edge sensor detection using OES signal—The rate of change can also be used as an example commonly understood to adjust the over etch recipe settings to improve the uniformity (correct for the non-uniformity of the previous steps etch, by adjusting the over-etch steps center to edge knobs, such as $O_2$ flow, temp, top power, pressure. IM CV would be the film thickness of incoming wafers to separate incoming—say BARC thickness from etch rate of the current chamber center to edge.

In some embodiments, the control variables associated with various patterned wafers created by the contact-etch procedures can be center CD and SWA values, middle CD and SWA values, edge CD and SWA values, and extreme edge CD and SWA values, and this can require a total of eight IM measurements at four or more sites on the wafer. The pre- and post-IM measurements can be performed using dynamic sampling.

In other embodiments, the manipulated variables can include back-side gas flows to one or more zones in the wafer holder, and the back-side gas flows can be dynamically controlled during processing to provide dynamic backside gas temperature control for improved within-wafer process uniformity by adjusting wafer areas that are non-radial in nature based on incoming CV requirements.

In still other embodiments, the manipulated variables can include flow rates for edge gas injection flow rates. This approach could also be used to reduce the starvation problem at the wafer edge, and make the edge starvation a controllable variable based on the incoming signature and chamber state.

In some CE-MIMO models, the interaction terms can be updated between lots during an offline triggered calculation update procedure. For example, the cross term calculation update can be triggered by checking the sensitivity of the current system to changes in the cross terms, and by running a set of pre-defined delta offsets to see if adjusting the cross terms would have improved the average control. RGA can be used in this calculation, and the trigger events can be used to perform adaptive feedback updates for the CE-MIMO model. For example, adaptive feedback can be used when copying the CE-MIMO model from chamber to chamber and allowing the CE-MIMO model to adapt to the new chamber behavior. Another use arises when a new product is released and the old product equation can be used to start the model, then after so many wafers the model update is triggered and a new model is adjusted, and the resulting model can them be used and monitored for performance.

Figure 5:
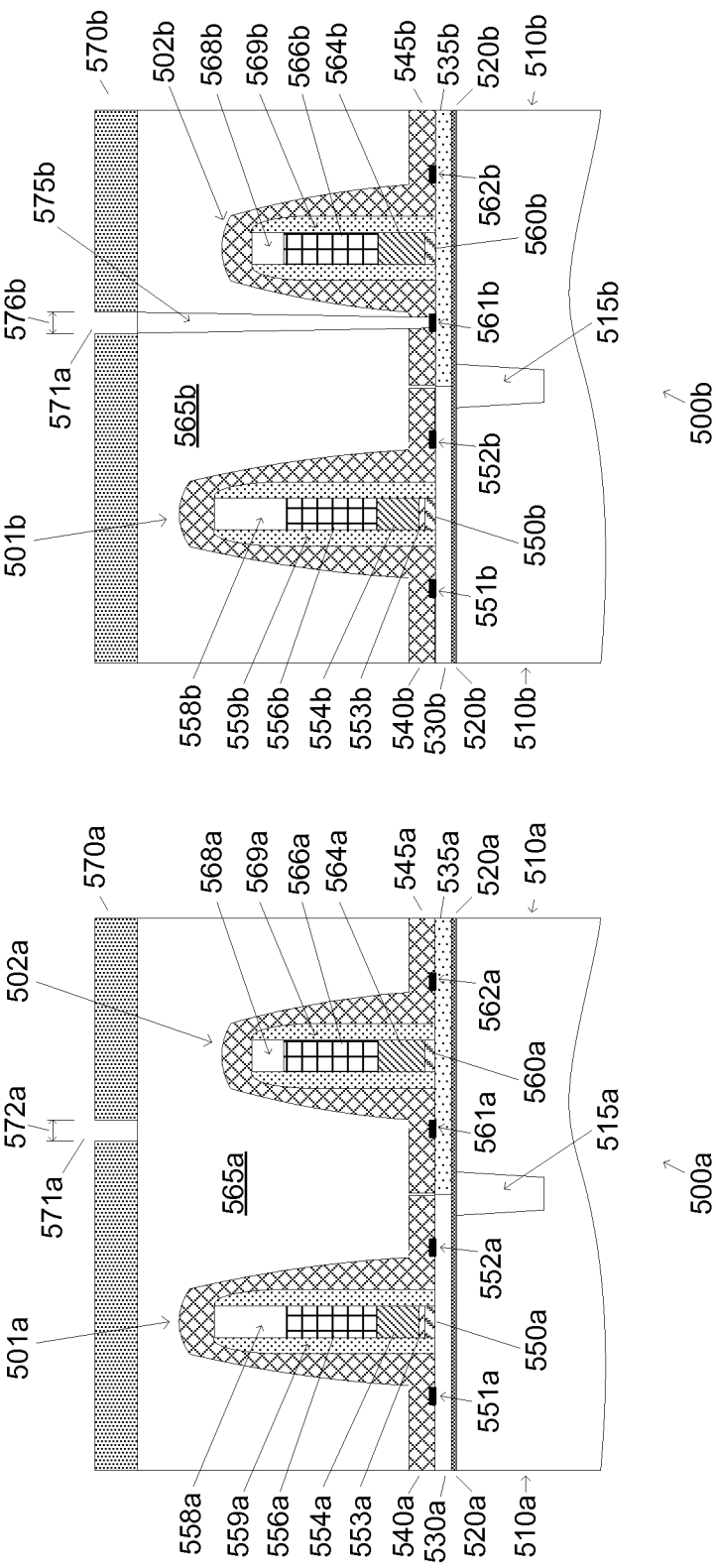
FIGS. 5 and 5' illustrate exemplary views of a first Double-Pattern-Contact-Etch (DPCE) processing sequence for creating first double pattern (DP) features in accordance with embodiments of the invention.

FIGS. 5 and 5' illustrate exemplary views of a first Double-Pattern-Contact-Etch (DPCE) processing sequence for creating first double pattern (DP) features in accordance with embodiments of the invention. For example, one or more first Litho-Etch-Litho-Etch (LELE) processing sequences can be performed. In FIG. 5, two exemplary patterned wafers (500a and 500b) are shown having exemplary transistor stacks (501a, 502a, 501b, and 502b) thereon that can be created using a first DPCE processing sequence, but this is not required for the invention. In FIG. 5', two other exemplary patterned wafers (500c and 500d) are shown having exemplary transistor stacks (501c, 502c, 501d, and 502d) thereon that can be created using a second DPCE processing sequence, but this is not required for the invention. Alternatively, a different number of patterned wafers with different transistor configurations may be used.

FIG. 5 illustrates a first patterned wafer 500a comprising a first transistor stack 501a and a second transistor stack 502a, where the first transistor stack 501a can include a nFET device, and the second transistor stack 502a can include a pFET device. Alternatively, other devices may be illustrated.

The first patterned wafer 500a can include a first substrate layer 510a, a first isolation layer 520a, a first under-layer 530a, and a second under-layer 535a. For example, the first substrate layer 510a can include a semiconductor material; the first isolation layer 520a can include dielectric or metallic material; and the under-layers (530a and 535a) can include TiN. The first substrate layer 510a can include a first shallow trench isolation (STI) region 515a, and the first STI region 515a can include silicon oxide ($SiO_2$), silicon nitride (SiN), or silicon oxynitride (SiON).

The first transistor stack 501a can be covered/protected by a first hard mask layer 540a, and second transistor stack 502a can be covered by a second hard mask layer 545a. For example, first hard mask layer 540a and the second hard mask layer 545a can include $SiO_2$ and/or SiN. An inter-layer dielectric (ILD) layer 565a is shown covering the first hard mask layer 540a and the second hard mask layer 545a, and the ILD layer 565a can include a low-k dielectric material. A first etch mask layer 570a can be configured on top of the ILD layer 565a, and the first etch mask layer 570a can include a plurality of first etch mask features 571a, and the first etch mask features 571a can have widths 572a that can vary from about 10 nm to about 100 nm. For example, one or more first litho-related sequences can be performed to create the first etch mask features 571a in the first etch mask layer 570a. In addition, the first etch mask layer 570a can include at least one radiation-sensitive material, at least one ARC material, and/or at least one resist material.

The first transistor stack 501a can include a first gate dielectric layer 550a, a first contact metal layer 551a, a second contact metal layer 552a, first capping layer 553a, a first metal gate layer 554a, a first dummy gate layer 556a, and a first gate hard mask layer 558a. The first gate dielectric layer 550a can include high-k dielectric material, such as hafnium oxide ($HfO_2$). The first contact metal layer 551a and/or the second contact metal layer 552a can include cobalt silicide, nickel silicide, tantalum silicide, titanium silicide, or tungsten silicide, or any combination thereof. The first capping layer 553a can include a work function tuning material. The first metal gate layer 554a can be a very thin layer (10 angstrom to 400 angstrom) and can include $MoSi_2$, $NiSi_2$, $TaSi_2$, TiN, TaN, WN, or $ZrSi_2$. The first dummy gate layer 556a can include Poly-Si material.

The second transistor stack 502a can include a second gate dielectric layer 560a, a first contact metal layer 561a, a second contact metal layer 562a, a second metal gate layer 564a, a second dummy gate layer 566a, a second gate hard mask layer 568a, and second spacers 569a. The second gate dielectric layer 560a can include high-k dielectric material, such as hafnium oxide ($HfO_2$). The first contact metal layer 561a and/or the second contact metal layer 562a can include cobalt silicide, nickel silicide, tantalum silicide, titanium silicide, or tungsten silicide, or any combination thereof. The second metal gate layer 564a can be a very thin layer (10 angstrom to 400 angstrom) and can include $MoSi_2$, $NiSi_2$, $TaSi_2$, TiN, TaN, WN, or $ZrSi_2$. The second dummy gate layer 566a can include Poly-Si material.

In FIG. 5, a first input data model 580 is illustrated, and a first set of input data can be obtained when the first input data model 580 is executed. The first input data can include real-time and/or historical CE-related data for the first patterned wafer 500a. In some examples, the first input data can include CD data, SWA data, thickness data, IE data, EEDf data, ODP data, inspection data, thickness data, IE data, EEDf data, or gate data, or any combination thereof.

A first select contact-etch CE-MIMO model 581 is illustrated, and a first contact-etch procedure can be selected using the first select CE-MIMO model 581, and the first select CE-MIMO model 581 can exchange Measured Variable (MV) data using transfer means 590, can exchange Disturbance Variable (DV) data using transfer means 591, and can exchange Controlled Variable (CV) data using transfer means 592. For example, the first select CE-MIMO model 581 can create and/or use first contact-etch related data associated with the first patterned wafer 500a, and the first contact-etch related data can be fed forward and/or fed back using transfer means (590, 591, and/or 592).

When the first select CE-MIMO model 581 is executed, a first contact-etch procedure can be selected using controller (295 shown in FIGS. 2A-2G) and/or controller (395 shown in FIGS. 3A-3G). In some examples, the controllers (295 and/or 395) can use first contact-etch related library data for the first patterned wafer 500a and/or the second patterned wafer 500b. The first contact-etch related library data for the first patterned wafer 500a can include historical contact-etch procedure data collected using one or more CE-sensors (223 and/or 234 shown in FIGS. 2A-2G) and/or CE-sensors (323 and/or 334 shown in FIGS. 3A-3G), when the first transistor stacks 501a were being created on the first patterned wafer 500a. The first CE-related library data for the second patterned wafer 500b can include second historical contact-etch procedure data collected using one or more CE-sensors (223 and/or 234 shown in FIGS. 2A-2G) and/or CE-sensors (323 and/or 334 shown in FIGS. 3A-3G), when the second patterned wafers 500b were previously created.

In FIG. 5, a first CE-MIMO model 582 is illustrated, and when the first CE-MIMO model 582 is executed, the selected first contact-etch procedure can be performed using one or more of the etch subsystems described herein in FIGS. 2A-2G and FIGS. 3A-3G. When contact-etch procedures are performed, one or more sets of process parameters can be determined, updated, and/or verified. For example, the first CE-MIMO model 582 can create and exchange first contact-etch MV data using transfer means 590, can create and exchange first contact-etch DV data using transfer means 591, and can create and exchange first contact-etch CV data using transfer means 592 with the other MIMO models (580, 581, and 583). In addition, the first CE-MIMO model 582 can include first MV process data, first DV process data, and first CV process data associated with the first contact-etch procedure, with the first patterned wafer 500a, and/or with the second patterned wafer 500b.

In some examples, the first patterned wafer 500a can be etched using the first contact-etch procedure to create a second patterned wafer 500b. Alternatively, other patterned wafers may be created.

With continuing reference to FIG. 5, a second patterned wafer 500b comprising a first transistor stack 501b and a second transistor stack 502b is shown, the first transistor stack 501b can include a nFET device, and the second transistor stack 502b can include a pFET device. Alternatively, other devices may be illustrated.

The second patterned wafer 500b can include a first substrate layer 510b, a first isolation layer 520b, a first under-layer 530b, and a second under-layer 535b. For example, the first substrate layer 510b can include a semiconductor material; the first isolation layer 520b can include dielectric or metallic material; and the under-layers (530b and 535b) can include TiN. The first substrate layer 510b can include a first STI region 515b, and the first STI region 515b can include $SiO_2$, SiN, and/or SiON.

The first transistor stack 501b can be covered/protected by a first hard mask layer 540b, and second transistor stack 502b can be covered by a second hard mask layer 545b. For example, first hard mask layer 540b and the second hard mask layer 545b can include $SiO_2$ and/or SiN. An inter-layer dielectric (ILD) layer 565b is shown covering the first hard mask layer 540b and the second hard mask layer 545b, and the ILD layer 565b can include a low-k dielectric material.

A first contact-etch masking layer 570b can be configured on top of the ILD layer 565b, and the first contact-etch masking layer 570b can include a plurality of previously-created first etch mask features 571a, and one or more first litho procedures in a DPCE processing sequence can have been performed to create first etch mask features 571a in the first contact-etch masking layer 570b. For example, a first contact-etch procedure in the DPCE processing sequence can use the first etch mask features 571a to create the first contact-etch vias 575b, and the first etch mask features 575b can have widths 576b that can vary from about 10 nm to about 100 nm. In addition, the first contact-etch masking layer 570b can include at least one radiation-sensitive material, at least one ARC material, and/or at least one resist material.

The first transistor stack 501b can include a first gate dielectric layer 550b, a first contact metal layer 551b, a second contact metal layer 552b, first capping layer 553b, a first metal gate layer 554b, a first dummy gate layer 556b, a first gate hard mask layer 558b, and first spacers 559b. The first gate dielectric layer 550b can include high-k dielectric material, such as hafnium oxide ($Hf_{O2}$). The first contact metal layer 551b and/or the second contact metal layer 552b can include cobalt silicide, nickel silicide, tantalum silicide, titanium silicide, or tungsten silicide, or any combination thereof. The first capping layer 553b can include a work function tuning material. The first metal gate layer 554b can be a very thin layer (10 angstrom to 400 angstrom) and can include $MoS_{i2}$, $NiS_{i2}$, $TaS_{i2}$, TiN, TaN, WN, or $ZrS_{i2}$. The first dummy gate layer 556b can include Poly-Si material.

The second transistor stack 502b can include a second gate dielectric layer 560b, a first contact metal layer 561b, a second contact metal layer 562b, a second metal gate layer 564b, a second dummy gate layer 566b, a second gate hard mask layer 568b and second spacers 569b. The second gate dielectric layer 560b can include high-k dielectric material, such as hafnium oxide (HfO$_2$). The first contact metal layer 561b and/or the second contact metal layer 562b can include cobalt silicide, nickel silicide, tantalum silicide, titanium silicide, or tungsten silicide, or any combination thereof. The second metal gate layer 564b can be a very thin layer (10 angstrom to 400 angstrom) and can include MoSi$_2$, NiSi$_2$, TaSi2, TiN, TaN, WN, or ZrSi$_2$. The second dummy gate layer 566b can include Poly-Si material.

In some embodiments, when the first contact-etch procedure is performed a first patterned wafer 500a can be positioned on a wafer holder (220 shown in FIGS. 2A-2G) and/or wafer holder (320 shown in FIGS. 3A-3G) and a first contact-etch plasma can be created in the process chamber (210 shown in FIGS. 2A-2G) and/or process chamber (310 shown in FIGS. 3A-3G) and a first IEO-etch procedure can be performed.

During the first contact-etch procedure, first CE-sensor data can be collected using one or more CE-sensors (223 and/or 234 shown in FIGS. 2A-2G) and/or CE-sensors (323 and/or 334 shown in FIGS. 3A-3G), and controller (295 shown in FIGS. 2A-2G) and/or controller (395 shown in FIGS. 3A-3G) can compare the first CE-sensor data to historical CE-sensor data; and can store the first CE-sensor data. For example, the first process data can be collected using the process sensors (236 shown in FIGS. 2A-2G) and/or process sensors (336 shown in FIGS. 3A-3G) during the first contact-etch procedure.

When a first DPCE processing sequence includes additional CE-related procedures, the additional CE-related procedures can be performed using one or more of the subsystems (110, 120, 130, 140, 150, 160, and 170) shown in FIG. 1.

In some embodiments, the first DPCE processing sequence can include a first contact-etch procedure for a first hard mask (Si-ARC) layer, second contact-etch procedure for an IDL layer, and third contact-etch procedure for a second hard mask TEOS layer. In some examples, the first DPCE processing sequence can also include ashing procedures, cleaning procedures, and/or CMP procedures. In other examples, the first DPCE processing sequence can include (Ion Energy) IE-optimized etch procedures, IE-related metrology procedures, IE-sensor wafer measurement procedures, and/or IE-related inspection procedures.

Still referring to FIG. 5, a first output data model 583 is illustrated, and a first set of output data can be analyzed when the first output data model 583 is executed. The first output data can include real-time and/or historical CE-related data. For example, the first output data model 583 can create and exchange output MV data using transfer means 590, can create and exchange output DV data using transfer means 591, and can create and exchange output CV data using transfer means 592 with the other MIMO models (580, 581, and 582). In addition, the first output data model 583 can analyze process data and/or CE-sensor data associated with the contact-etch procedures, and the analyzed process data and/or the analyzed CE-sensor data can be fed forward and/or fed back using transfer means (590, 591, and/or 592).

When the first output data model 583 is executed, update and/or verification procedures can be performed for the first contact-etch procedure and first DPCE processing sequence. For example, update procedures can be performed to update and/or verify the first process parameters, CE-sensor data, process data, and/or CE-related library data. The first output data model 583 can exchange updated and/or verified CE-MV data using transfer means 590, can exchange updated and/or verified CE-DV data using transfer means 591, and can exchange updated and/or verified CE-CV data using transfer means 592 with the other CE-MIMO models (580, 581, and 582). During process development, DOE techniques can be used to examine the preliminary set of models (580-583) and to develop a reduced set of CE-MIMO models.

FIG. 5' illustrates a third patterned wafer 500c comprising a first transistor stack 501c and a second transistor stack 502c, where the first transistor stack 501c can include a nFET device, and the second transistor stack 502c can include a pFET device. Alternatively, other devices may be illustrated. In addition, a previously-filled contact/via 575b' is shown that can include one or more metallic and/or filler materials.

The first patterned wafer 500c can include a first substrate layer 510c, a first isolation layer 520c, a first under-layer 530c, and a second under-layer 535c. For example, the first substrate layer 510c can include a semiconductor material; the first isolation layer 520c can include dielectric or metallic material; and the under-layers (530c and 535c) can include TiN. The first substrate layer 510c can include a first shallow trench isolation (STI) region 515c, and the first STI region 515c can include SiO$_2$, SiN, and/or SiON.

The first transistor stack 501c can be covered/protected by a first hard mask layer 540c, and second transistor stack 502c can be covered by a second hard mask layer 545c. For example, first hard mask layer 540c and the second hard mask layer 545c can include SiO$_2$ and/or SiN. An inter-layer dielectric (ILD) layer 565c is shown covering the first hard mask layer 540c and the second hard mask layer 545c, and the ILD layer 565c can include a low-k dielectric material.

A second etch mask layer 570c can be configured on top of the ILD layer 565c, and a plurality of second etch mask features 571c can be configured in the second etch mask layer 570c, and the second etch mask features 571c can have widths 572c that can vary from about 10 nm to about 100 nm. For example, one or more second litho-related sequences in the first DPCE processing sequence can be performed to create the second etch mask features 571c in the second etch mask layer 570c. In addition, the second etch mask layer 570c can include at least one radiation-sensitive material, at least one ARC material, and/or at least one resist material.

The first transistor stack 501c can include a first gate dielectric layer 550c, a first contact metal layer 551c, a second contact metal layer 552c, first capping layer 553c, a first metal gate layer 554c, a first dummy gate layer 556c, a first gate hard mask layer 558c, and first spacers 559c. The first gate dielectric layer 550c can include high-k dielectric material, such as hafnium oxide (HfO$_2$). The first contact metal layer 551c and/or the second contact metal layer 552c can include cobalt silicide, nickel silicide, tantalum silicide, titanium silicide, or tungsten silicide, or any combination thereof. The first capping layer 553c can include a work function tuning material. The first metal gate layer 554c can be a very thin layer (10 angstrom to 400 angstrom) and can include MoSi$_2$, NiSi$_2$, TaSi2, TiN, TaN, WN, or ZrSi$_2$. The first dummy gate layer 556c can include Poly-Si material.

The second transistor stack 502c can include a second gate dielectric layer 560c, a first contact metal layer 561c, a second contact metal layer 562c, a second metal gate layer 564c, a second dummy gate layer 566c, a second gate hard mask layer 568c, and second spacers 569c. The second gate dielectric layer 560c can include high-k dielectric material, such as hafnium oxide (HfO$_2$). The first contact metal layer 561c and/or the second contact metal layer 562c can include cobalt silicide, nickel silicide, tantalum silicide, titanium silicide, or tungsten silicide, or any combination thereof. The second metal gate layer 564c can be a very thin layer (10 angstrom to 400 angstrom) and can include $MoSi_2$, $NiSi_2$, $TaSi2$, TiN, TaN, WN, or $ZrSi_2$. The second dummy gate layer 566c can include Poly-Si material.

In FIG. 5', a second input data model 580' is illustrated, and a second set of input data can be obtained when the second input data model 580' is executed. The second input data can include real-time and/or historical contact-etch related data for one or more of the patterned wafers (500a, 500b, and 500c). A second select CE-MIMO model 581' is illustrated, and a second contact-etch (CE) procedure can be selected using the second select CE-MIMO model 581', and the second select CE-MIMO model 581' can exchange second MV' data using transfer means 590, can exchange second DV' data using transfer means 591, and can exchange second CV' data using transfer means 592. For example, the second select CE-MIMO model 581' can create, update, and/or use the contact-etch related data associated with one or more of the patterned wafers (500a, 500b, and 500c), and the CE-related data can be fed forward and/or fed back using transfer means (590, 591, and/or 592).

When the second select CE-MIMO model 581' is executed, a second contact-etch procedure can be selected using controller (295 shown in FIGS. 2A-2G) and/or controller (395 shown in FIGS. 3A-3G). In some examples, the controllers (295 and/or 395) can use CE-related library data for one or more of the patterned wafers (500a, 500b, 500c, and 500d). The CE-related library data can include historical contact-etch procedure data and/or DPCE data collected using one or more CE-sensors (223 and/or 234 shown in FIGS. 2A-2G) and/or CE-sensors (323 and/or 334 shown in FIGS. 3A-3G), when one or more of the patterned wafers (500a, 500b, 500c, and 500d) were being previously created.

In FIG. 5', a second CE-MIMO model 582' is illustrated, and when the second CE-MIMO model 582' is executed, the selected second contact-etch procedure can be performed using one or more of the etch subsystems described herein in FIGS. 2A-2G and FIGS. 3A-3G. When second contact-etch procedures are performed, one or more sets of process parameters can be determined, updated, and/or verified. For example, the second CE-MIMO model 582' can create and exchange second contact-etch MV' data using transfer means 590, can create and exchange second contact-etch DV' data using transfer means 591, and can create and exchange second contact-etch CV' data using transfer means 592 with the other MIMO models (580', 581', and 583'). In addition, the second CE-MIMO model 582' can include second MV' process data, second DV' process data, and second CV' process data associated with the second contact-etch procedure.

In some examples, the third patterned wafer 500c can be etched using the second contact-etch procedure to create a fourth patterned wafer 500d. Alternatively, other patterned wafers may be created.

With continuing reference to FIG. 5', a fourth patterned wafer 500d comprising a first transistor stack 501d and a second transistor stack 502d is shown. The first transistor stack 501d can include a nFET device, and the second transistor stack 502d can include a pFET device. Alternatively, other devices may be illustrated. In addition, a previously-filled contact/via 575b' is shown that can include one or more metallic or filler materials. The previously-filled contact/via 575b' can have been created using the selected first contact-etch procedure, one or more deposition procedures and one or more CMP procedures.

The fourth patterned wafer 500d can include a first substrate layer 510d, a first isolation layer 520d, a first under-layer 530d, and a second under-layer 535d. For example, the first substrate layer 510d can include a semiconductor material; the isolation layers (530d and 535d) can include dielectric or metallic material; and the first under-layer 530d can include TiN. The first substrate layer 510d can include a first STI region 515d, and the first STI region 515d can include $SiO_2$, SiN, and/or SiON.

The first transistor stack 501d can be covered/protected by a first hard mask layer 540d, and second transistor stack 502d can be covered by a second hard mask layer 545d. For example, first hard mask layer 540d and the second hard mask layer 545d can include $SiO_2$ and/or SiN. An inter-layer dielectric (ILD) layer 565d is shown covering the first hard mask layer 540d and the second hard mask layer 545d, and the ILD layer 565d can include a low-k dielectric material.

A second contact-etch masking layer 570d can be configured on top of the ILD layer 565d, and the second contact-etch masking layer 570d can include a plurality of second etch mask features 571c. For example, one or more second litho-related procedures in a first DPCE processing sequence can have been performed to create second etch mask features 571c in the second contact-etch masking layer 570d. A second contact-etch procedure in the DPCE processing sequence can use the second etch mask features 571c to create the second contact-etch vias 575d, and the second contact-etch vias 575d can have widths 576d that can vary from about 10 nm to about 100 nm. In addition, the second contact-etch masking layer 570d can include at least one radiation-sensitive material, at least one ARC material, and/or at least one resist material.

The first transistor stack 501d can include a first gate dielectric layer 550d, a first contact metal layer 551d, a second contact metal layer 552d, first capping layer 553d, a first metal gate layer 554d, a first dummy gate layer 556d, and a first gate hard mask layer 558d. The first gate dielectric layer 550d can include high-k dielectric material, such as hafnium oxide ($HfO_2$). The first contact metal layer 551d and/or the second contact metal layer 552d can include cobalt silicide, nickel silicide, tantalum silicide, titanium silicide, or tungsten silicide, or any combination thereof. The first capping layer 553d can include a work function tuning material. The first metal gate layer 554d can be a very thin layer (10 angstrom to 400 angstrom) and can include $MoSi_2$, $NiSi_2$, $TaSi_2$, TiN, TaN, WN, or $ZrSi_2$. The first dummy gate layer 556d can include Poly-Si material.

The second transistor stack 502d can include a second gate dielectric layer 560d, a first contact metal layer 561d, a second contact metal layer 562d, a second metal gate layer 564d, a second dummy gate layer 566d, and a second gate hard mask layer 568d. The second gate dielectric layer 560d can include high-k dielectric material, such as hafnium oxide ($HfO_2$). The first contact metal layer 561d and/or the second contact metal layer 562d can include cobalt silicide, nickel silicide, tantalum silicide, titanium silicide, or tungsten silicide, or any combination thereof. The second metal gate layer 564d can be a very thin layer (10 angstrom to 400 angstrom) and can include $MoSi_2$, $NiSi_2$, TaSi2, TiN, TaN, WN, or $ZrSi_2$. The second dummy gate layer 566d can include Poly-Si material.

The third patterned wafer 500c and the fourth patterned wafer 500d can include a previously created contact feature 575b' that can be created using the selected first contact-etch procedure, one or more deposition procedures and one or more CMP procedures.

In some embodiments, when the second contact-etch procedure is performed a third patterned wafer 500c can be positioned on a wafer holder (220 shown in FIGS. 2A-2G)

and/or wafer holder (320 shown in FIGS. 3A-3G) and a second contact-etch plasma can be created in the process chamber (210 shown in FIGS. 2A-2G) and/or process chamber (310 shown in FIGS. 3A-3G) and a second contact-etch procedure can be performed.

During the second contact-etch procedure, second CE-sensor data can be collected using one or more CE-sensors (223 and/or 234 shown in FIGS. 2A-2G) and/or CE-sensors (323 and/or 334 shown in FIGS. 3A-3G), and controller (295 shown in FIGS. 2A-2G) and/or controller (395 shown in FIGS. 3A-3G) can compare the second CE-sensor data to historical CE-sensor data; and can store the second CE-sensor data. For example, the second process data can be collected using the process sensors (236 shown in FIGS. 2A-2G) and/or process sensors (336 shown in FIGS. 3A-3G) during the second contact-etch procedure.

When the selected second contact-etch procedure includes additional CE-related procedures, the additional CE-related procedures can be performed using one or more of the subsystems (110, 120, 130, 140, 150, 160, and 170) shown in FIG. 1.

In some embodiments, the DPCE processing sequence can include an IDL layer etch procedure for the IDL layer 565*d*, and contact-etch procedure for the first hard mask (TEOS) layer 540*d* or the second hard mask (TEOS) layer 545*d*. In some examples, the DPCE processing sequence can also include ashing procedures, cleaning procedures, and/or CMP procedures. In other examples, the DPCE processing sequence can include metrology procedures, IE-sensor wafer measurement procedures, and/or IE-related inspection procedures.

Still referring to FIG. 5', a second output data model 583' is illustrated, and a second set of output data can be analyzed when the second output data model 583' is executed. The second output data can include real-time and/or historical CE-related data. For example, the second output data model 583' can create and exchange second output MV' data using transfer means 590, can create and exchange second output DV' data using transfer means 591, and can create and exchange second output CV' data using transfer means 592 with the other MIMO models (580', 581', and 582'). In addition, the second output data model 583' can analyze process data and/or CE-sensor data associated with the contact-etch procedures, and the analyzed process data and/or the analyzed CE-sensor data can be fed forward and/or fed back using transfer means (590, 591, and/or 592).

When the second output data model 583' is executed, update procedures can be performed for the second contact-etch sequence. For example, update procedures can be performed to update the second process parameters, CE-sensor data, process data, and/or CE-related library data. The second output data model 583' can exchange updated contact-etch MV' data using transfer means 590, can exchange updated contact-etch DV' data using transfer means 591, and can exchange updated contact-etch CV' data using transfer means 592 with the other MIMO models (580', 581', and 582'). During process development, DOE techniques can be used to examine the preliminary set of models (580'-583') and to develop a reduced set of MIMO models.

Figure 6:
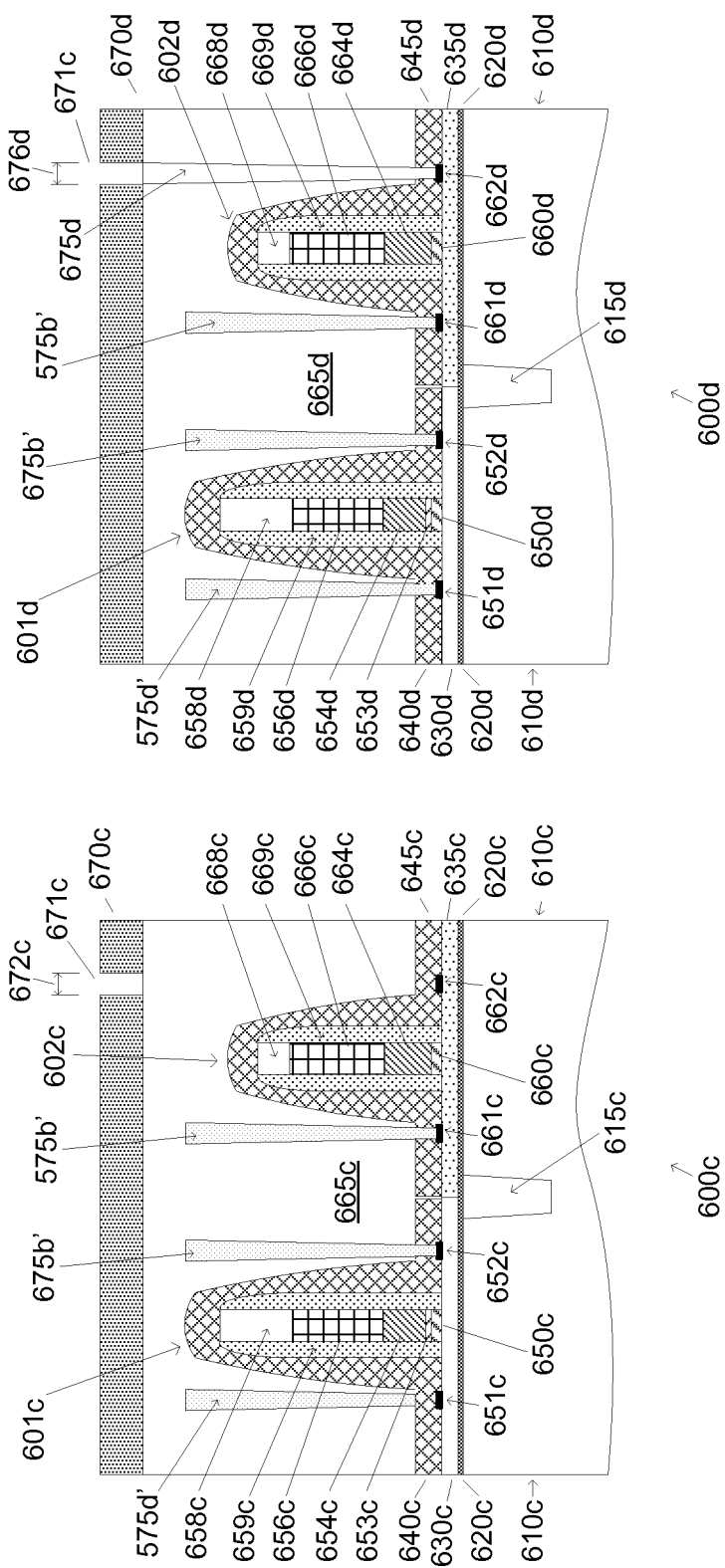
FIGS. 6 and 6' illustrate exemplary views of a second Double-Pattern-Contact-Etch (DPCE) processing sequence for creating second double pattern (DP) features in accordance with embodiments of the invention.

FIGS. 6 and 6' illustrate exemplary views of a second Double Pattern Contact-Etch (DPCE) processing sequence for creating second double pattern (DP) features in accordance with embodiments of the invention. For example, one or more second Litho-Etch-Litho-Etch (LELE) processing sequences can be performed. In FIG. 6, two exemplary patterned wafers (600*a* and 600*b*) are shown having exemplary transistor stacks (601*a*, 602*a*, 601*b*, and 602*b*) thereon that can be created using the second DPCE processing sequence, but this is not required for the invention. In FIG. 6', two other exemplary patterned wafers (600*c* and 600*d*) are shown having exemplary transistor stacks (601*c*, 602*c*, 601*d*, and 602*d*) thereon that can be created using the second DPCE processing sequence, but this is not required for the invention. Alternatively, a different number of patterned wafers with different transistor configurations may be used.

FIG. 6 illustrates a first patterned wafer 600*a* comprising a first transistor stack 601*a* and a second transistor stack 602*a*, where the first transistor stack 601*a* can include a nFET device, and the second transistor stack 602*a* can include a pFET device. Alternatively, other devices may be illustrated. In addition, two previously-filled contact/vias (575*b*' and 575*d*') are shown that can include one or more metallic or filler materials.

The first patterned wafer 600*a* can include a first substrate layer 610*a*, a first isolation layer 620*a*, a first under-layer 630*a*, and a second under-layer 635*a*. For example, the first substrate layer 610*a* can include a semiconductor material; the isolation layer 620*a* can include dielectric or metallic material; and the first under-layers (630*a* and 635*a*) can include TiN. The first substrate layer 610*a* can include a first shallow trench isolation (STI) region 615*a*, and the first STI region 615*a* can include silicon oxide ($SiO_2$), silicon nitride (SiN), or silicon oxynitride (SiON)

The first transistor stack 601*a* can be covered/protected by a first hard mask layer 640*a*, and second transistor stack 602*a* can be covered by a second hard mask layer 645*a*. For example, first hard mask layer 640*a* and the second hard mask layer 645*a* can include $SiO_2$ and/or SiN. An inter-layer dielectric (ILD) layer 665*a* is shown covering the first hard mask layer 640*a* and the second hard mask layer 645*a*, and the ILD layer 665*a* can include a low-k dielectric material. In addition, the ILD layer 665*a* can cover and protect the two previously-filled contact/vias (575*b*' and 575*d*').

A first etch mask layer 670*a* can be configured on top of the ILD layer 665*a*, and a plurality of first etch mask features 671*a* can be configured in the first etch mask layer 670*a*, and the first etch mask features 671*a* can have widths 672*a* that can vary from about 10 nm to about 100 nm. For example, one or more first litho-related sequences in the DPCE processing sequences can have been performed to create the first etch mask features 671*a* in the first etch mask layer 670*a*. In addition, the first etch mask layer 670*a* can include at least one radiation-sensitive material, at least one ARC material, and/or at least one resist material.

The first transistor stack 601*a* can include a first gate dielectric layer 650*a*, a first contact metal layer 651*a*, a second contact metal layer 652*a*, first capping layer 653*a*, a first metal gate layer 654*a*, a first dummy gate layer 656*a*, a first gate hard mask layer 658*a*, and first spacers 659*a*. The first gate dielectric layer 650*a* can include high-k dielectric material, such as hafnium oxide ($HfO_2$). The first contact metal layer 651*a* and/or the second contact metal layer 652*a* can include cobalt silicide, nickel silicide, tantalum silicide, titanium silicide, or tungsten silicide, or any combination thereof. The first capping layer 653*a* can include a work function tuning material. The first metal gate layer 654*a* can be a very thin layer (10 angstrom to 400 angstrom) and can include $MoSi_2$, $NiSi_2$, $TaSi_2$, TiN, TaN, WN, or $ZrSi_2$. The first dummy gate layer 656*a* can include Poly-Si material.

The second transistor stack 602*a* can include a second gate dielectric layer 660*a*, a first contact metal layer 661*a*, a second contact metal layer 662*a*, a second metal gate layer 664*a*, a second dummy gate layer 666*a*, a second gate hard mask layer 668*a*, and second spacers 669*a*. The second gate dielectric layer 660a can include high-k dielectric material, such as hafnium oxide (HfO$_2$). The first contact metal layer 661a and/or the second contact metal layer 662a can include cobalt silicide, nickel silicide, tantalum silicide, titanium silicide, or tungsten silicide, or any combination thereof. The second metal gate layer 664a can be a very thin layer (10 angstrom to 400 angstrom) and can include MoSi$_2$, NiSi$_2$, TaSi2, TiN, TaN, WN, or ZrSi$_2$. The second dummy gate layer 666a can include Poly-Si material.

In FIG. 6, a first input data model 680 is illustrated, and a first set of input data can be obtained when the first input data model 680 is executed. The first input data can include real-time and/or historical CE-related data for the first patterned wafer 600a. A first select CE-MIMO model 681 is illustrated, and a first contact-etch procedure can be selected using the first select CE-MIMO model 681, and the first select CE-MIMO model 681 can exchange Measured Variable (MV) data using transfer means 690, can exchange Disturbance Variable (DV) data using transfer means 691, and can exchange Controlled Variable (CV) data using transfer means 692. For example, the first select CE-MIMO model 681 can create and/or use first CE-related data associated with the first patterned wafer 600a, and the first CE-related data can be fed forward and/or fed back using transfer means (690, 691, and/or 692).

When the first select CE-MIMO model 681 is executed, a first contact-etch procedure can be selected using controller (295 shown in FIGS. 2A-2G) and/or controller (395 shown in FIGS. 3A-3G). In some examples, the controllers (295 and/or 395) can use first CE-related library data for the first patterned wafer 600a and/or the second patterned wafer 600b. The first contact-etch related library data for the first patterned wafer 600a can include historical contact-etch procedure data collected using one or more CE-sensors (223 and/or 234 shown in FIGS. 2A-2G) and/or CE-sensors (323 and/or 334 shown in FIGS. 3A-3G), when the first transistor stack 601a and/or the second transistor stack 602a were being created on the first patterned wafer 600a. The first CE-related library data for the second patterned wafer 600b can include second historical contact-etch procedure data collected using one or more CE-sensors (223 and/or 234 shown in FIGS. 2A-2G) and/or CE-sensors (323 and/or 334 shown in FIGS. 3A-3G), when first transistor stack 601b and/or the second transistor stack 602b were previously created on the second patterned wafers 600b.

In FIG. 6, a first CE-MIMO model 682 is illustrated, and when the first CE-MIMO model 682 is executed, the selected first contact-etch procedure can be performed using one or more of the etch subsystems described herein in FIGS. 2A-2G and FIGS. 3A-3G. When contact-etch procedures are performed, one or more sets of process parameters can be determined, updated, and/or validated. For example, the first CE-MIMO model 682 can create and exchange first contact-etch MV data using transfer means 690, can create and exchange first contact-etch DV data using transfer means 691, and can create and exchange first contact-etch CV data using transfer means 692 with the other MIMO models (680, 681, and 683). In addition, the first CE-MIMO model 682 can include first MV process data, first DV process data, and first CV process data associated with the first contact-etch procedure, with the first patterned wafer 600a, and/or with the second patterned wafer 600b.

In some examples, the first patterned wafer 600a can be etched using the first contact-etch procedure to create a second patterned wafer 600b. Alternatively, other patterned wafers may be created.

With continuing reference to FIG. 6, a second patterned wafer 600b comprising a first transistor stack 601b and a second transistor stack 602b, the first transistor stack 601b can include a nFET device, and the second transistor stack 602b can include a pFET device. Alternatively, other devices may be illustrated. The first patterned wafer 600a and the second patterned wafer 600b can include previously-filled contact features (575b' and 575d') that can have been created using the first DPCE processing sequence.

The second patterned wafer 600b can include a first substrate layer 610b, a first isolation layer 620b, a first under-layer 630b, and a second under-layer 635b. For example, the first substrate layer 610b can include a semiconductor material; the first isolation layer 620b can include dielectric or metallic material; and the first under-layers (630b and 635b) can include TiN. The first substrate layer 610b can include a first STI region 615b, and the first STI region 615b can include SiO$_2$, SiN, and/or SiON.

The first transistor stack 601b can be covered/protected by a first hard mask layer 640b, and second transistor stack 602b can be covered by a second hard mask layer 645b. For example, first hard mask layer 640b and the second hard mask layer 645b can include SiO$_2$ and/or SiN. An inter-layer dielectric (ILD) layer 665b is shown covering the first hard mask layer 640b and the second hard mask layer 645b, and the ILD layer 665b can include a low-k dielectric material. In addition, the ILD layer 665b can cover and protect the previously-filled contact features (575b' and 575d').

A first contact-etch masking layer 670b can be configured on top of the ILD layer 665b, and the first contact-etch masking layer 670b can include a plurality of first etch mask features 671a. For example, one or more first litho-related procedures in the second DPCE processing sequence can have been performed to create first etch mask features 671a in the first contact-etch masking layer 670b, and a first contact-etch procedure in the second DPCE processing sequence can use the first etch mask features 671a to create the first contact-etch vias 675b, and the contact-etch vias 675b can have widths 676b that can vary from about 10 nm to about 100 nm. In addition, the first contact-etch masking layer 670b can include at least one radiation-sensitive material, at least one ARC material, and/or at least one resist material.

The first transistor stack 601b can include a first gate dielectric layer 650b, a first contact metal layer 651b, a second contact metal layer 652b, first capping layer 653b, a first metal gate layer 654b, a first dummy gate layer 656b, a first gate hard mask layer 658b, and first spacers 659b. The first gate dielectric layer 650b can include high-k dielectric material, such as hafnium oxide (HfO$_2$). The first contact metal layer 651b and/or the second contact metal layer 652b can include cobalt silicide, nickel silicide, tantalum silicide, titanium silicide, or tungsten silicide, or any combination thereof. The first capping layer 653b can include a work function tuning material. The first metal gate layer 654b can be a very thin layer (10 angstrom to 400 angstrom) and can include MoSi$_2$, NiSi$_2$, TaSi$_2$, TiN, TaN, WN, or ZrSi$_2$. The first dummy gate layer 656b can include Poly-Si material.

The second transistor stack 602b can include a second gate dielectric layer 660b, a first contact metal layer 661b, a second contact metal layer 662b, a second metal gate layer 664b, a second dummy gate layer 666b, a second gate hard mask layer 668b, and second spacers 669b. The second gate dielectric layer 660b can include high-k dielectric material, such as hafnium oxide (HfO$_2$). The first contact metal layer 661b and/or the second contact metal layer 662b can include cobalt silicide, nickel silicide, tantalum silicide, titanium silicide, or tungsten silicide, or any combination thereof. The second metal gate layer 664b can be a very thin layer (10 angstrom to 400 angstrom) and can include $MoSi_2$, $NiSi_2$, $TaSi_2$, TiN, TaN, WN, or $ZrSi_2$. The second dummy gate layer 666b can include Poly-Si material.

In some embodiments, when the first contact-etch procedure is performed, a first patterned wafer 600a can be positioned on a wafer holder (220 shown in FIGS. 2A-2G) and/or wafer holder (320 shown in FIGS. 3A-3G) and a first contact-etch plasma can be created in the process chamber (210 shown in FIGS. 2A-2G) and/or process chamber (310 shown in FIGS. 3A-3G) and a first contact-etch procedure can be performed. In other embodiments, first Ion Energy Optimized (IEO) plasma can be created in the process chamber (210 shown in FIGS. 2A-2G) and/or process chamber (310 shown in FIGS. 3A-3G) and a first IEO-etch procedure can be performed.

During the first contact-etch procedure, first CE-sensor data can be collected using one or more CE-sensors (223 and/or 234 shown in FIGS. 2A-2G) and/or CE-sensors (323 and/or 334 shown in FIGS. 3A-3G), and controller (295 shown in FIGS. 2A-2G) and/or controller (395 shown in FIGS. 3A-3G) can compare the first CE-sensor data to historical CE-sensor data; and can store the first CE-sensor data. For example, the first process data can be collected using the process sensors (236 shown in FIGS. 2A-2G) and/or process sensors (336 shown in FIGS. 3A-3G) during the first contact-etch procedure.

When the selected first contact-etch procedure includes additional CE-related procedures, the additional CE-related procedures can be performed using one or more of the subsystems (110, 120, 130, 140, 150, 160, and 170) shown in FIG. 1.

In some embodiments, the first contact-etch procedure can include a Si-ARC layer etch procedure, an IDL layer etch procedure, and/or a TEOS layer etch procedure. In some examples, the second DPCE processing sequence can also include ashing procedures, cleaning procedures, and/or CMP procedures. In other examples, the second DPCE processing sequence can include IE-related etch procedures, IE-sensor wafer measurement procedures, and/or IE-related measurement procedures.

Still referring to FIG. 6, a first output data model 683 is illustrated, and a first set of output data can be analyzed when the first output data model 683 is executed. The first output data can include real-time and/or historical CE-related data. For example, the first output data model 683 can create and exchange output MV data using transfer means 690, can create and exchange output DV data using transfer means 691, and can create and exchange output CV data using transfer means 692 with the other MIMO models (680, 681, and 682). In addition, the first output data model 683 can analyze process data and/or CE-sensor data associated with the contact-etch procedures, and the analyzed process data and/or the analyzed CE-sensor data can be fed forward and/or fed back using transfer means (690, 691, and/or 692).

When the first output data model 683 is executed, update procedures can be performed for the DPCE processing sequences. For example, update procedures can be performed to update and/or verify the first contact-etch parameters, the contact-etch metrology data, the contact-etch process data, and/or CE-related library data. The first output data model 683 can exchange updated and/or verified contact-etch MV data using transfer means 690, can exchange updated contact-etch DV data using transfer means 691, and can exchange updated and/or verified contact-etch CV data using transfer means 692 with the other MIMO models (680, 681, and 682).

During process development, DOE techniques can be used to examine the preliminary set of models (680-684) and to develop a reduced set of CE-MIMO models.

FIG. 6' illustrates a third patterned wafer 600c comprising a first transistor stack 601c and a second transistor stack 602c, where the first transistor stack 601c can include a nFET device, and the second transistor stack 602c can include a pFET device. Alternatively, other devices may be illustrated.

The first patterned wafer 600c can include a first substrate layer 610c, a first isolation layer 620c, a first under-layer 630c, and a second under-layer 635c. For example, the first substrate layer 610c can include a semiconductor material; the first isolation layer 620c can include dielectric or metallic material; and the first under-layers (630c and 635c) can include TiN. The first substrate layer 610c can include a first shallow trench isolation (STI) region 615c, and the first STI region 615c can include $SiO_2$, SiN, and/or SiON.

The first transistor stack 601c can be covered/protected by a first hard mask layer 640c, and second transistor stack 602c can be covered by a second hard mask layer 645c. For example, first hard mask layer 640c and the second hard mask layer 645c can include $SiO_2$ and/or SiN. An inter-layer dielectric (ILD) layer 665c is shown covering the first hard mask layer 640c and the second hard mask layer 645c, and the ILD layer 665c can include a low-k dielectric material. A second etch mask layer 670c can be configured on top of the first ILD layer 665c, and a plurality of second etch mask features 671c can be configured in the second etch mask layer 670c, and the second etch mask features 671c can have widths 672c that can vary from about 10 nm to about 100 nm. For example, one or more second litho processing sequences can be performed to create the second etch mask features 671c in the second etch mask layer 670c. In addition, the second etch mask layer 670c can include at least one radiation-sensitive material, at least one ARC material, and/or at least one resist material.

The first transistor stack 601c can include a first gate dielectric layer 650c, a first contact metal layer 651c, a second contact metal layer 652c, first capping layer 653c, a first metal gate layer 654c, a first dummy gate layer 656c, a first gate hard mask layer 658c, and first spacers 659c. The first gate dielectric layer 650a can include high-k dielectric material, such as hafnium oxide ($HfO_2$). The first contact metal layer 651c and/or the second contact metal layer 652c can include cobalt silicide, nickel silicide, tantalum silicide, titanium silicide, or tungsten silicide, or any combination thereof. The first capping layer 653c can include a work function tuning material. The first metal gate layer 654c can be a very thin layer (10 angstrom to 400 angstrom) and can include $MoSi_2$, $NiSi_2$, $TaSi_2$, TiN, TaN, WN, or $ZrSi_2$. The first dummy gate layer 656c can include Poly-Si material.

The second transistor stack 602c can include a second gate dielectric layer 660c, a first contact metal layer 661c, a second contact metal layer 662c, a second metal gate layer 664c, a second dummy gate layer 666c, a second gate hard mask layer 668c, and second spacers 669c. The second gate dielectric layer 660c can include high-k dielectric material, such as hafnium oxide ($HfO_2$). The first contact metal layer 661c and/or the second contact metal layer 662c can include cobalt silicide, nickel silicide, tantalum silicide, titanium silicide, or tungsten silicide, or any combination thereof. The second metal gate layer 664c can be a very thin layer (10 angstrom to 400 angstrom) and can include $MoSi_2$, $NiSi_2$, TaSi2, TiN, TaN, WN, or $ZrSi_2$. The second dummy gate layer 666c can include Poly-Si material.

In FIG. 6', a second input data model 680' is illustrated, and a second set of input data can be obtained when the second input data model 680' is executed. The second input data can include real-time and/or historical CE-related data for one or more of the patterned wafers (600a, 600b, and 600c). A second select CE-MIMO model 681' is illustrated, and a second contact-etch procedure can be selected using the second select CE-MIMO model 681', and the second select CE-MIMO model 681' can exchange second MV' selection data using transfer means 690, can exchange second DV' selection data using transfer means 691, and can exchange second CV' selection data using transfer means 692. For example, the second select CE-MIMO model 681' can create, update, and/or use the contact-etch selection data associated with one or more of the patterned wafers (600a, 600b, and 600c), and the contact-etch selection data can be fed forward and/or fed back using transfer means (690, 691, and/or 692).

When the second select CE-MIMO model 681' is executed, a second contact-etch procedure can be selected using controller (295 shown in FIGS. 2A-2G) and/or controller (395 shown in FIGS. 3A-3G). In some examples, the controllers (295 and/or 395) can use CE-related library data for one or more of the patterned wafers (600a, 600b, 600c, and 600d). The CE-related library data can include historical contact-etch procedure data collected using one or more CE-sensors (223 and/or 234 shown in FIGS. 2A-2G) and/or CE-sensors (323 and/or 334 shown in FIGS. 3A-3G), when one or more of the patterned wafers (600a, 600b, 600c, and 600d) were being previously created.

In FIG. 6', a second CE-MIMO model 682' is illustrated, and when the second CE-MIMO model 682' is executed, the selected second contact-etch procedure can be performed using one or more of the etch subsystems described herein in FIGS. 2A-2G and FIGS. 3A-3G. When contact-etch procedures are performed, one or more sets of process parameters can be determined using the second contact-etch sequence. For example, the second CE-MIMO model 682' can create and exchange second contact-etch MV' data using transfer means 690, can create and exchange second contact-etch DV' data using transfer means 691, and can create and exchange second contact-etch CV' data using transfer means 692 with the other MIMO models (680', 681', and 683'). In addition, the second CE-MIMO model 682' can include second MV' process data, second DV' process data, and second CV' process data associated with the second contact-etch sequence.

In some examples, the third patterned wafer 600c can be etched using the second contact-etch procedure to create a fourth patterned wafer 600d. Alternatively, other patterned wafers may be created.

With continuing reference to FIG. 6', a fourth patterned wafer 600d comprising a first transistor stack 601d and a second transistor stack 602d is shown. The first transistor stack 601d can include a nFET device, and the second transistor stack 602d can include a pFET device. Alternatively, other devices may be illustrated. In addition, a plurality of previously-filled contact/vias (575b', 575d', and 675b') are shown that can include one or more metallic fill materials. The previously-filled contact/vias (575b', 575d', and 675b') can have been created using one or more contact-etch sequences, one or more deposition procedures, and one or more CMP procedures.

The fourth patterned wafer 600d can include a first substrate layer 610d, a first isolation layer 620d, a first under-layer 630d, and a second under-layer 635d. For example, the first substrate layer 610d can include a semiconductor material; the first isolation layer 620d can include dielectric or metallic material; and the first under-layers (630d and 635d) can include TiN. The first substrate layer 610d can include a first STI region 615d, and the first STI region 615d can include $SiO_2$, SiN, and/or SiON.

The first transistor stack 601d can be covered/protected by a first hard mask layer 640d, and second transistor stack 602d can be covered by a second hard mask layer 645d. For example, first hard mask layer 640d and the second hard mask layer 645d can include $SiO_2$ and/or SiN. An inter-layer dielectric (ILD) layer 665d is shown covering the first hard mask layer 640d and the second hard mask layer 645d, and the ILD layer 665d can include a low-k dielectric material. In addition, the ILD layer 665d can cover and protect the previously-filled contact/vias (575b', 575d', and 675b').

A second contact-etch masking layer 670d can be configured on top of the ILD layer 665d, and the second contact-etch masking layer 670d can include a plurality of second etch mask features 671c. For example, one or more second litho-related procedures in the second DPCE processing sequence can be performed to create second etch mask features 671c in the second contact-etch masking layer 670d, and a second contact-etch procedure in the second DPCE processing sequence can use the second etch mask features 671c to create the second contact-etch vias 675d, and the second contact-etch vias 675d can have widths 676d that can vary from about 10 nm to about 100 nm. In addition, the second contact-etch masking layer 670d can include at least one radiation-sensitive material, at least one ARC material, and/or at least one resist material.

The first transistor stack 601d can include a first gate dielectric layer 650d, a first contact metal layer 651d, a second contact metal layer 652d, first capping layer 653d, a first metal gate layer 654d, a first dummy gate layer 656d, a first gate hard mask layer 658d, and first spacers 659d. The first gate dielectric layer 650d can include high-k dielectric material, such as hafnium oxide ($HfO_2$). The first contact metal layer 651d and/or the second contact metal layer 652d can include cobalt silicide, nickel silicide, tantalum silicide, titanium silicide, or tungsten silicide, or any combination thereof. The first capping layer 653d can include a work function tuning material. The first metal gate layer 654d can be a very thin layer (10 angstrom to 400 angstrom) and can include $MoSi_2$, $NiSi_2$, $TaSi_2$, TiN, TaN, WN, or $ZrSi_2$. The first dummy gate layer 656d can include Poly-Si material.

The second transistor stack 602d can include a second gate dielectric layer 660d, a first contact metal layer 661d, a second contact metal layer 662d, a second metal gate layer 664d, a second dummy gate layer 666d, a second gate hard mask layer 668d, and second spacers 669d. The second gate dielectric layer 660d can include high-k dielectric material, such as hafnium oxide ($HfO_2$). The first contact metal layer 661d and/or the second contact metal layer 662d can include cobalt silicide, nickel silicide, tantalum silicide, titanium silicide, or tungsten silicide, or any combination thereof. The second metal gate layer 664d can be a very thin layer (10 angstrom to 400 angstrom) and can include $MoSi_2$, $NiSi_2$, $TaSi_2$, TiN, TaN, WN, or $ZrSi_2$. The second dummy gate layer 666d can include Poly-Si material.

In some embodiments, when the second contact-etch procedure is performed a third patterned wafer 600c can be positioned on a wafer holder (220 shown in FIGS. 2A-2G) and/or wafer holder (320 shown in FIGS. 3A-3G) and a second contact-etch plasma can be created in the process chamber (210 shown in FIGS. 2A-2G) and/or process chamber (310 shown in FIGS. 3A-3G) and the second contact-etch procedure can be performed.

During the second contact-etch procedure, second CE-sensor data can be collected using one or more CE-sensors (223 and/or 234 shown in FIGS. 2A-2G) and/or CE-sensors (323 and/or 334 shown in FIGS. 3A-3G), and controller (295 shown in FIGS. 2A-2G) and/or controller (395 shown in FIGS. 3A-3G) can compare the second CE-sensor data to historical CE-sensor data; and can store the second CE-sensor data. For example, the second process data can be collected using the process sensors (236 shown in FIGS. 2A-2G) and/or process sensors (336 shown in FIGS. 3A-3G) during the second contact-etch procedure.

When the selected second contact-etch procedure includes additional CE-related procedures, the additional CE-related procedures can be performed using one or more of the subsystems (110, 120, 130, 140, 150, 160, and 170) shown in FIG. 1.

In some embodiments, the second contact-etch procedure can include a Si-ARC layer etch procedure, an IDL layer etch procedure, and a TEOS layer etch procedure. In some examples, the second DPCE processing sequence can also include ashing procedures, cleaning procedures, and/or CMP procedures. In other examples, the second DPCE processing sequence can include IE-related etch procedures, IE-sensor wafer measurement procedures, and/or IE-related measurement procedures.

Still referring to FIG. 6', a second output data model 683' is illustrated, and a second set of output data can be analyzed when the second output data model 683' is executed. The second output data can include real-time and/or historical CE-related data. For example, the second output data model 683' can create and exchange second output MV' data using transfer means 690, can create and exchange second output DV' data using transfer means 691, and can create and exchange second output CV' data using transfer means 692 with the other MIMO models (680', 681', and 682'). In addition, the second output data model 683' can analyze process data and/or CE-sensor data associated with the contact-etch procedures, and the analyzed process data and/or the analyzed CE-sensor data can be fed forward and/or fed back using transfer means (690, 691, and/or 692).

When the second output data model 683' is executed, update and/or verify procedures can be performed for the second contact-etch sequence. For example, update and/or verify procedures can be performed to update and/or verify the second process parameters, CE-sensor data, process data, and/or CE-related library data. The second output data model 683' can exchange updated and/or verified contact-etch MV' data using transfer means 690, can exchange updated and/or verified contact-etch DV' data using transfer means 691, and can exchange updated and/or verified contact-etch CV' data using transfer means 692 with the other MIMO models (680', 681', and 682'). During process development, DOE techniques can be used to examine the preliminary set of models (680'-683') and to develop a reduced set of MIMO models.

FIG. 7 illustrates exemplary views of a third Double-Pattern-Contact-Etch (DPCE) processing sequence for creating third double pattern (DP) features in accordance with embodiments of the invention. For example, a first Litho-Litho-Etch (LLE) processing sequence can be used to create the third DP features. In FIG. 7, two exemplary patterned wafers (700a and 700b) are shown having exemplary transistor stacks (701a, 702a, 701b, and 702b) thereon that can be created using the third DPCE processing sequence, but this is not required for the invention.

FIG. 7 illustrates a first patterned wafer 700a comprising a first transistor stack 701a and a second transistor stack 702a, where the first transistor stack 701a can include a nFET device, and the second transistor stack 702a can include a pFET device. Alternatively, other devices may be illustrated. In addition, a number of previously-filled contact/vias (575b', 575d', 675b', and 675d') are shown that can include one or more metallic or fill materials.

The first patterned wafer 700a can include a first substrate layer 710a, a first isolation layer 720a, a first under-layer 730a, and a second under-layer 735a. For example, the first substrate layer 710a can include a semiconductor material; the first isolation layer 720a can include dielectric or metallic material; and the under-layers (730a and 735a) can include TiN. The first substrate layer 710a can include a first shallow trench isolation (STI) region 715a, and the first STI region 715a can include silicon oxide ($SiO_2$), silicon nitride (SiN), silicon oxynitride (SiON)

The first transistor stack 701a can be covered/protected by a first hard mask layer 740a, and second transistor stack 702a can be covered by a second hard mask layer 745a. For example, first hard mask layer 740a and the second hard mask layer 745a can include $SiO_2$ and/or SiN. An inter-layer dielectric (ILD) layer 765a is shown covering the first hard mask layer 740a and the second hard mask layer 745a, and the ILD layer 765a can include a low-k dielectric material. A first etch mask layer 770a can be configured on top of the first ILD layer 765a, and the first etch mask layer 770a can include a plurality of first etch mask features 771a and a plurality of second etch mask features 773a. The first etch mask features 771a can have widths 772a that can vary from about 10 nm to about 100 nm, and the second etch mask features 773a can have widths 774a that can vary from about 10 nm to about 100 nm. For example, at least two litho-related sequences can be performed to create the first etch mask features 771a and the second etch mask features 773a in the first etch mask layer 770a. In addition, the first etch mask layer 770a can include at least one radiation-sensitive material, at least one ARC material, and/or at least one resist material.

The first transistor stack 701a can include a first gate dielectric layer 750a, a first contact metal layer 751a, a second contact metal layer 752a, first capping layer 753a, a first metal gate layer 754a, a first dummy gate layer 756a, a first gate hard mask layer 758a, and first spacers 759a. The first gate dielectric layer 750a can include high-k dielectric material, such as hafnium oxide ($HfO_2$). The first contact metal layer 751a and/or the second contact metal layer 752a can include cobalt silicide, nickel silicide, tantalum silicide, titanium silicide, or tungsten silicide, or any combination thereof. The first capping layer 753a can include a work function tuning material. The first metal gate layer 754a can be a very thin layer (10 angstrom to 400 angstrom) and can include $MoSi_2$, $NiSi_2$, $TaSi_2$, TiN, TaN, WN, or $ZrSi_2$. The first dummy gate layer 756a can include Poly-Si material.

The second transistor stack 702a can include a second gate dielectric layer 760a, a first contact metal layer 761a, a second contact metal layer 762a, a second metal gate layer 764a, a second dummy gate layer 766a, a second gate hard mask layer 768a, and second spacers 769a. The second gate dielectric layer 760a can include high-k dielectric material, such as hafnium oxide ($HfO_2$). The first contact metal layer 761a and/or the second contact metal layer 762a can include cobalt silicide, nickel silicide, tantalum silicide, titanium silicide, or tungsten silicide, or any combination thereof. The second metal gate layer 764a can be a very thin layer (10 angstrom to 400 angstrom) and can include $MoSi_2$, $NiSi_2$, $TaSi_2$, TiN, TaN, WN, or $ZrSi_2$. The second dummy gate layer 766a can include Poly-Si material.

In FIG. 7, a first input data model 780 is illustrated, and a first set of input data can be obtained when the first input data model 780 is executed. The first input data can include real-time and/or historical IE-related data for the first patterned wafer 700a.

A select CE-MIMO model 781 is illustrated, and a first contact-etch procedure can be selected using the select CE- MIMO model 781, and the select CE-MIMO model 781 can exchange Measured Variable (MV) data using transfer means 790, can exchange Disturbance Variable (DV) data using transfer means 791, and can exchange Controlled Variable (CV) data using transfer means 792. For example, the select CE-MIMO model 781 can create and/or use first CE-related data associated with the first patterned wafer 700*a*, and the first CE-related data can be fed forward and/or fed back using transfer means (790, 791, and/or 792).

When the select CE-MIMO model 781 is executed, a first contact-etch procedure can be selected using controller (295 shown in FIGS. 2A-2G) and/or controller (395 shown in FIGS. 3A-3G). In some examples, the controllers (295 and/or 395) can use first contact-etch related library data for the first patterned wafer 700*a* and/or the second patterned wafer 700*b*. The first CE-related library data for the first patterned wafer 700*a* can include historical contact-etch procedure data collected using one or more CE-sensors (223 and/or 234 shown in FIGS. 2A-2G) and/or CE-sensors (323 and/or 334 shown in FIGS. 3A-3G), when the first transistor stack 701*a* and/or the second transistor stack 702*a* were being created on the first patterned wafer 700*a*. The first CE-related library data for the second patterned wafer 700*b* can include second historical contact-etch procedure data collected using one or more CE-sensors (223 and/or 234 shown in FIGS. 2A-2G) and/or CE-sensors (323 and/or 334 shown in FIGS. 3A-3G), when first transistor stacks 701*b* and/or the second transistor stacks 702*b* were previously created on the second patterned wafers 700*b*.

In FIG. 7, a CE-MIMO model 782 is illustrated, and when the CE-MIMO model 782 is executed, the selected first contact-etch procedure can be performed using one or more of the etch subsystems described herein in FIGS. 2A-2G and FIGS. 3A-3G. When contact-etch procedures are performed, one or more sets of process parameters can be determined, updated, and/or verified. For example, the CE-MIMO model 782 can create and exchange first contact-etch MV data using transfer means 790, can create and exchange first contact-etch DV data using transfer means 791, and can create and exchange first contact-etch CV data using transfer means 792 with the other MIMO models (780, 781, and 783). In addition, the CE-MIMO model 782 can include first MV process data, first DV process data, and first CV process data associated with the first contact-etch procedure, with the first patterned wafer 700*a*, and/or with the second patterned wafer 700*b*.

In some examples, the first patterned wafer 700*a* can be etched using the first contact-etch procedure to create a second patterned wafer 700*b*. Alternatively, other patterned wafers may be created.

With continuing reference to FIG. 7, a second patterned wafer 700*b* comprising a first transistor stack 701*b* and a second transistor stack 702*b*, the first transistor stack 701*b* can include a nFET device, and the second transistor stack 702*b* can include a pFET device. Alternatively, other devices may be illustrated.

The second patterned wafer 700*b* can include a first substrate layer 710*b*, a first isolation layer 720*b*, a first under-layer 730*b*, and a second under-layer 735*b*. For example, the first substrate layer 710*b* can include a semiconductor material; the first isolation layer 720*b* can include dielectric or metallic material; and the under-layers (730*b* and 735*b*) can include TiN. The first substrate layer 710*b* can include a first STI region 715*b*, and the first STI region 715*b* can include $SiO_2$, SiN, and/or SiON.

The first transistor stack 701*b* can be covered/protected by a first hard mask layer 740*b*, and second transistor stack 702*b* can be covered by a second hard mask layer 745*b*. For example, first hard mask layer 740*b* and the second hard mask layer 745*b* can include $SiO_2$ and/or SiN. An inter-layer dielectric (ILD) layer 765*b* is shown covering the first hard mask layer 740*b* and the second hard mask layer 745*b*, and the ILD layer 765*b* can include a low-k dielectric material. For example, the first etch mask layer 770*b* can include first radiation-sensitive material, first ARC material, and/or first resist material.

The first transistor stack 701*b* can include a first gate dielectric layer 750*b*, a first contact metal layer 751*b*, a second contact metal layer 752*b*, first capping layer 753*b*, a first metal gate layer 754*b*, and a first etched gate feature 775*b*, and first spacers 759*b*. The first gate dielectric layer 750*b* can include high-k dielectric material, such as hafnium oxide ($HfO_2$). The first contact metal layer 751*b* and/or the second contact metal layer 752*b* can include cobalt silicide, nickel silicide, tantalum silicide, titanium silicide, or tungsten silicide, or any combination thereof. The first capping layer 753*b* can include a work function tuning material. The first metal gate layer 754*b* can be a very thin layer (10 angstrom to 400 angstrom) and can include $MoSi_2$, $NiSi_2$, TaSi2, TiN, TaN, WN, or $ZrSi_2$. The first etched gate feature 777*b* can be filled with first replacement gate material during subsequent gate depositon procedures.

The second transistor stack 702*b* can include a second gate dielectric layer 760*b*, a first contact metal layer 761*b*, a second contact metal layer 762*b*, a second metal gate layer 764*b*, a second etched gate feature 777*b*, and second spacers 769*b*. The second gate dielectric layer 760*b* can include high-k dielectric material, such as hafnium oxide ($HfO_2$). The first contact metal layer 761*b* and/or the second contact metal layer 762*b* can include cobalt silicide, nickel silicide, tantalum silicide, titanium silicide, or tungsten silicide, or any combination thereof. The second metal gate layer 764*b* can be a very thin layer (10 angstrom to 400 angstrom) and can include $MoSi_2$, $NiSi_2$, $TaSi_2$, TiN, TaN, WN, or $ZrSi_2$. The second etched gate feature 777*b* can be filled with second replacement gate material during subsequent gate depositon procedures.

One or more litho-related procedures in the third DPCE processing sequence can have been previously performed to create first etch mask features 771*a* and the second etch mask features 773*a* in the contact-etch masking layer 770*b*. For example, one or more contact-etch procedures in the DPCE processing sequence can use the first etch mask features 771*a* to create the first contact-etch vias 775*b* and can use the second etch mask features 773*a* to create the second contact-etch vias 777*b*. In addition, the first contact-etch vias 775*b* can have first widths 776*b* that can vary from about 10 nm to about 100 nm, and the second contact-etch vias 777*b* can have widths 778*b* that can vary from about 10 nm to about 100 nm.

In some embodiments, when the first contact-etch procedure is performed a first patterned wafer 700*a* can be positioned on a wafer holder (220 shown in FIGS. 2A-2G) and/or wafer holder (320 shown in FIGS. 3A-3G) and a first contact-etch plasma can be created in the process chamber (210 shown in FIGS. 2A-2G) and/or process chamber (310 shown in FIGS. 3A-3G), and the first contact-etch procedure can be performed. In other embodiments, Ion Energy Optimized (IEO) plasma can be created in the process chamber (210 shown in FIGS. 2A-2G) and/or process chamber (310 shown in FIGS. 3A-3G) and a first IEO-etch procedure can be performed.

During the first contact-etch procedure, first CE-sensor data can be collected using one or more CE-sensors (223 and/or 234 shown in FIGS. 2A-2G) and/or CE-sensors (323 and/or 334 shown in FIGS. 3A-3G), and controller (295 shown in FIGS. 2A-2G) and/or controller (395 shown in FIGS. 3A-3G) can compare the first CE-sensor data to historical CE-sensor data; and can store the first CE-sensor data. For example, the first process data can be collected using the process sensors (236 shown in FIGS. 2A-2G) and/or process sensors (336 shown in FIGS. 3A-3G) during the first contact-etch procedure.

When the selected first contact-etch procedure includes additional CE-related procedures, the additional CE-related procedures can be performed using one or more of the subsystems (110, 120, 130, 140, 150, 160, and 170) shown in FIG. 1.

In some embodiments, the first contact-etch procedure can include a Si-ARC layer etch procedure, an ILD layer etch procedure, and a TEOS layer etch procedure. In some examples, the third DPCE processing sequence can also include ashing procedures, cleaning procedures, and/or CMP procedures. In other examples, the third DPCE processing sequence can include IE-related etch procedures, IE-sensor wafer measurement procedures, and/or IE-related measurement procedures.

Still referring to FIG. 7, an output data model 783 is illustrated, and a first set of output data can be analyzed when the output data model 783 is executed. The first output data can include real-time and/or historical CE-related data. For example, the output data model 783 can create and exchange output MV data using transfer means 790, can create and exchange output DV data using transfer means 791, and can create and exchange output CV data using transfer means 792 with the other CE-MIMO models (780, 781, and 782). In addition, the first output data model 783 can analyze process data and/or CE-sensor data associated with the contact-etch procedures, and the analyzed process data and/or the analyzed CE-sensor data can be fed forward and/or fed back using transfer means (790, 791, and/or 792).

When the first output data model 783 is executed, update and/or verify procedures can be performed for the first contact-etch procedure. For example, update procedures can be performed to update and/or verify the first CE process parameters, the CE sensor data, CE process data, and/or the CE-related library data. The first output data model 783 can exchange updated and/or verified contact-etch MV data using transfer means 790, can exchange updated and/or verified contact-etch DV data using transfer means 791, and can exchange updated and/or verified contact-etch CV data using transfer means 792 with the other CE-MIMO models (780, 781, and 782). During process development, DOE techniques can be used to examine the preliminary set of models (780-784) and to develop a reduced set of CE-MIMO models.

In some embodiments, the DPCE processing sequence can include one or more "break through (BT) etch procedures, one or more Main-Etch (ME) etch procedures, one or more Over-Etch (OE) etch procedures, and one or more Titanium Nitride (TiN) etch procedures. Alternatively, other etching, ashing, or cleaning procedures may be used. In other embodiments, the DPCE processing sequence can include one or more Si-ARC layer etch procedures, one or more TiN etch procedures, one or more TEOS etch procedures, and one or more TEOS layer etch procedures.

In other embodiments, the DPCE processing sequence may include a first Ion-Energy Optimized (IEO) etch procedure for a first hard mask layer, second IEO etch procedure for an IDL layer, and third IEO etch procedure for a second hard mask layer. For example, the first IEO etch procedure can include a Si-ARC layer etch procedure, the second IEO etch procedure can include a width layer etch procedure, and the third IEO etch procedure can include a TEOS layer etch procedure. In some examples, the DPCE processing sequence can also include ashing procedures, cleaning procedures, and/or CMP procedures. In other examples, DPCE processing sequence can include IE-related metrology procedures, IE-sensor wafer measurement procedures, and/or IE-related inspection procedures.

During hardmask (SiARC) contact-etch procedures, the chamber pressure can range from about 12 mT to about 18 mT; the top power can vary from about 450 watts to about 550 watts; the lower power can vary from about 90 watts to about 110 watts; the ESC voltage can be set at about 2500 V; the Tetrafluoromethane ($CF_4$) flow rate can vary between about 60 sccm and about 100 sccm; the trifluoromethane ($CHF_3$) flow rate can vary between about 40 sccm and about 60 sccm; the top chamber temperature can vary from about 70 degrees Celsius to about 90 degrees Celsius; the chamber wall temperature can vary from about 50 degrees Celsius to about 70 degrees Celsius; the bottom chamber temperature can vary from about 10 degrees Celsius to about 30 degrees Celsius; the temperature at the center of the wafer holder can vary from about 12 degrees Celsius to about 20 degrees Celsius; the temperature at the edge of the wafer holder can vary from about 8 degrees Celsius to about 12 degrees Celsius; the center backside pressure for the wafer holder can vary from about 15 Torr to about 25 Torr; the edge backside pressure for the wafer holder can vary from about 27 Torr to about 33 Torr; and the processing time can vary from about 60 seconds to about 90 seconds.

During IDL contact-etch procedures, the chamber pressure can range from about 15 mT to about 25 mT; the top power can vary from about 450 watts to about 550 watts; the lower power can vary from about 90 watts to about 110 watts; the ESC voltage can be set at about 2500 V; the $O_2$ flow rate can vary between about 30 sccm and about 50 sccm; the $CO_2$ flow rate can vary between about 70 sccm and about 90 sccm; the HBr flow rate can vary between about 25 sccm and about 35 sccm; the top chamber temperature can vary from about 70 degrees Celsius to about 90 degrees Celsius; the chamber wall temperature can vary from about 50 degrees Celsius to about 70 degrees Celsius; the bottom chamber temperature can vary from about 10 degrees Celsius to about 30 degrees Celsius; the temperature at the center of the wafer holder can vary from about 12 degrees Celsius to about 20 degrees Celsius; the temperature at the edge of the wafer holder can vary from about 8 degrees Celsius to about 12 degrees Celsius; the center backside pressure for the wafer holder can vary from about 15 Torr to about 25 Torr; the edge backside pressure for the wafer holder can vary from about 27 Torr to about 33 Torr; and the processing time can vary from about 90 seconds to about 130 seconds.

During TEOS layer contact-etch procedures, the chamber pressure can range from about 35 mT to about 45 mT; the top power can vary from about 550 watts to about 650 watts; the lower power can vary from about 90 watts to about 110 watts; the ESC voltage can be set at about 2500 V; the $CF_4$ flow rate can vary between about 40 sccm and about 60 sccm; the $CHF_3$ flow rate can vary between about 40 sccm and about 60 sccm; the $O_2$ flow rate can vary between about 3 sccm and about 7 sccm; the top chamber temperature can vary from about 30 degrees Celsius to about 90 degrees Celsius; the chamber wall temperature can vary from about 50 degrees Celsius to about 70 degrees Celsius; the bottom chamber temperature can vary from about 30 degrees Celsius to about 50 degrees Celsius; the temperature at the center of the wafer holder can vary from about 25 degrees Celsius to about 35 degrees Celsius; the temperature at the edge of the wafer holder can vary from about 8 degrees Celsius to about 12 degrees Celsius; the center backside pressure for the wafer holder can vary from about 15 Torr to about 25 Torr; the edge backside pressure for the wafer holder can vary from about 27 Torr to about 33 Torr; and the processing time can vary from about 50 seconds to about 90 seconds.

During TEOS OE contact-etch procedures, the chamber pressure can range from about 35 mT to about 45 mT; the top power can vary from about 550 watts to about 650 watts; the lower power can vary from about 90 watts to about 110 watts; the ESC voltage can be set at about 2500 V; the $CF_4$ flow rate can vary between about 40 sccm and about 60 sccm; the $CHF_3$ flow rate can vary between about 40 sccm and about 60 sccm; the $O_2$ flow rate can vary between about 3 sccm and about 7 sccm; the top chamber temperature can vary from about 30 degrees Celsius to about 90 degrees Celsius; the chamber wall temperature can vary from about 50 degrees Celsius to about 70 degrees Celsius; the bottom chamber temperature can vary from about 30 degrees Celsius to about 50 degrees Celsius; the temperature at the center of the wafer holder can vary from about 25 degrees Celsius to about 35 degrees Celsius; the temperature at the edge of the wafer holder can vary from about 8 degrees Celsius to about 12 degrees Celsius; the center backside pressure for the wafer holder can vary from about 15 Torr to about 25 Torr; the edge backside pressure for the wafer holder can vary from about 27 Torr to about 33 Torr; and the processing time can vary from about 5 seconds to about 10 seconds.

During BT contact-etch procedures, the chamber pressure can range from about 8 mT to about 12 mT; the top power can vary from about 600 watts to about 700 watts; the lower power can vary from about 175 watts to about 200 watts; the ESC voltage can be set at about 2500 V; the $CF_4$ flow rate can vary between about 120 sccm and about 150 sccm; the top chamber temperature can vary from about 70 degrees Celsius to about 90 degrees Celsius; the chamber wall temperature can vary from about 50 degrees Celsius to about 70 degrees Celsius; the bottom chamber temperature can vary from about 10 degrees Celsius to about 30 degrees Celsius; the wafer holder temperature can vary from about 60 degrees Celsius to about 70 degrees Celsius; the center backside pressure for the wafer holder can vary from about 8 Torr to about 12 Torr; the edge backside pressure for the wafer holder can vary from about 8 Torr to about 12 Torr; and the processing time can vary from about 5 seconds to about 15 seconds.

During ME contact-etch procedures, the chamber pressure can range from about 8 mT to about 12 mT; the top power can vary from about 120 watts to about 150 watts; the ESC voltage can be set at about 2500 V; the $O_2$ flow rate can vary between about 2 sccm and about 6 sccm; the HBr flow rate can vary between about 220 sccm and about 280 sccm; the top chamber temperature can vary from about 70 degrees Celsius to about 90 degrees Celsius; the chamber wall temperature can vary from about 50 degrees Celsius to about 70 degrees Celsius; the bottom chamber temperature can vary from about 10 degrees Celsius to about 30 degrees Celsius; the wafer holder temperature can vary from about 60 degrees Celsius to about 70 degrees Celsius; the center backside pressure for the wafer holder can vary from about 8 Torr to about 12 Torr; the edge backside pressure for the wafer holder can vary from about 8 Torr to about 12 Torr; and the processing time can vary from about 50 seconds to about 70 seconds.

During OE contact-etch procedures, the chamber pressure can range from about 8 mT to about 12 mT; the top power can vary from about 120 watts to about 150 watts; the lower power can vary from about 20 watts to about 40 watts; the ESC voltage can be set at about 2500 V; the $O_2$ flow rate can vary between about 2 sccm and about 6 sccm; the HBr flow rate can vary between about 220 sccm and about 280 sccm; the top chamber temperature can vary from about 70 degrees Celsius to about 90 degrees Celsius; the chamber wall temperature can vary from about 50 degrees Celsius to about 70 degrees Celsius; the bottom chamber temperature can vary from about 60 degrees Celsius to about 80 degrees Celsius; the wafer holder temperature can vary from about 60 degrees Celsius to about 70 degrees Celsius; the center backside pressure for the wafer holder can vary from about 8 Torr to about 12 Torr; the edge backside pressure for the wafer holder can vary from about 8 Torr to about 12 Torr; and the processing time can vary from about 20 seconds to about 30 seconds.

During TiN contact-etch procedures, the chamber pressure can range from about 8 mT to about 12 mT; the top power can vary from about 180 watts to about 220 watts; the lower power can vary from about 40 watts to about 60 watts; the ESC voltage can be set at about 2500 V; the chlorine ($Cl_2$) flow rate can vary between about 12 sccm and about 18 sccm; the Ar flow rate can vary between about 180 sccm and about 220 sccm; the top chamber temperature can vary from about 70 degrees Celsius to about 90 degrees Celsius; the chamber wall temperature can vary from about 50 degrees Celsius to about 70 degrees Celsius; the bottom chamber temperature can vary from about 60 degrees Celsius to about 80 degrees Celsius; the wafer holder temperature can vary from about 60 degrees Celsius to about 70 degrees Celsius; the center backside pressure for the wafer holder can vary from about 8 Torr to about 12 Torr; the edge backside pressure for the wafer holder can vary from about 8 Torr to about 12 Torr; and the processing time can vary from about 50 seconds to about 80 seconds.

During HK contact-etch procedures, the HK chamber pressure can range from about 8 mT to about 12 mT; the top power can vary from about 550 watts to about 650 watts; the ESC voltage can be set at about 500 V; the Boron Trichloride ($BCl_3$) flow rate can vary between about 120 sccm and about 180 sccm; the top chamber temperature can vary from about 70 degrees Celsius to about 90 degrees Celsius; the chamber wall temperature can vary from about 40 degrees Celsius to about 60 degrees Celsius; the bottom chamber temperature can vary from about 60 degrees Celsius to about 80 degrees Celsius; and the processing time can vary from about 30 seconds to about 40 seconds.

During Ashing procedures, the chamber pressure can range from about 125 mT to about 175 mT; the top power can vary from about 350 watts to about 450 watts; the lower power can vary from about 20 watts to about 30 watts; the ESC voltage can be set at about 2500 V; the $O_2$ flow rate can vary between about 430 sccm and about 470 sccm; the top chamber temperature can vary from about 30 degrees Celsius to about 90 degrees Celsius; the chamber wall temperature can vary from about 50 degrees Celsius to about 70 degrees Celsius; the bottom chamber temperature can vary from about 70 degrees Celsius to about 80 degrees Celsius; the temperature at the center of the wafer holder can vary from about 70 degrees Celsius to about 80 degrees Celsius; the temperature at the edge of the wafer holder can vary from about 8 degrees Celsius to about 12 degrees Celsius; the center backside pressure for the wafer holder can vary from about 15 Torr to about 25 Torr; the edge backside pressure for the wafer holder can vary from about 27 Torr to about 33 Torr; and the processing time can vary from about 150 seconds to about 210 seconds.

During CE-MIMO model development, the number of feed forward and feedback paths actually used in the CE-MIMO can be optimized. DOE techniques can be used to create and/or examine the CE-MIMO models and to develop a reduced set of feed forward and feedback paths/variables.

Figure 8:
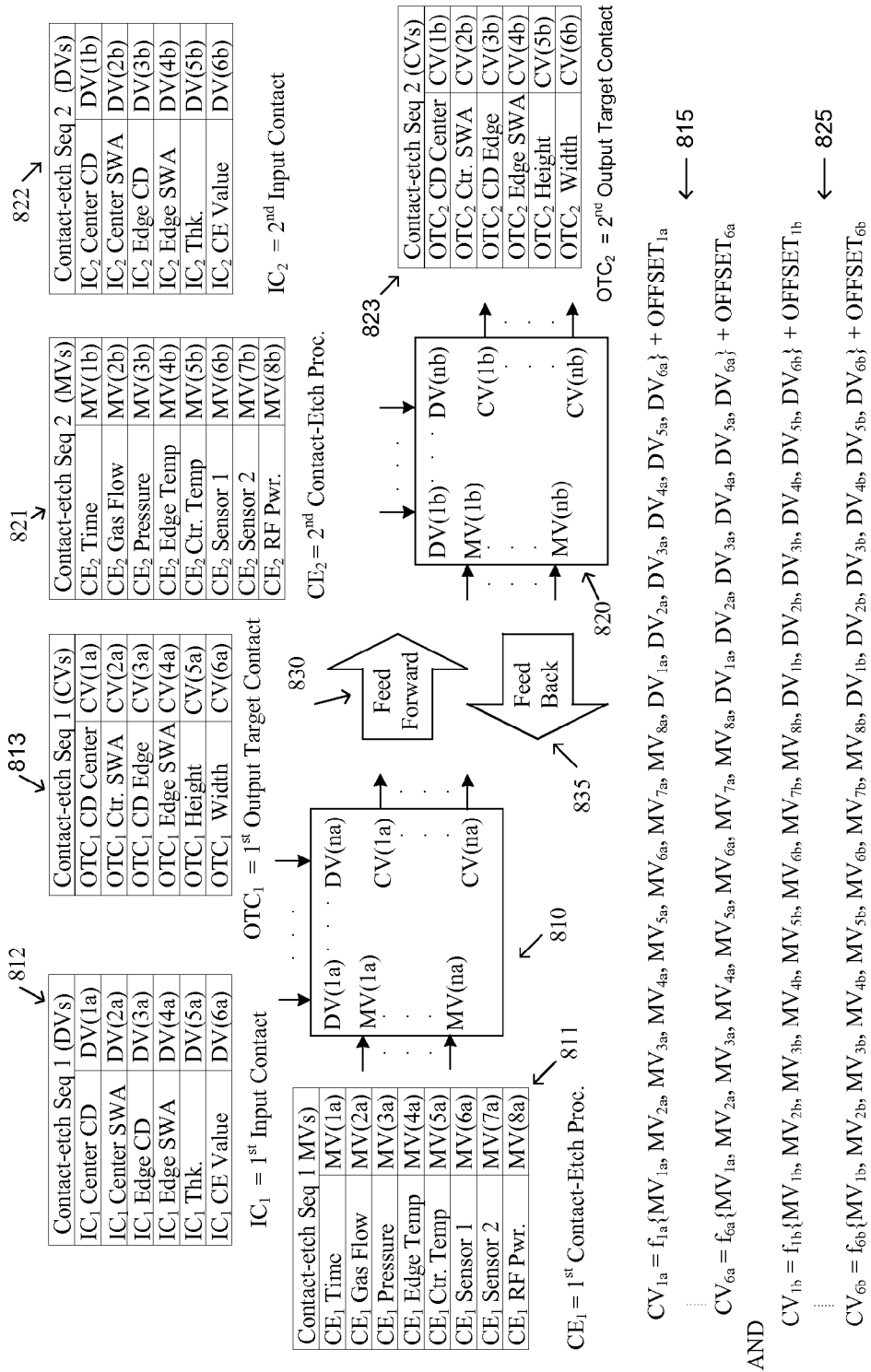
FIG. 8 illustrates an exemplary flow diagram for a procedure for developing a contact-etch Multi-Input/Multi-Output (MIMO) model in accordance with embodiments of the invention.

FIG. 8 illustrates exemplary block diagram for a two-part Contact-Etch Multi-Input/Multi-Output (CE-MIMO) model in accordance with embodiments of the invention.

A first generalized CE-MIMO model 810 is shown that can be associated with a first contact-etch procedure and that includes a first set of manipulated variables MVs(1a-na), a first set of disturbance variables DVs(1a-na), and a first set of controlled variables CVs(1a-na). A first set of exemplary MVs 811 is shown that includes eight manipulated variables $\{(MV_{1a})\text{-}(MV_{8a})\}$ that can be associated with the first CE-MIMO model 810. Alternatively, a different number of different manipulated variables may be associated with the first CE-MIMO model 810. A first set of exemplary DVs 812 is shown that includes six disturbance variables $\{(DV_{1a})\text{-}(DV_{6a})\}$ that can be associated with the first CE-MIMO model 810. Alternatively, a different number of different disturbance variables may be associated with the first CE-MIMO model 810. A first set of exemplary CVs 813 is shown that includes six controlled variables $\{(CV_{1a})\text{-}(CV_{6a})\}$ that can be associated with the first CE-MIMO model 810. Alternatively, a different number of different controlled variables may be associated with the first CE-MIMO model 810. In addition, a first set of exemplary equations 815 is shown that can be associated with the first CE-MIMO model 810. Alternatively, other equations may be associated with the first CE-MIMO model 810.

A second generalized CE-MIMO model 820 is shown that can be associated with a second contact-etch procedure and that includes a second set of manipulated variables MVs(1b-nb), a second set of disturbance variables DVs(1b-nb), and a second set of controlled variables CVs(1b-nb). A second set of exemplary MVs 821 is shown that includes eight manipulated variables $\{(MV_{1b})\text{-}(MV_{8b})\}$ that can be associated with the second CE-MIMO model 820. Alternatively, a different number of different manipulated variables may be associated with the second CE-MIMO model 820. A second set of exemplary DVs 822 is shown that includes six disturbance variables $\{(DV_{1b})\text{-}(DV_{6b})\}$ that can be associated with the second CE-MIMO model 820. Alternatively, a different number of different disturbance variables may be associated with the second CE-MIMO model 820. A second set of exemplary CVs 823 is shown that includes six controlled variables $\{(CV_{1b})\text{-}(CV_{6b})\}$ that can be associated with the second CE-MIMO model 820. Alternatively, a different number of different controlled variables may be associated with the second CE-MIMO model 820. In addition, a second set of exemplary equations 825 is shown that can be associated with the second CE-MIMO model 820. Alternatively, other equations may be associated with the second CE-MIMO model 820.

One or more of the variables (811, 812, or 813) associated with the first CE-MIMO model 810 can be fed forward 830 to the second CE-MIMO model 820, and one or more of the second variables (821, 822, or 823) associated with the second CE-MIMO model 820 can be fed back 835 to the first CE-MIMO model 810.

Figure 9:
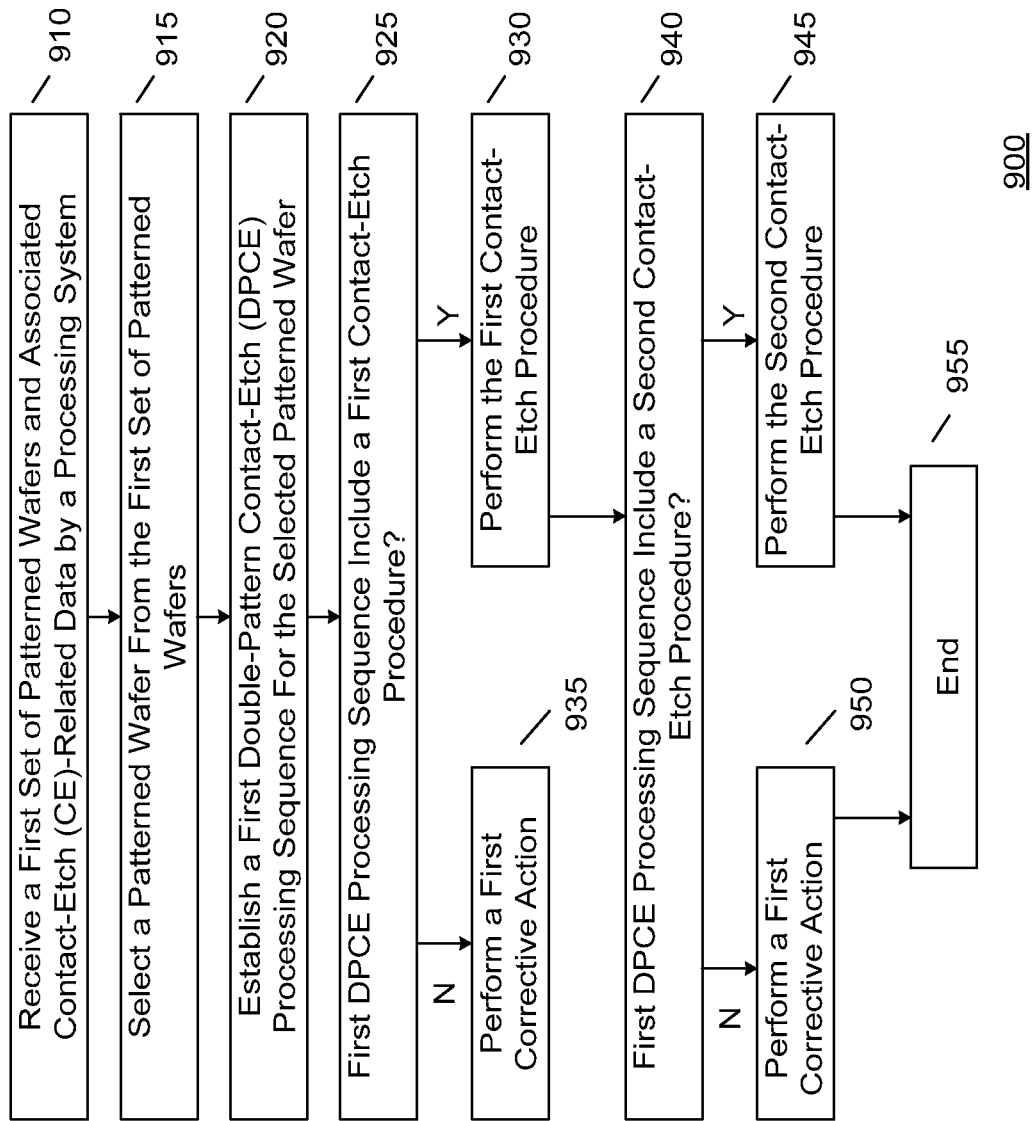
FIG. 9 illustrates a simplified flow diagram of a method for processing wafers using an IE-related process sequence in accordance with embodiments of the invention.

FIG. 9 illustrates an exemplary flow diagram for a procedure for developing Contact-Etch-Multi-Input/Multi-Output (CE-MIMO) models for contact-etch procedures in accordance with embodiments of the invention. In the illustrated embodiment, a procedure 900 is shown having a number of steps. Alternatively, a different number of alternate steps may be used.

In 910, one or more contact-etch procedures can be identified as candidates for a CE-MIMO modeling analysis procedure. In some examples, one or more contact-etch procedures and associated MIMO models can be established to create one or more patterned wafers (500a and 500b, FIGS. 5), or (500c and 500d, FIG. 5'), or (600a and 600b, FIGS. 6), or (600c and 600d, FIG. 6'), or (700a, and 700b, FIG. 7).

In 915, a first set of controlled outputs variables (CVs) and the ranges associated with the CVs can be determined. One or more of the CVs can be specified by an end user or a customer. The CVs can include one or more critical dimensions (CDs) and/or one or more side wall angles associated with one or more of the transistor stacks (501a, 502a, 501b, and 502b) shown in FIG. 5 or transistor stacks (501c, 502c, 501d, and 502d) shown in FIG. 5' or with one or more of the transistor stacks (601a, 602a, 601b, and 602b) shown in FIG. 6 or with one or more of the transistor stacks (601c, 602c, 601d, and 602d) shown in FIG. 6', or with one or more of the transistor stacks (701a, 702a, 701b, and 702b) shown in FIG. 7. In some examples, the first and second contact-etch procedures can be performed to create contacts in pFET devices, nFET devices, Tri-gate devices, and/or FinFET devices.

In 920, a first set of candidates can be determined for the manipulated variables (MVs) associated with the CE-MIMO using one or more candidate contact-etch procedures/recipes. The MVs can include WiW manipulated variables (WiW-MVs), and the WiW-MVs can include "fast" MVs that can be controlled while a wafer is being processed. The MVs can include W2W manipulated variables (W2W-MVs), and the W2W-MVs can include "slow" MVs that can be controlled when a wafer lot is being processed. The ranges for the MVs can be examined for each step in a candidate recipe.

When a two-zone wafer holder with a fast response time is used, the center temperature and the edge temperature for the wafer holder can be used as (WiW-MVs) and can be changed on a systematic basis. When a RF source with a fast response time is used with a split upper electrode and power splitter, the center RF power and the edge RF power for the plasma can be used as (WiW-MVs) and can be changed on a systematic basis. When a low temperature chiller (−10° C.) is used, there can be a larger temperature delta center to edge. In addition, pressure, time, and gas flows can be used as MVs.

The disturbance variables (DVs) can include CD and SWA values for a first input contact $(IC_1)$ at the center and edge, the control layer CD and SWA at the center and edge, the feature thicknesses at the center and edge, the chemical and etch rate properties of the different layers, the maintenance events on chamber, the chamber-to-chamber data, the input IE values, and other stack data.

In 925, Design of Experiment (DOE) procedures can be performed to analyze the contact-etch procedure and/or the CE-MIMO model. Using CE-sensor data and/or process sensor data from DOE wafers, contact-etch-related experiments can be performed to establish statistical models that can connect MVs with each CV. When the number of experiments increases, a more accurate model can be obtained, but at the expense of additional materials and time. Therefore, cost and availability can limit the number of procedures performed using IE-sensor wafers and/or the number of DOE wafers processed in processing chambers. A critical factor for DOE procedures is the format of the predicted model. One or more model types can be selected, ranges can be provided for the CVs and/or MVs, and statistical software, such as JMP® statistical software from the SAS Institute) can be used to establish one or more of the DOE tables). The DOE data can be used to establish candidate MVs, CVs, and DVs that can be associated with a first, second, and/or third contact-etch procedures. In other analysis procedures, other MVs, DVs, and CVs can be used. In some embodiments, the chamber state data for the etching chambers and the IM chambers can be used as manipulated variables. Alternatively, the process modeling may assume that the chamber state is stable between wafers and/or lots.

In some examples, the contact-etch procedure can include a Si-ARC layer etch procedure, an IDL layer etch procedure, a TEOS layer etch procedure, a TEOS Over-Etch (OE) etch procedure, and an ashing procedure. In other examples, the DPCE processing sequence can include a "Break-Though" (BT) etch procedure, a Main-Etch (ME) etch procedure, an Over-Etch (OE) etch procedure, a Titanium Nitride (TiN) etch procedure, and a HK etch procedure. The DOE data obtained for the contact-etch procedures and/or DPCE processing sequences can include CE-sensor data, process sensor data, and IE-sensor wafer data.

In 930, after performing the first contact-etch procedures and/or the second contact-etch procedures required to populate one or more DOE tables, nonlinear models with quadratic and interaction terms can be created by using a least squares technique and statistical software. In some models, terms can be deleted that have extremely small coefficients associated with them.

In 935, one or more linear gain matrices (G) can be created using the DOE data. For example, a Relative Gain Array (RGA) matrix can created using:

$$\lambda ij = \frac{\left[\frac{\partial CV_i}{\partial MV_j}\right]_{MV_{k,k \neq j}}}{\left[\frac{\partial CV_i}{\partial MV_j}\right]_{CV_{k,k \neq j}}} = \frac{\text{Gain(open - loop)}}{\text{Gain(closed - loop)}}$$

for i=1, 2, ..., n and j=1, 2, ..., n.

The symbol $(\partial CV_i/\partial MV_j)_{MV}$ denotes a partial derivative that is evaluated with all of the manipulated variables except $MV_j$ held constant, and this term is the open-loop gain between $CV_i$ and $MV_j$. In addition, the symbol $(\partial CV_i/\partial MV_j)_{CV}$ can be interpreted as a closed loop gain that indicates the effect of $MV_j$ and $CV_i$ when all of the control loops are closed.

When a non-square matrix is obtained, some of the MVs or CVs may be eliminated to create a square matrix. In addition, when there are more MV's than CVs, the non-square matrix can be analyzed using a non-square RGA (NRGA). For example, $$NRGA = G \otimes (G^+)^T$$

and the pseudo-inverse, $G^+$, is used instead of the normal inverse, $G^{-1}$. NRGA provides several criteria for the selection of a square system, but their criteria are not always valid in some non-square systems, so all combinations of square pairing of subsystems might need considered. To compare one subsystem with others RGA pairing rules can be used as a metric. This creates sub combinations that can then be compared for best square matrix.

In 940, one or more RGAs can be calculated using one or more of the linear gain matrices (G). For example, when square matrices are used, $$RGA = G \otimes (G^{-1})^T$$

where G is the gain matrix and $G^{-1}$ is the inverse gain matrix.

In 945, pairing rules in the RGA can be used to investigate the best combinations of MVs and CVs. RGA analysis can be used for measured model parameter selection, and CV-MV pairs can be selected such that their sum is closest to one. In addition, paring on negative elements can be avoided. In addition, the RGA analysis can be used to determine a number of candidate models and to identify the best-case solution. When there are more CVs than MVs, RGA analysis can be used for selecting the most controllable CV (sensitivity analysis of CVs to MVs).

In 950, the system stability and conditioning can be determined. For example, the Niederlinski Stability Theorem states that a closed loop system resulting from diagonal pairing is unstable if:

$$NST = \frac{det(G)}{\prod_{i=1}^{n} g_{ii}} < 0$$

where NST is the Niederlinski index, G is the gain matrix, det(G) is the determinant of the gain matrix (G), and $g_{ii}$ is the diagonal elements of the gain matrix. The condition of the gain matrix (G) can be determined using the following:

$$G = USV^T$$

where G, U, S, and V are matrices determined using singular value decomposition (SVD). In addition, a condition number (CN) can be determined using the ratio of the larger value to the smaller value in the S matrix. Additional information concerning the Niederlinski Theorem may be found in a book (ISBN 978047001168-3) entitled "Multivariable Feedback Control: Analysis and Design" by Sigurd Skogestad and Ian Postlethwaite from which pages (75-86) and pages (431-449) are incorporated herein in their entirety. For example, when CN is greater than fifty, the system is nearly singular and will have poor control performance.

In 955, the CE-MIMO model can be optimized using actual equipment and/or performance constraints. In some examples, the measurement locations can be examined and selected to optimize performance, the number of pre- and/or post measurement procedure can be established to optimize performance, and the multi-chamber sequences can be examined to optimize throughput. The feedback can be optimized by tuning the EWMA filters. The time constants for the MVs can be determined, and their update frequency can be based on Lot-to-Lot (L2L), W2W, WiW, and process step values. In addition, process center points, CV center points, and MV center points can be examined to optimize performance. Historical data can be used to perform simulations.

The wafers can include one or more layers that can include semiconductor material, carbon material, dielectric material, glass material, ceramic material, metallic material, oxidized material, mask material, or planarization material, or a combination thereof.

In other embodiments, one or more IE-sensor wafers can be processed to verify a CE-MIMO model and/or to verify a contact-etch procedure. When an contact-etch sequence or MIMO model is verified, one or more contacts (575b, 575d, 675b, and 675d) can be created on a test wafer, and when the test wafer is examined. During the examination, measurement data can be obtained from the contacts (575b, 575d, 675b, and 675d). A best estimate contact and associated best estimate data can be selected from the CE-MIMO library that includes verified transistor structures, verified contacts, and associated data. One or more differences can be calculated between the contacts (575b, 575d, 675b, and 675d) and the best estimate contact from the library, the differences can be compared to matching criteria, creation criteria, or product requirements, or any combination thereof. When matching criteria are used, the contacts (575b, 575d, 675b, and 675d) can be identified as members of the CE-MIMO library, and the test wafer can be identified as a reference "golden" wafer if the matching criteria are met or exceeded. When creation criteria are used, the contacts (575b, 575d, 675b, and 675d) can be identified as a new member of the CE-MIMO library, and the test wafer can be identified as a verified reference wafer if the creation criteria are met. When product requirements data are used, the contacts (575b, 575d, 675b, and 675d) can be identified as verified contacts, and the test wafer can be identified as verified production wafer if one or more product requirements are met. Corrective actions can be applied if one or more of the criteria or product requirements are not met. CE-MIMO confidence data and/or risk data can be established for the contacts (575b, 575d, 675b, and 675d) using the measurement data and the best estimate contact data. For example, the CE-MIMO evaluation library data can include goodness of fit (GOF) data, creation rules data, measurement data, inspection data, verification data, map data, confidence data, accuracy data, process data, or uniformity data, or any combination thereof.

When the contacts (575b, 575d, 675b, and 675d) are produced and/or examined, accuracy and/or tolerance limits can be used. When these limits are not correct, refinement procedures can be performed. Alternatively, other procedures can be performed, other sites can be used, or other wafers can be used. When a refinement procedure is used, the refinement procedure can utilize bilinear refinement, Lagrange refinement, Cubic Spline refinement, Aitken refinement, weighted average refinement, multi-quadratic refinement, bi-cubic refinement, Turran refinement, wavelet refinement, Bessel's refinement, Everett refinement, finite-difference refinement, Gauss refinement, Hermite refinement, Newton's divided difference refinement, osculating refinement, or Thiele's refinement algorithm, or a combination thereof.

When CE-related data is collected, a number of verification wafers and/or IE-sensor wafers can be used and candidate disturbance variables can be identified. During data collection, the variations associated with one or more CVs can be minimized, and the collected data can be used for a simulation. The simulation can execute the same process steps as the contact-etch procedures used in production. For example, one or more of the processed wafers can be measured in an integrated metrology chamber and the IM data can include CD and SWA data from multiple sites in a patterned masking layer on each incoming wafer. In addition, IE-sensor data, process sensor data, and/or other sensor data can be received and analyzed. Grating density and transistor type should be selected to correlate to the most critical chip level performance metric (such as P or N channel transistor type) because each of the transistor structures can have some variations that can be related to the etch profile control needs.

Figure 10:
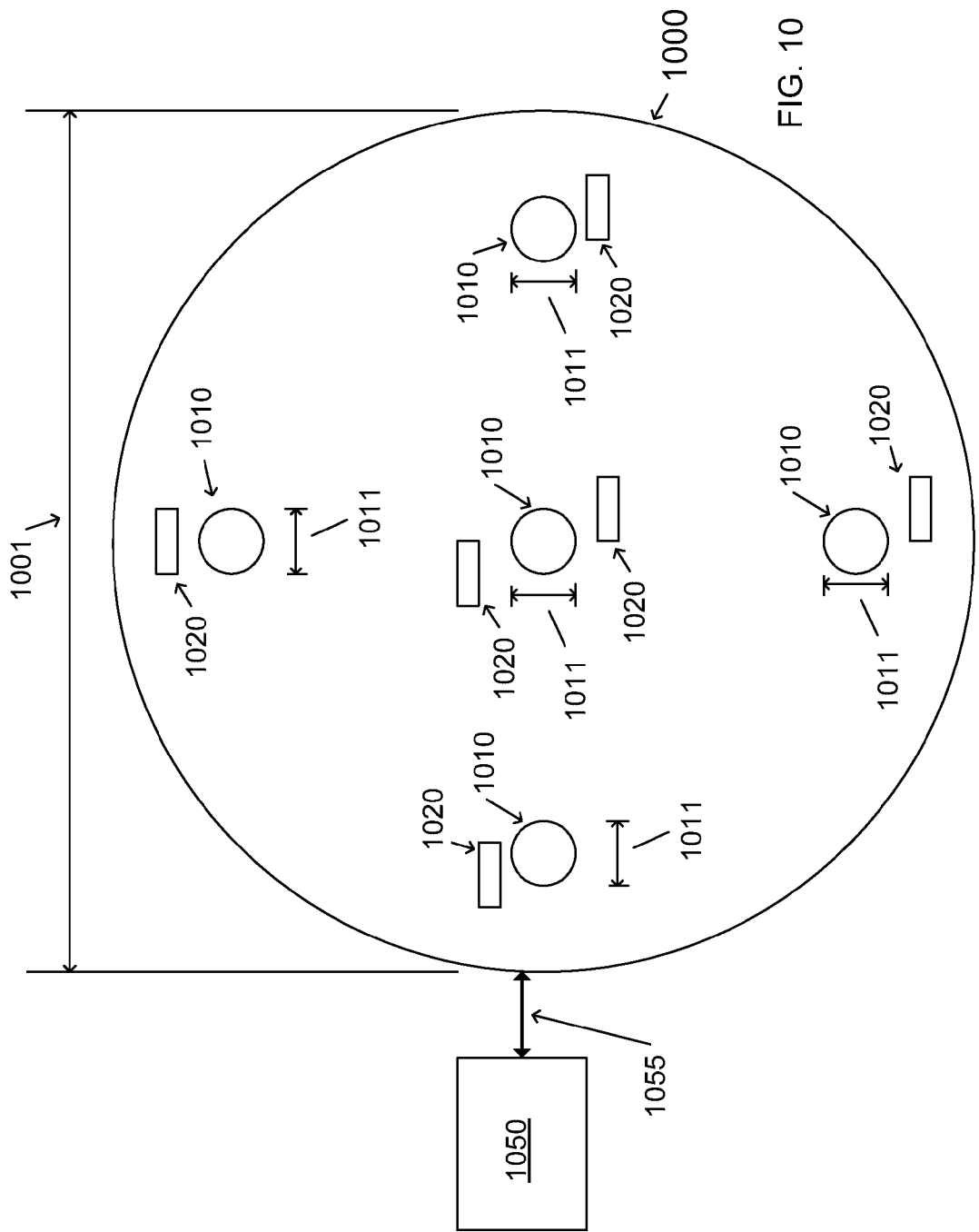
FIG. 10 illustrates an exemplary block diagram for an Ion Energy (IE) sensor wafer in accordance with embodiments of the invention.

FIG. 10 illustrates an exemplary block diagram for an Ion Energy (IE) sensor wafer in accordance with embodiments of the invention. In the illustrated embodiment, a top view of IE-sensor wafer 1000 is shown. The IE-sensor wafer 1000 can have a first diameter 1001 of about 300 millimeters (mm). Alternatively, the diameter 1001 can be smaller or larger.

The IE-sensor wafer 1000 can include one or more ion energy analyzers 1010 configured at one or more first locations within the IE-sensor wafer 1000. For example, the IE-sensor wafer 1000 and methods for using it can be as described in U.S. Pat. No. 7,777,179, entitled "Two-Grid Ion Energy Analyzer and Methods of Manufacturing and Operating", by Chen, et al., issued on Aug. 17, 2010, and this patent is incorporated in its entirety herein by reference. Additional the IE-sensor wafers and methods for using can be as described in U.S. Pat. No. 7,875,859, entitled "Ion Energy Analyzer and Methods of Manufacturing and Operating", by Chen, et al., issued on Jan. 25, 2011, and this patent is incorporated in its entirety herein by reference. A top view of the ion energy analyzers 1010 are shown, and the ion energy analyzers 1010 can include a circular opening having a second diameter 1011. The second diameter 1011 can vary from about 10 mm to about 50 mm.

A controller 1050 is shown in FIG. 10 and a signal bus 1055 can be used to electrically couple the controller 1050 to the IE-sensor wafer 1000. For example, the controller 1050 can exchange IE-related data with one or more of the ion energy analyzers 1010 using the signal bus 1055.

In some embodiments, the ion energy analyzer 1010 can be used for determining the ion energy distribution (IED) of ions incident on a radio frequency (RF) biased wafer/substrate immersed in plasma. The ion energy analyzer 1010 can include an entrance grid (not shown) exposed to the plasma, an electron rejection grid (not shown) disposed proximate to the entrance grid, and an ion current collector (not shown) disposed proximate to the electron rejection grid. The ion current collector can be coupled to an ion selection voltage source, configured in the controller 1050, and configured to positively bias the ion current collector by an ion selection voltage, and the electron rejection grid can be coupled to an electron rejection voltage source, configured in the controller 1050, and configured to negatively bias the electron rejection grid by an electron rejection voltage. In addition, an ion current meter, configured in the controller 1050, can be coupled to the ion current collector to measure the ion current.

A plurality of test chips 1020 can be removably coupled at one or more second locations on the top surface of the IE-sensor wafer 1000, and the second locations can be proximate to the first locations. For example, the test chips 1020 can include one or more of the exemplary patterned wafers (500a, and 500b) having exemplary transistor stacks (501a, 502a, 501b, and 502b) thereon, or one or more of the exemplary patterned wafers (500c, and 500d) having exemplary transistor stacks (501c, 502c, 501d, and 502d) thereon that can be created using a first DPCE processing sequence. In addition, the test chips 1020 can include one or more of the second exemplary patterned wafers (600a, and 600b) having exemplary transistor stacks (601a, 602a, 601b, and 602b) thereon, or one or more of the exemplary patterned wafers (600c, and 600d) having exemplary transistor stacks (601c, 602c, 601d, and 602d) thereon that can be created using a second DPCE processing sequence. Furthermore, the test chips 1020 can include one or more of the third exemplary patterned wafers (700a, and 700b) having exemplary transistor stacks (701a, 702a, 701b, and 702b) thereon that can be created using a third DPCE processing sequence.

Figure 11:
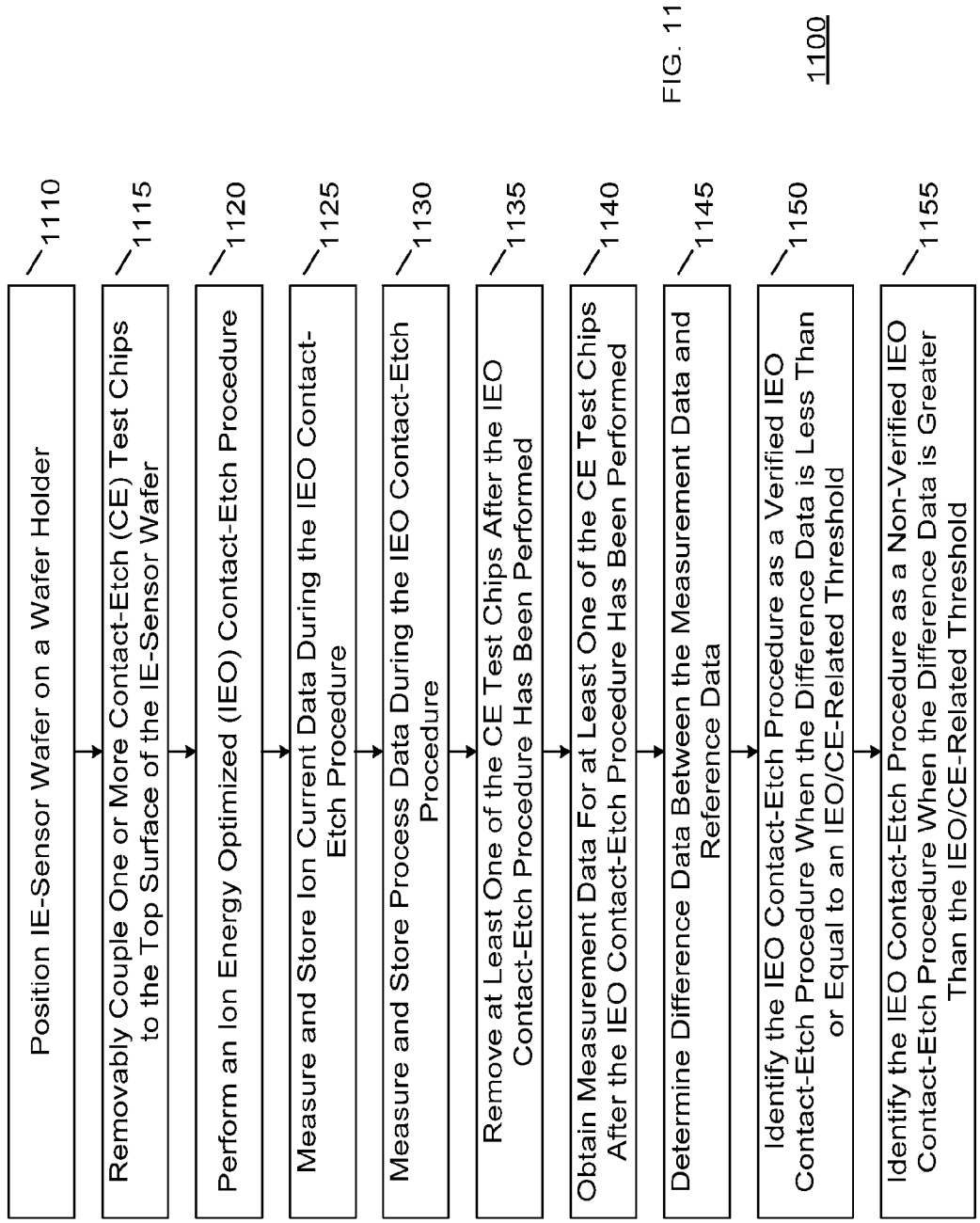
FIG. 11 illustrates a method for using an IE-sensor wafer in accordance with embodiments of the invention.
Figure 12:
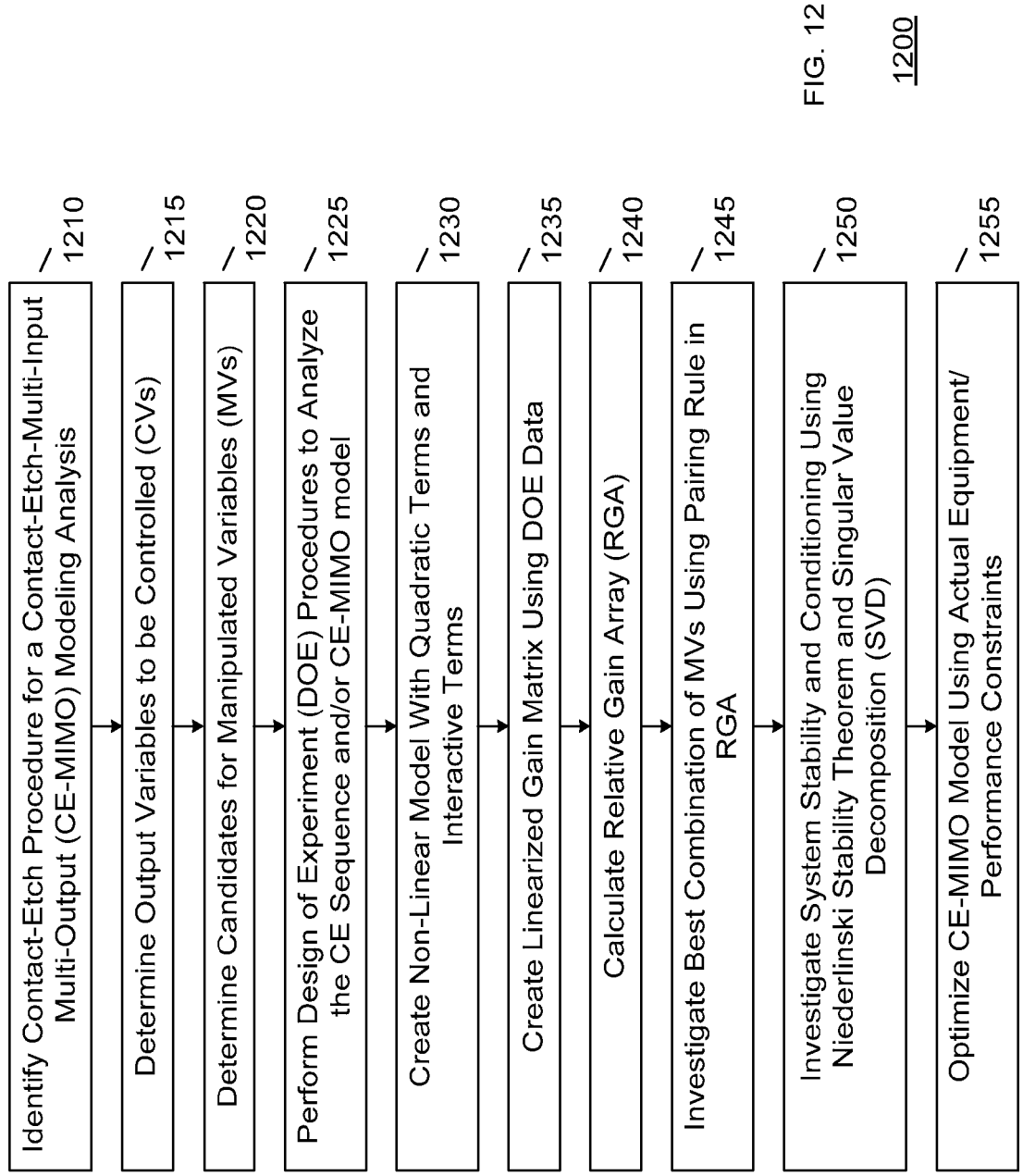
FIG. 12 illustrates a method for contact etch in accordance with embodiments of the invention.

FIG. 11 illustrates a method for using an IE-sensor wafer to obtain data for contact-etch procedures in accordance with embodiments of the invention.

In 1110, an IE-sensor wafer 1000 can be positioned on a wafer holder (220, FIG. 2 or 320, FIG. 3) in a process chamber (210, FIG. 2 or 310, FIG. 3) configured in a contact-etch subsystem shown in FIGS. 2A-2G or FIGS. 3A-3G.

In 1115, one or more test chips 1020 can be removably coupled at one or more second locations on the top surface of the IE-sensor wafer 1000, and the second locations can be proximate to the first locations. For example, the test chips 1020 can include one or more of the exemplary patterned wafers (500a, and 500b) having exemplary transistor stacks (501a, 502a, 501b, and 502b) thereon, or one or more of the exemplary patterned wafers (500c, and 500d) having exemplary transistor stacks (501c, 502c, 501d, and 502d) thereon that can be created using a first DPCE processing sequence. In addition, the test chips 1020 can include one or more of the second exemplary patterned wafers (600*a*, and 600*b*) having exemplary transistor stacks (601*a*, 602*a*, 601*b*, and 602*b*) thereon, or one or more of the exemplary patterned wafers (600*c*, and 600*d*) having exemplary transistor stacks (601*c*, 602*c*, 601*d*, and 602*d*) thereon that can be created using a second DPCE processing sequence. Furthermore, the test chips 1020 can include one or more of the third exemplary patterned wafers (700*a*, and 700*b*) having exemplary transistor stacks (701*a*, 702*a*, 701*b*, and 702*b*) thereon that can be created using a third DPCE processing sequence.

In 1120, an (Ion Energy Optimized) IEO-etch procedure can be performed in which an (Ion Energy Optimized) IEO-plasma is created in at least one of the process chambers (210, FIG. 2 or 310, FIG. 3).

In 1125, when the ion energy analyzers 1010 configured in the IE-sensor wafer 1000 comprise ion current collectors the ion current received by the ion current collector can be measured by the controller 1050, and the ion current can stored as a function of the ion selection voltage on the ion selection grid. For example, the ion current collector can provide a dual function of receiving ion current for measurement and selecting the ions that contribute to the received ion current.

When the ion energy analyzer 1010 includes an entrance grid, the entrance grid can be exposed to plasma at a floating DC potential. When the ion energy analyzer 1010 includes an electron rejection grid proximate to the entrance grid, the electron rejection grid can be biased with a negative DC voltage to reject electrons from the plasma. When the ion energy analyzer 1010 includes an ion current collector proximate to the electron rejection grid, the ion current collector can be biased with a positive DC voltage, from the controller 1050, to discriminate between ions reaching the ion current collector. When the IEO-plasma is created, one or more selected ion currents at the ion current collector can be measured by the controller 1050. For example, the selected ion current can be stored, by the controller 1050, as a function of the positive DC voltage on the ion current collector, and the positive DC voltage on the ion current collector can be varied. Then, the stored ion current data as a function of the ion selection voltage may be integrated, by the controller 1050, to determine an IED to associate with the test circuit.

In 1130, process data can be measured and stored during the IEO-etch procedure. For example, one or more process sensors (236, FIG. 2) or (336, FIG. 3) can be coupled to process chamber (210, FIG. 2) or (310, FIG. 3) to obtain performance data, and controller 1050 can be coupled to the process sensors (236, FIG. 2) or (336, FIG. 3) to receive and analyze the performance data.

In 1135, one or more of the test chips 1020 can be removed from the IE-sensor wafer after the IEO-etch procedure has been performed.

In 1140, measurement data can be obtained for one or more of the test chips 1020 after the test chip 102 has been removed from the IE-sensor wafer and the IEO-etch procedure has been performed. For example, Critical Dimension—Scanning Electron Microscopy (CD-SEM) data can be obtained, ODP data can be obtained, and Transmission Electron Microscopy (TEM) data can be obtained.

In 1145, IE-related difference data can be determined using the measurement data and IE-related reference data. For example, the IE-related reference can be obtained from an IE-related data library.

In 1150, the process recipe associated with the IEO-etch procedure can be identified as a verified IEO-process recipe when the difference data is less than or equal to an IEO-related threshold.

In 1155, the process recipe associated with the IEO-etch procedure can be identified as a non-verified IEO-process recipe when the difference data is greater than the IEO-related threshold.

The CD DV can be a critical DV and can have associated DVs that modify the measurement due to the mechanisms at work during the DPCE processing sequences. SWA can be a primary modifier that increases in sensitivity as the angle become less than ninety degrees. In addition, the middle CD can be used if it gives the most accurate correlation to the final CD. Middle CD performs the best in simple terms because it averages the variation of the top and bottom CD measurements.

A second modifier of CD can be the BARC thickness variation across the wafer and water-to-wafer. BARC thickness can affect CD if the thickness is non-uniform because during the BARC etch the resist is continuing to be etched. A thinner BARC can give a shorter etch time, and thicker BARC can give a longer etch time, and a longer etch time will result in a smaller CD. Therefore, BARC non-uniformity can directly result in increased center to edge CD variation that will need to be modeled for control during the partial and final etch.

The IM data can be fed forward to one or more optimization controllers to calculate the value of manipulated variables (MV). The nonlinear model formulas associated with each controlled variable (CV) can be used with each CV target value. A quadratic objective function can utilize weighting factors to prioritize each CV term in the objective function, and an optimizer in the MIMO can be used to determine etch recipe by minimizing or maximizing the objective function with the constraints of MVs using nonlinear programming.

In some examples, one or more of the wafers can be processed using the adjusted recipes. For example, the adjusted recipes can include optimized MVs from the optimizer for the DPCE processing sequence. Then, measurement data can be obtained for one or more of the processed wafers. For example, measurements can be made at one or more sites on the wafer. The output CVs can be measured using the IM tool after the first DPCE processing sequence is performed and/or after the second DPCE processing sequence is performed. The data obtained from the DPCE processing sequences can be filtered and/or qualified. In addition, process errors can be calculated for the DPCE processing sequence. For example, errors (actual outputs minus model outputs) can be calculated for each CV. Next, feedback data items can be calculated for the DPCE processing sequence, and errors can be used to update the MIMO model CVs offsets using an exponentially weighted moving average (EWMA) filter. Then, new model offsets can be updated for the DPCE processing sequence and these offset values can be provided to the optimization controller to be used for compensating the disturbance for next run. For example, this offset can be used until a new update is calculated, and this procedure can be performed until the final patterned wafer is processed.

When send-ahead wafer are used, IM data can be obtained at intermediate points in the DPCE processing sequence. When new and/or additional measurement data, inspection data, and/or evaluation data is required, additional IM data can be obtained from one or more sites on the wafer. For example, measurement structures, such as periodic gratings, periodic arrays, and/or other periodic structures, on a wafer can be measured at one or more sites.

In some embodiments, the historical and/or real-time data can include IE maps, wafer-related maps, process-related maps, damage-assessment maps, reference maps, measurement maps, prediction maps, risk maps, inspection maps, verification maps, evaluation maps, particle maps, and/or confidence map(s) for one or more wafers. In addition, some IEO-etch procedures may use wafer maps that can include one or more Goodness Of Fit (GOF) maps, one or more thickness maps, one or more gate-related maps, one or more Critical Dimension (CD) maps, one or more CD profile maps, one or more material related maps, one or more structure-related maps, one or more sidewall angle maps, one or more differential width maps, or a combination thereof.

When wafer maps are created and/or modified, values may not be calculated and/or required for the entire wafer, and a wafer map may include data for one or more sites, one or more chip/dies, one or more different areas, and/or one or more differently shaped areas. For example, a processing chamber may have unique characteristics that may affect the quality of the processing results in certain areas of the wafer. In addition, a manufacturer may allow less accurate process and/or evaluation data for chips/dies in one or more regions of the wafer to maximize yield. When a value in a map is close to a limit, the confidence value may be lower than when the value in a map is not close to a limit. In addition, the accuracy values can be weighted for different chips/dies and/or different areas of the wafer. For example, a higher confidence weight can be assigned to the accuracy calculations and/or accuracy data associated with one or more of the previously used evaluation sites.

In addition, process result, measurement, inspection, verification, evaluation, and/or prediction maps associated with one or more processes may be used to calculate a confidence map for a wafer. For example, values from another map may be used as weighting factors.

Although only certain embodiments of this invention have been described in detail above, those skilled in the art will readily appreciate that many modifications are possible in the embodiments without materially departing from the novel teachings and advantages of this invention. Accordingly, all such modifications are intended to be included within the scope of this invention.

Thus, the description is not intended to limit the invention and the configuration, operation, and behavior of the present invention has been described with the understanding that modifications and variations of the embodiments are possible, given the level of detail present herein. Accordingly, the preceding detailed description is not mean or intended to, in any way, limit the invention—rather the scope of the invention is defined by the appended claims.

What is claimed:

1. A method for processing a wafer comprising:
   receiving, by a processing system, a first set of patterned wafers and associated contact-etch (CE) data, each patterned wafer having a plurality transistor stacks and a plurality of additional layers thereon;
   selecting a first patterned wafer from the first set of patterned wafers;
   establishing a first double-pattern-contact-etch (DPCE) processing sequence for the selected first patterned wafer using the CE data;
   determining if the first DPCE processing sequence includes a first contact-etch procedure;
   performing the first contact-etch procedure when the first DPCE processing sequence includes the first contact-etch procedure, wherein a second set of patterned wafers is created when the first contact-etch procedure is performed using the first set of patterned wafers;
   performing a first corrective action when the first DPCE processing sequence does not include the first contact-etch procedure;
   determining if the first DPCE processing sequence includes an Ion Energy Optimized (IEO)-etch procedure;
   performing the IEO-etch procedure when the first DPCE processing sequence includes the IEO-etch procedure, wherein the IEO-etch procedure uses a new etch subsystem having a new process chamber configured therein; and
   performing a new corrective action when the first DPCE processing sequence does not include the IEO-etch procedure.

2. The method of claim 1, further comprising:
   positioning the selected patterned wafer on a first wafer holder in a first process chamber;
   creating a first contact-etch plasma in the first process chamber;
   processing the selected patterned wafer using the first contact-etch plasma; and
   obtaining first process sensor data while the selected patterned wafer is processed, wherein a first process sensor is coupled to the first process chamber and is configured to obtain the first process sensor data.

3. The method of claim 2, wherein performing the IEO-etch procedure comprises:
   positioning the selected patterned wafer on a wafer holder in a process chamber;
   creating an IEO-etch plasma in the process chamber;
   processing the selected second patterned wafer using the IEO-etch plasma; and
   obtaining process sensor data while the selected patterned wafer is processed, wherein a second process sensor is coupled to the process chamber and is configured to obtain the process sensor data.

4. The method of claim 2, wherein creating the first contact-etch plasma comprises:
   establishing a first chamber pressure in the first process chamber, wherein the first chamber pressure ranges from about 12 mT to about 18 mT;
   establishing a first edge temperature and a first center temperature for the first wafer holder, the first center temperature being between about 12 degrees Celsius and about 20 degrees Celsius, the first edge temperature being between about 8 degrees Celsius and about 12 degrees Celsius;
   establishing a first edge backside pressure and a first center backside pressure using a dual backside gas system in the first wafer holder, the first center backside pressure being between about 15 Torr and about 25 Torr, the first edge backside pressure being between about 27 Torr and about 33 Torr;
   providing a first process gas into the first process chamber during the first time, wherein the first process gas includes $CF_4$ and $CHF_3$, a $CF_4$ flow rate varying between about 60 sccm and about 100 sccm and a first $CHF_3$ flow rate varying between about 40 sccm and about 60 sccm, wherein a gas plenum in the first process chamber is configured to provide the first process gas to one or more areas of a processing region;
   providing a first radio frequency (RF) power to a center region in the first process chamber and providing a second RF power to an edge region in the first process chamber using a first power splitter coupled to two upper electrodes in the first process chamber, wherein a first RF source is coupled to the first power splitter, the first RF source operating in a frequency range from about 0.1 MHz. to about 200 MHz, the first RF power ranging from about 450 watts to about 550 watts and the second RF power ranging from about 10 watts to about 100 watts during the first time; and providing a lower radio frequency (RF) power to a lower electrode in the first wafer holder using an RF generator and an impedance match network, the RF generator operating in a first frequency range from about 0.1 MHz. to about 200 MHz, the lower RF power ranging from about 90 watts to about 110 watts during the first time.

5. The method of claim 1, wherein performing the first corrective action comprises:

selecting a new patterned wafer from the first set of patterned wafers;

positioning the new patterned wafer on a new wafer holder in a new process chamber;

creating a new contact-etch plasma in the new process chamber;

processing the new patterned wafer using the new contact-etch plasma; and obtaining new process sensor data while the new patterned wafer is processed, wherein a new process sensor is coupled to the new process chamber and is configured to obtain the new process sensor data.

6. The method of claim 1, further comprising:

determining if the first DPCE processing sequence includes a second contact-etch procedure;

performing the second contact-etch procedure when the first DPCE processing sequence includes the second contact-etch procedure, wherein the second contact-etch procedure uses a second etch subsystem having a second process chamber configured therein; and performing a second corrective action when the first DPCE processing sequence does not include the second contact-etch procedure.

7. The method of claim 6, wherein performing the second contact-etch procedure comprises:

selecting an etched patterned wafer from a first set of etched patterned wafers; positioning the selected etched patterned wafer on a second wafer holder in the second process chamber;

creating a second contact-etch plasma in the second process chamber; processing the selected etched patterned wafer using the second contact-etch plasma; and obtaining second process sensor data while the selected etched patterned wafer is processed, wherein a second process sensor is coupled to the second process chamber and is configured to obtain the second process sensor data.

8. The method of claim 6, wherein performing the second corrective action comprises:

selecting a new patterned wafer from the first set of patterned wafers;

positioning the new patterned wafer on a new wafer holder in a new process chamber;

creating a new contact-etch plasma in the new process chamber;

processing the new patterned wafer using the new contact-etch plasma; and obtaining new process sensor data while the new patterned wafer is processed, wherein a new process sensor is coupled to the new process chamber and is configured to obtain the new process sensor data.

9. The method of claim 8, further comprising:

determining if the second (DPCE) sequence includes a new first contact-etch (CE) procedure;

performing the new first CE procedure when the second (DPCE) sequence includes the new first CE procedure, wherein the new first CE procedure uses a new first etch subsystem having a new first process chamber configured therein and a new first MIMO controller coupled thereto; and performing a new first validation procedure when the second (DPCE) sequence does not include the new first CE procedure.

10. The method of claim 6, further comprising:

creating second simulation data for the second contact-etch procedure using a second Contact-Etch Multi-Input/Multi-Output (CE-MIMO) model, wherein the second CE-MIMO model includes a new first number ($N_b$) of new first Controlled Variables ($CV_{1b}, CV_{2b}, \ldots CV_{Nb}$), a new second number ($M_a$) of new first Manipulated Variables ($MV_{1b}, MV_{2b}, \ldots MV_{Mb}$), and a new third number ($L_b$) of new first Disturbance Variables ($DV_{1b}, DV_{2b}, \ldots DV_{Lb}$), wherein ($L_b, M_b,$ and $N_b$) are integers greater than one;

obtaining second sensor data during the second contact-etch procedure, wherein a second sensor is coupled to the second process chamber;

establishing second difference data by comparing the second simulation data to the second sensor data;

verifying the second contact-etch procedure when the second difference data is less than or equal to second threshold data; and storing the second simulation data and/or the second sensor data when the second difference data is greater than the second threshold data.

11. The method of claim 10, further comprising;

determining second risk data for the second contact-etch procedure using the second difference data;

identifying the second contact-etch procedure as a verified contact-etch procedure when the second risk data is less than a second risk limit; and identifying the second contact-etch procedure as a non-verified contact-etch procedure when the second risk data is not less than the second risk limit.

12. The method of claim 1, further comprising:

creating first simulation data for the first contact-etch procedure using a first Contact-Etch Multi-Input/Multi-Output (CE-MIMO) model, wherein the first CE-MIMO model includes a first number ($N_a$) of first Controlled Variables ($CV_{1a}, CV_{2a}, \ldots CV_{Na}$), a second number ($M_a$) of first Manipulated Variables ($MV_{1a}, MV_{2a}, \ldots MV_{Ma}$), and a third number ($L_a$) of first Disturbance Variables ($DV_{1a}, DV_{2a}, \ldots DV_{La}$), wherein ($L_a, M_a,$ and $N_a$) are integers greater than one;

obtaining first sensor data during the first contact-etch procedure, wherein a first sensor is coupled to a first process chamber;

establishing first difference data by comparing the first simulation data to the first sensor data;

verifying the first contact-etch procedure when the first difference data is less than or equal to first threshold data; and storing the first simulation data and/or the first sensor data when the first difference data is greater than the first threshold data.

13. The method of claim 12, further comprising;

determining risk data for the first contact-etch procedure using the first difference data;

identifying the first contact-etch procedure as a verified contact-etch procedure when the risk data is less than a first risk limit; and identifying the first contact-etch procedure as a non-verified contact-etch procedure when the risk data is not less than the first risk limit.

14. A method for processing a wafer using an Ion Energy (IE) controlled processing chamber, the method comprising:
receiving, by a processing system, a first set of patterned wafers and associated Ion Energy (IE) data, each patterned wafer having a first patterned etch-mask layer and a plurality of additional layers thereon;
determining an IE-related process sequence for the first set of patterned wafers using the IE data;
determining a first set of subsystems configured to perform the IE-related process sequence, wherein the first set of subsystems includes an etch subsystem having a first Ion Energy Controlled (IEC) process chamber configured therein and a Multi-Input/Multi-Output (MIMO) controller coupled thereto;
positioning a first patterned wafer on a first wafer holder in a first process chamber;
creating a first Ion Energy Optimized (IEO) plasma in the first process chamber; and
creating a new patterned wafer using a first contact-etch plasma, wherein first IE-sensor data is obtained while the new patterned wafer is created, wherein a first Ion Energy (IE) sensor is coupled to the first process chamber and is configured to obtain the first IE-sensor data.

15. The method as claimed in claim 14, wherein
establishing first difference data by comparing the first IE-sensor data to historical IE-sensor data;
continuing to process the first patterned wafer when the first difference data is less than or equal to first threshold data; and
stopping the IE-related process sequence when the first difference data is greater than the first threshold data.

16. A method for establishing a Contact-Etch Multi-Input/Multi-Output (CE-MIMO) model for creating a plurality of Double Pattern (DP) structures on a patterned wafer, the method comprising:
selecting a first Double Pattern Contact-Etch (DPCE) processing sequence and a first CE-MIMO model, a first contact-etch procedure in the first DPCE processing sequence being configured to create a plurality of contact structures on a second set of wafers using a patterned etch-mask layer on a first set of wafers, wherein the first CE-MIMO model is configured to simulate the first contact-etch procedure in the first DPCE processing sequence and includes a plurality of first Controlled Variables (CVs), a plurality of first Manipulated Variables (MVs), and a plurality of first Disturbance Variables (DVs);
determining a first number ($N_a$) of first Disturbance Variables ($DV_{1a}, DV_{2a}, \ldots DV_{Na}$) associated with the first CE-MIMO model, wherein $N_a$ is an integer greater than one and at least one first contact-etch procedure is configured to provide one or more of the first ($DV_{1a}, DV_{2a}, \ldots DV_{Na}$);
determining a first number ($L_a$) of first ($CV_{1a}, CV_{2a}, \ldots CV_{La}$), associated with the first CE-MIMO model and ranges associated with the first ($CV_{1a}, CV_{2a}, \ldots CV_{La}$), wherein La is an integer greater than one and the first ($CV_{1a}, CV_{2a}, \ldots CV_{La}$), include a first etch-mask width;
establishing a first number ($M_a$) of first ($MV_{1a}, MV_{2a}, \ldots MV_{Ma}$) associated with the first CE-MIMO model using one or more candidate process chambers, wherein $M_a$ is an integer greater than one and the first ($MV_{1a}, MV_{2a}, \ldots MV_{Ma}$), include one or more Within-Wafer Manipulated Variables (WiW-MVs) configured to change while a wafer is being processed, and one or more Wafer-to-Wafer- Manipulated Variables (W2W-MVs) configured to change after the wafer has been processed;
analyzing the first CE-MIMO model, wherein one or more statistical models are selected, one or more ranges are provided for the first ($CV_{1a}, CV_{2a}, \ldots CV_{La}$) and the first ($MV_{1a}, MV_{2a}, \ldots MV_{Ma}$), and one or more statistical analysis procedures are performed to establish Design of Experiments (DOE) data, wherein the statistical models are configured to associate one or more of the first ($MV_{1a}, MV_{2a}, \ldots MV_{Ma}$), with one or more of the first ($CV_{1a}, CV_{2a}, \ldots CV_{La}$);
determining one or more stability conditions for the first CE-MIMO model; and
optimizing the first CE-MIMO model using performance parameters associated with a first set of processing tools configured to perform the first DPCE processing sequence.

17. The method of claim 16, further comprising:
creating one or more steady-state linear gain matrices (G) using the DOE data associated with the first DPCE processing sequence, wherein each gain matrix includes two or more of the first ($MV_{1a}, MV_{2a}, \ldots MV_{Ma}$), and two or more of the first ($CV_{1a}, CV_{2a}, \ldots CV_{La}$);
calculating one or more Relative Gain Arrays (RGA) using one or more steady-state linear gain matrices (G), wherein RGA=G⊗ $(G^{-1})^T$ and ⊗ denotes element-by-element multiplication; and
optimizing one or more sets of first ($MV_{1a}, MV_{2a}, \ldots MV_{Ma}$), using one or more pairing rules.

18. The method of claim 16, wherein the calculating one or more Relative Gain Arrays (RGA) comprises:

$$\lambda ij = \frac{\left[\frac{\partial CV_i}{\partial MV_j}\right]_{MV_{k,k \neq j}}}{\left[\frac{\partial CV_i}{\partial MV_j}\right]_{CV_{k,k \neq j}}} = \frac{\text{Gain(open}-\text{loop)}}{\text{Gain(closed}-\text{loop)}}$$

wherein i=1,2, . . . , n and j=1,2, . . . , n, and wherein $(\partial CV_i/\partial MV_j)_{mv}$ is an open-loop gain between $CV_i$ and $MV_j$, and $(\partial CV_i/\partial MV_j)_{cv}$ is a closed loop gain.

19. The method of claim 16, wherein the one or more stability conditions are determined using a Niederlinski Stability Theorem wherein:

$$NST = \frac{\det(G)}{\prod_{i=1}^{n} g_{ii}} < 0$$

wherein NST is a Niederlinski Stability Index, G is a gain matrix, det(G) is a determinant of the gain matrix, and $g_{ii}$ is diagonal elements of the gain matrix.

* * * * *